(12) United States Patent
Im

(10) Patent No.: US 7,300,858 B2
(45) Date of Patent: Nov. 27, 2007

(54) LASER CRYSTALLIZATION AND SELECTIVE PATTERNING USING MULTIPLE BEAMLETS

(75) Inventor: James S. Im, New York, NY (US)

(73) Assignee: The Trustees of Columbia University in the city of New York, New York, NY (US)

(*) Notice: Subject to any disclaimer, the term of this patent is extended or adjusted under 35 U.S.C. 154(b) by 360 days.

(21) Appl. No.: 10/525,283

(22) PCT Filed: Aug. 19, 2003

(86) PCT No.: PCT/US03/25972

§ 371 (c)(1),
(2), (4) Date: Feb. 16, 2005

(87) PCT Pub. No.: WO2004/017382

PCT Pub. Date: Feb. 26, 2004

(65) Prior Publication Data

US 2006/0060130 A1 Mar. 23, 2006

Related U.S. Application Data

(60) Provisional application No. 60/405,083, filed on Aug. 19, 2002.

(51) Int. Cl.
*H01L 21/00* (2006.01)
*H01L 21/20* (2006.01)
*H01L 21/36* (2006.01)
*C30B 13/00* (2006.01)
*C30B 21/04* (2006.01)
*C30B 28/08* (2006.01)

(52) U.S. Cl. .................. 438/487; 117/46
(58) Field of Classification Search .............. 117/43, 117/46, 47; 438/487
See application file for complete search history.

(56) References Cited

U.S. PATENT DOCUMENTS 3,632,205 A 1/1972 Marcy 4,234,358 A 11/1980 Celler et al.
(Continued)

FOREIGN PATENT DOCUMENTS

EP 681316 8/1995
(Continued)

OTHER PUBLICATIONS

U.S. Appl. No. 60/253,256, filed Aug. 31, 2003, Im.
(Continued)

*Primary Examiner*—David W. Coleman
(74) *Attorney, Agent, or Firm*—Baker Botts LLP

(57) ABSTRACT

A process and system for processing a thin film sample, as well as the thin film structure are provided. In particular, a beam generator can be controlled to emit successive irradiation beam pulses at a predetermined repetition rate. Each irradiation beam pulse may be masked to define a first plurality of beamlets and a second plurality of beamlets. The first and second plurality of beamlets of each of the irradiation pulses being provided for impinging the film sample and having an intensity which is sufficient to at least partially melt irradiated portions of the section of the film sample. A particular portion of the section of the film sample is irradiated with the first beamlets of a first pulse of the irradiated beam pulses to melt first areas of the particular portion, the first areas being at least partially melted, leaving first unirradiated regions between respective adjacent ones of the first areas, and being allowed to resolidify and crystallize. After the irradiation of the particular portion with the first beamlets, the particular portion is again irradiated with the second beamlets of a second pulse of the irradiated beam pulses to melt second areas of the particular portion, the second areas being at least partially melted, leaving second unirradiated regions between respective adjacent ones of the second areas, and being allowed to resolidify and crystallize. The first irradiated and re-solidified areas and the second irradiated and re-solidified areas are intermingled with one another within the section of the film sample. In addition, the first areas correspond to first pixels, and the second areas correspond to second pixels.

65 Claims, 47 Drawing Sheets

U.S. PATENT DOCUMENTS

| | | | |
|---|---|---|---|
| 4,309,225 A | 1/1982 | Fan et al. |
| 4,382,658 A | 5/1983 | Shields et al. |
| 4,456,371 A | 6/1984 | Lin |
| 4,639,277 A | 1/1987 | Hawkins |
| 4,691,983 A | 9/1987 | Kobayashi et al. |
| 4,727,047 A | 2/1988 | Bolzer et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Suguhara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,453,594 A | 9/1995 | Konecny |
| 5,456,763 A | 10/1995 | Kaschmitter et al. |
| 5,496,768 A | 3/1996 | Kudo |
| 5,523,193 A | 6/1996 | Nelson |
| 5,529,951 A | 6/1996 | Noguchi et al. |
| 5,591,668 A | 1/1997 | Maegawa et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Russell et al. |
| 6,072,631 A | 6/2000 | Guenther et al. |
| 6,081,381 A | 6/2000 | Shalapenok et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,203,952 B1 | 3/2001 | O'Brien et al. |
| 6,235,614 B1 | 5/2001 | Yang |
| 6,242,291 B1 | 6/2001 | Kusumoto et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,186 B1 | 12/2001 | Kirk et al. |
| 6,326,286 B1 | 12/2001 | Park et al. |
| 6,333,232 B1 | 12/2001 | Kunikiyo |
| 6,368,945 B1 | 4/2002 | Im |
| 6,388,146 B1 | 5/2002 | Onishi et al. |
| 6,407,012 B1 | 6/2002 | Miyasaka et al. |
| 6,444,506 B1 | 9/2002 | Kusumoto et al. |
| 6,468,845 B1 | 10/2002 | Nakajima et al. |
| 6,495,067 B1 | 12/2002 | Ono |
| 6,511,718 B1 | 1/2003 | Paz de Araujo et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,555,449 B1 | 4/2003 | Im et al. |
| 6,563,077 B2 | 5/2003 | Im |
| 6,573,531 B1 | 6/2003 | Im et al. |
| 6,582,827 B1 | 6/2003 | Im |
| 6,621,044 B2 | 9/2003 | Jain et al. |
| 6,635,554 B1 | 10/2003 | Im et al. |
| 6,645,454 B2 * | 11/2003 | Voutsas ..................... 423/348 |
| 6,830,993 B1 | 12/2004 | Im et al. |
| 2001/0001745 A1 | 5/2001 | Im et al. |
| 2001/0041426 A1 | 11/2001 | Im |
| 2002/0104750 A1 | 8/2002 | Ito |
| 2003/0029212 A1 | 2/2003 | Im |
| 2003/0096489 A1 | 5/2003 | Im et al. |
| 2003/0119286 A1 | 6/2003 | Im et al. |
| 2004/0053450 A1 | 3/2004 | Sposili et al. |
| 2004/0061843 A1 | 4/2004 | Im |
| 2005/0032249 A1 | 2/2005 | Im et al. |
| 2005/0034653 A1 | 2/2005 | Im et al. |

FOREIGN PATENT DOCUMENTS

| | | |
|---|---|---|
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | 0231869 | 4/2002 |
| WO | 0242847 | 5/2002 |
| WO | 0286954 | 5/2002 |
| WO | 02086955 | 10/2002 |
| WO | 03018882 | 3/2003 |
| WO | 03046965 | 6/2003 |
| WO | 03084688 | 10/2003 |
| WO | 2004017379 | 2/2004 |
| WO | 2004017380 | 2/2004 |
| WO | 2004017381 | 2/2004 |
| WO | 2004017382 | 2/2004 |
| WO | 2004075263 | 9/2004 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors", 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).

Crowder et al., "Low-Temperature Single-Crystal Si TFTs Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH. 1999.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliabity," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser cystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstract for Symposium on Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". 1999.

Ishida et al., "Ultra-shallow boxlike profiles fabricated by pulsed ultraviolet-laser doping process", J. Vac. Sci. Technol. B 12(1), p. 399-403, 1994. (no month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994—vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorphus Silicon Thin Films", Ph. D. Dissertation Abstract, Columbia University, 1996.

* cited by examiner

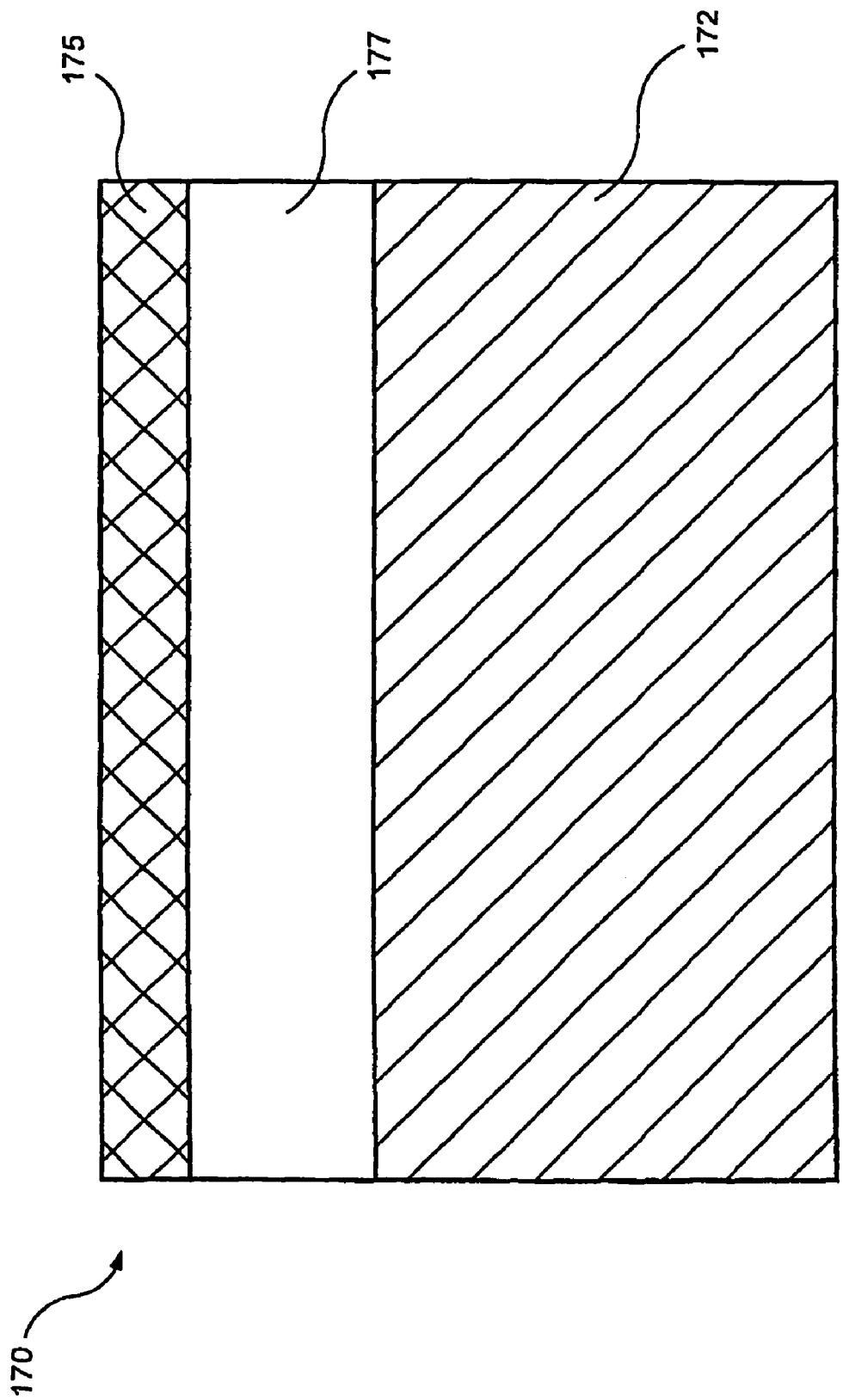

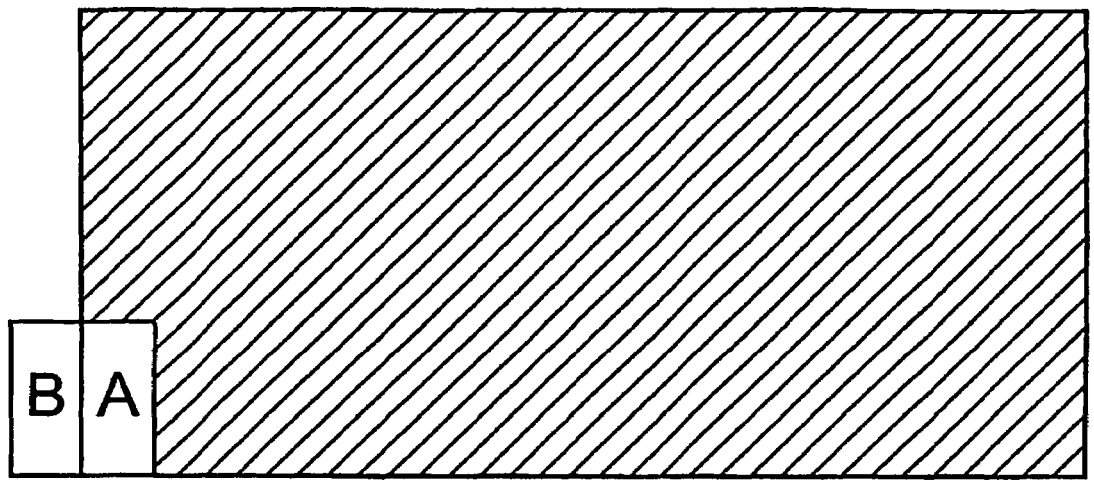
F I G. 4A
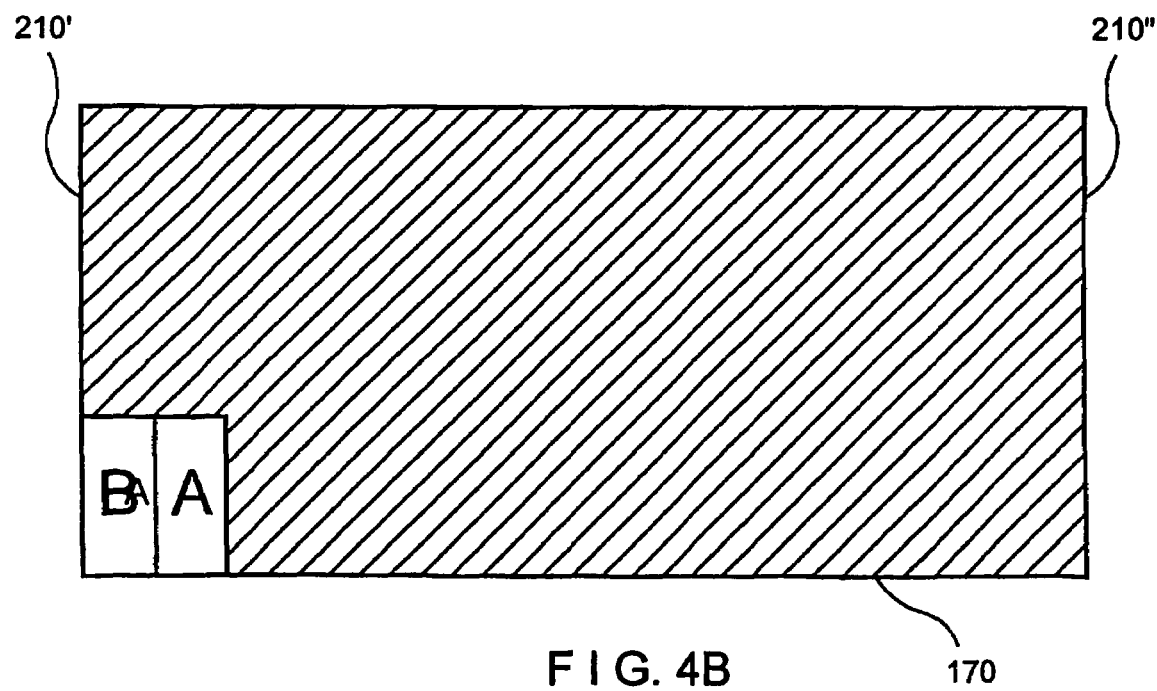
F I G. 4B

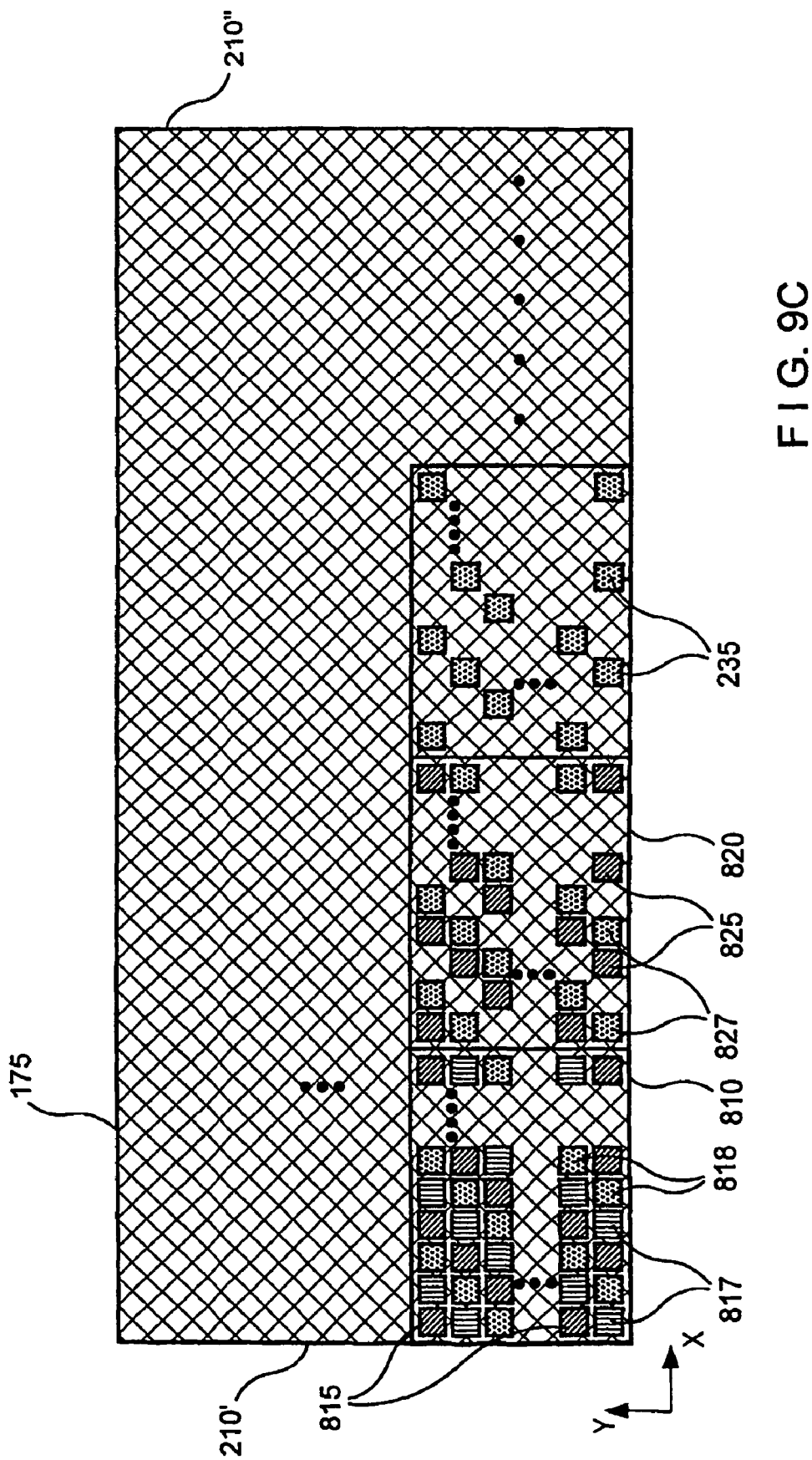

LASER CRYSTALLIZATION AND SELECTIVE PATTERNING USING MULTIPLE BEAMLETS

RELATED APPLICATION

This application is a national phase of International Patent Application No. PCT/US03/025972, filed Aug. 19, 2003, published on Feb. 26, 2004 as International Patent Publication No. WO 04/017382, which claims priority from U.S. Provisional Application No. 60/405,083, which was filed on Aug. 19, 2002, each of which are incorporated by reference in their entireties herein, and from which priority is claimed.

NOTICE OF GOVERNMENT RIGHTS

The U.S. Government may have certain rights in this invention pursuant to the terms of the Defense Advanced Research Project Agency award number N66001-98-1-8913.

FIELD OF THE INVENTION

The present invention relates to techniques for processing of films, and more particularly to techniques for processing semiconductor films to spatially intermix multiple irradiations of areas of films of such thin films so as to obtain a substantial performance uniformity of electronic devices, such as thin-film transistor ("TFT") devices, situated therein.

BACKGROUND OF THE INVENTION

Films, such as silicon films or semiconductor films, are known to be used for providing pixels for liquid crystal display devices. Such films have previously been processed (i.e., irradiated by an excimer laser and then crystallized) via excimer laser annealing ("ELA") methods. Other more advantageous methods and systems for processing the semiconductor thin films for use in the liquid crystal displays and organic light emitting diode displays for fabricating large grained single crystal or polycrystalline silicon thin films using sequential lateral solidification ("SLS") techniques have been described. For example, U.S. Pat. No. 6,322,625 issued to Im and U.S. patent application Ser. No. 09/390,537, the entire disclosures of which are incorporated herein by reference, and which are assigned to the common assignee of the present application, describe such SLS systems and processes. The patent documents describe certain techniques in which multiple areas on the semiconductor thin film are. e.g., sequentially irradiated.

The semiconductor films processed using the conventional system and processes often suffer from varying energy densities from one irradiated region of such thin film to the next. This primarily due to the fact that the laser beam fluence at least slightly varies from one shot to the next. For example, during the sequential irradiation of the neighboring regions of the thin film, the first region is irradiated by a first beam pulse (set of pulses) having a first energy fluence, the second region is irradiated by a second beam pulse (or set of pulses) having a second fluence which is at least slightly different that the fluence of the first beam pulse, and the third region is irradiated by a third beam pulse (or set of pulses) having a third fluence which is at least slightly different that the fluence of the second beam pulse, etc. Upon the irradiation of these areas, they can crystallize (e.g., due to at least partial melting). The resulting energy densities of the irradiated and crystallized first, second and third regions of the semiconductor thin film are all, at least to an extent, different from one another due to the varying fluences of the sequential beam pulses irradiating the neighboring regions.

The problem may arise after such fabrication of the semiconductor thin film, i.e., when thin-film transistor ("TFT") devices are placed in such areas irradiated and crystallized regions having differing energy densities. In particular, the performance of such TFT devices situated in the crystallized regions of the film may vary from one device to another because of their energy density differences. For example, while the TFT devices placed in each of the crystallized regions (which may be uniform therein) generally have uniform characteristics and operate in a substantially the same manner within each such region, the TFT devices do not operate in the uniform manner from one crystallized region to another. This manifests itself in the fact that the same colors provided on the neighboring pixels of the display may appear different from one another.

Another problem of the unintended consequence of irradiating the neighboring regions of the semiconductor thin film with pulses each having a slightly differing fluences is that a transition from the one of these regions to the next consecutive region may be visible. This is due to the energy densities being different from one anther in the two neighboring regions, and because the transitions between the regions at the border regions thereof has a contrast from one to another because of such differing energy densities. Thus, it is possible that the transition between the first region to the next region is sharper than it may be intended.

Accordingly, it may be preferable to generate substrates which include the semiconductor films that reduce the effects of differing fluences of consecutive beam pulses irradiating neighboring regions of the semiconductor thin film, which later crystallize.

SUMMARY OF THE INVENTION

One of the objects of the present invention is to provide an improved process and system which can interpose crystallized areas from two sequential pulses (or set of pulses) on the substrate films such that the TFT devices can be situated in such areas so as to allow the neighboring regions of the thin film sample so as to have substantially the same performance of the TFT devices situated therein. Another object of the present invention is to interpose the crystallized areas of two sequential pulses (or set of pulses) in the border region between the neighboring regions of the sample so as to reduce a perception of having a visible border between the adjacent regions to reduce the contrast between the two neighboring regions.

In accordance with at least some of these objectives as well as others that will become apparent with reference to the following specification, it has now been determined that by specially dispersing the irradiation of one or more regions in the semiconductor thin film by portions of two or more different pulses (each of which has a differing fluence). It was also ascertained that dispersing the portions of two sequential beam pulses in a border region between two adjacent regions of the semiconductor thin film reduces the perception of the border between the pixels.

In one exemplary embodiment of the present invention, a process and system for processing a semiconductor thin film sample are provided. In particular, a beam generator can be controlled to emit successive irradiation beam pulses at a predetermined repetition rate. Each irradiation beam pulse may be masked to define a first plurality of beamlets and a second plurality of beamlets. The first and second plurality of beamlets of each of the irradiation pulses being provided for impinging the film sample and having an intensity which is sufficient to at least partially melt irradiated portions of the section of the film sample. A particular portion of the section of the film sample is irradiated with the first beamlets of a first pulse of the irradiated beam pulses to melt first areas of the particular portion, the first areas being at least partially melted, leaving first unirradiated regions between respective adjacent ones of the first areas, and being allowed to resolidify and crystallize. After the irradiation of the particular portion with the first beamlets, the particular portion is again irradiated with the second beamlets of a second pulse of the irradiated beam pulses to melt second areas of the particular portion, the second areas being at least partially melted, leaving second unirradiated regions between respective adjacent ones of the second areas, and being allowed to resolidify and crystallize. The first irradiated and re-solidified areas and the second irradiated and re-solidified areas are intermingled with one another within the section of the film sample. In addition, the first areas correspond to first pixels, and the second areas correspond to second pixels.

In another exemplary embodiment of the present invention, respective positions of the first pixels are different than respective positions of the second pixels. Also, a location of at least one of the second irradiated areas is substantially the same as a location of at least one of the first unirradiated areas. The first unirradiated areas have substantially the same location as the second areas, and wherein the second unirradiated areas have substantially the same location as the first areas. The first and second irradiated and re-solidified areas form an entire cross-section of the section of the film sample. The locations of the first and second areas can be non-uniform, and edges of the second irradiated and re-solidified areas are provided at a distance from the first irradiated and re-solidified areas.

In yet another exemplary embodiment of the present invention, the first beamlets have a first energy density, the second beamlets have a second energy density, and the first energy density is different from the second energy density. The masked irradiation beam pulses may further include a third plurality of beamlets which are provided for impinging the film sample. In addition, after the irradiation of the particular portion with the second beamlets, the particular portion is irradiated with the third beamlets to melt third areas of the particular portion. The third areas are melted throughout their thickness, leaving third unirradiated regions between respective adjacent ones of the third areas and being allowed to resolidify and crystallize. The third areas may correspond to the third pixels, and respective positions of the first and second pixels are different than respective positions of the third pixels. A location of at least one of the first and second areas can be substantially the same as (or different from) a location of at least one of the third unirradiated areas. Also, at least one of the first and second unirradiated areas have substantially the same locations as the third areas, and the third unirradiated areas have substantially the same locations as at least one of the first and second areas. The first, second and third resolidified areas may form an entire cross-section of the section of the film sample.

In still another exemplary embodiment of the present invention, edges of the first and second re-solidified areas are provided at a distance from the third re-solidified areas. In addition, the first beamlets may have a first energy density, the second beamlets may have a second energy density, and the third beamlets may have a third energy density such that the third energy density is different from at least one of the first energy density and the second energy density. The second beam pulse may immediately follow the first beam pulse, the first areas can be irradiated with the first beamlets when the film sample is provided at a first position of with respect to the irradiation beam pulses. The second areas can be irradiated with the second beamlets when the film sample is provided at a second position with respect to the irradiation beam pulses, the second position being closer to a center of the section of the film sample than the second position. Further, the film sample may be translated relative to the irradiation beam pulses so that the impingement by the first beamlet of the film sample moves from the first position to the second position.

In a further exemplary embodiment of the present invention, the first areas are fully melted throughout their entire thickness, and the second areas are fully melted throughout their entire thickness. Also, the film sample may be translated so that the a further portion of the film sample is provided for irradiation by the first and second beamlets, the further portion being substantially adjacent to the particular portion of the film sample. The irradiation of the first and second areas can be repeated for processing the entire semiconductor thin film sample. A first edge of the further portion of the film sample can overlap a second edge of the particular portion of the film sample, and the irradiated and re-solidified areas in the first edge of the further portion may be intermingled with the re-solidified areas of the particular portion so as to prevent an overlap thereof.

The accompanying drawings, which are incorporated and constitute part of this disclosure, illustrate a preferred embodiment of the invention and serve to explain the principles of the invention.

BRIEF DESCRIPTION OF THE DRAWINGS

FIG. 1B is an enlarged cross-sectional side view of the sample which includes the semiconductor thin film;

FIGS. 4A-4H are sequential movements of the semiconductor film of a sample with respect to the pulsed beam as the beam pulse is patterned by the mask of FIG. 3 according to an exemplary embodiment of the present invention;

FIGS. 9A-9H are irradiations, by the radiation beam pulse which is masked by the mask of FIG. 7 (which correspond to the movements of the sample illustrated in FIGS. 8A-8H), and then re-solidifications and crystallizations of the particular portions of the semiconductor film provided on the sample at exemplary sequential stages of the processing according to the process of the present invention;

FIG. 15 is an illustration of the number of irradiations that the areas being irradiated by the beam pulse patterned by the mask of FIG. 13 are subjected to;

DETAILED DESCRIPTION

Figure 1A:
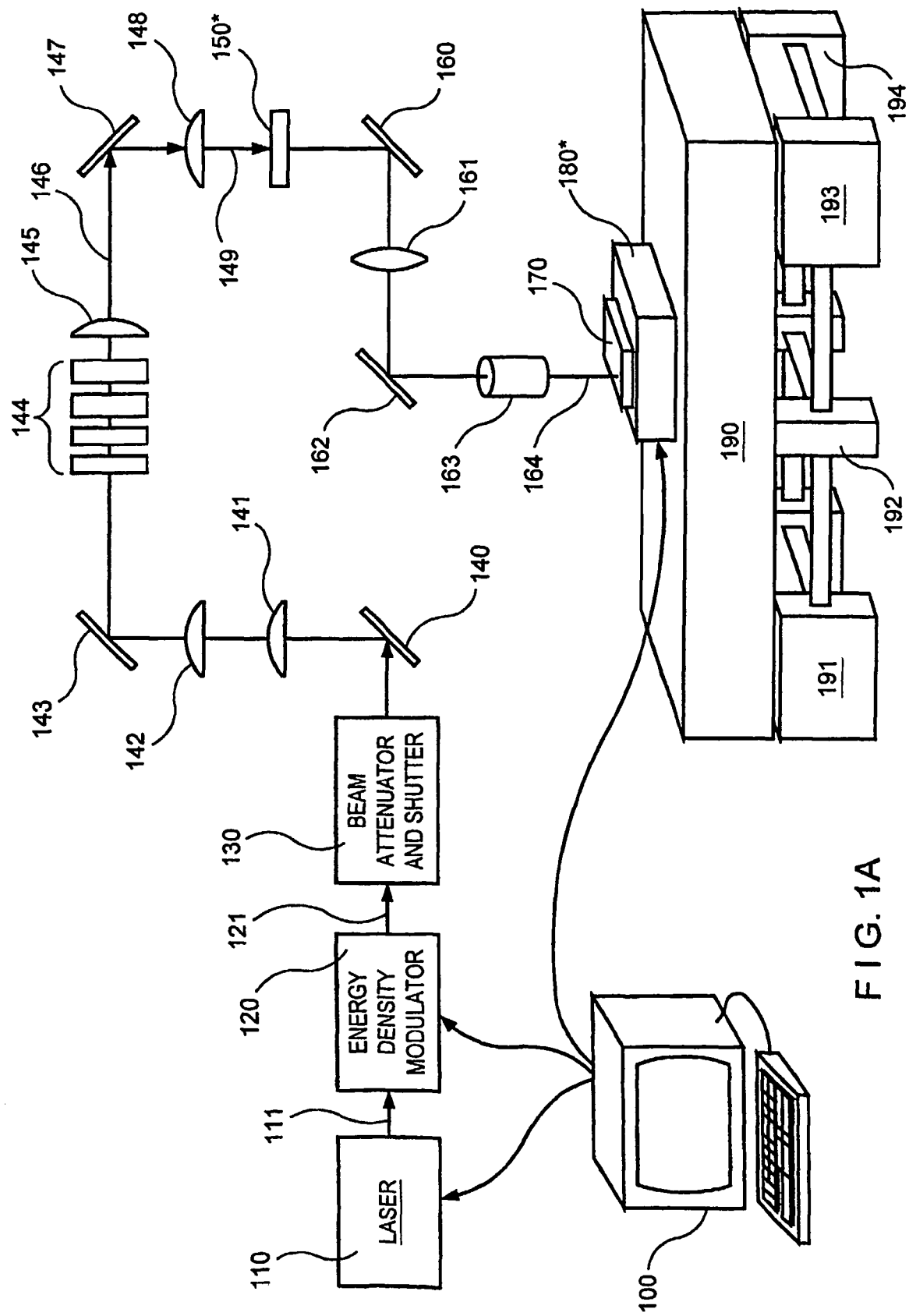
FIG. 1A is a schematic block diagram of an exemplary embodiment of an irradiation system according to the present invention which allows the portions of sequential beam pulses (having different fluences) to irradiate regions of a semiconductor thin film provided on a sample such that these portions are interposed with one another these regions.

It should be understood that various systems according to the present invention can be utilized to generate, solidify and crystallize one or more areas on the semiconductor (e.g., silicon) thin film which have which can be interposed between previously crystallized areas of such semiconductor thin film. The exemplary embodiments of the systems and process to achieve such areas, as well as of the resulting crystallized semiconductor thin films shall be described in further detail below. However, it should be understood that the present invention is in no way limited to the exemplary embodiments of the systems, processes and semiconductor thin films described herein.

Certain systems for providing a continuous motion SLS are described in U.S. patent application Ser. No. 09/526,585 (the "'585 application"), the entire disclosure of which is incorporated herein by reference. Substantially similar systems according to the exemplary embodiment of the present invention can be employed to generate the irradiated, solidified and crystallized portions of the semiconductor film described above using which it is possible to disperse newly irradiated, solidified and crystallized areas with the previously crystallized portions. In particular, the system according to the present invention is used on a sample 170 which has an amorphous silicon thin film thereof that is being irradiated by irradiation beam pulses to promote the irradiation, subsequent solidification and crystallization of the particular areas of the semiconductor thin film. The exemplary system includes a beam source 110 (e.g., a Lambda Physik model LPX-315I XeCl pulsed excimer laser) emitting an irradiation beam (e.g., a laser beam), a controllable beam energy density modulator 120 for modifying the energy density of the laser beam, a MicroLas two plate variable attenuator 130, beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4×-6× eye piece 161, a controllable shutter 152, a multi-element objective lens 163 for focusing a radiation beam pulse 164 onto the sample 170 having the semiconductor thin film to be processed mounted on a sample translation stage 180, a granite block optical bench 190 supported on a vibration isolation and self-leveling system 191, 192, 193 and 194, and a computing arrangement 100 (e.g., a general purpose computer executing a program according to the present invention or a special-purpose computer) coupled to control the beam source 110, the beam energy density modulator 120, the variable attenuator 130, the shutter 152 and the sample translation stage 180.

The sample translation stage 180 is preferably controlled by the computing arrangement 100 to effectuate translations of the sample 170 in the planar X-Y directions, as well as in the Z direction. In this manner, the computing arrangement 100 controls the relative position of the sample 40 with respect to the irradiation beam pulse 164. The repetition and the energy density of the irradiation beam pulse 164 are also controlled by the computer 100. It should be understood by those skilled in the art that instead of the beam source 110 (e.g., the pulsed excimer laser), the irradiation beam pulse can be generated by another known source of short energy pulses suitable for at least partially melting (and possibly fully melting throughout their entire thickness) selected areas of the semiconductor (e.g., silicon) thin film of the sample 170 in the manner described herein below. Such known source can be a pulsed solid state laser, a chopped continuous wave laser, a pulsed electron beam and a pulsed ion beam, etc. Typically, the radiation beam pulses generated by the beam source 110 provide a beam intensity in the range of 10 mJ/cm$^2$ to 1 J/cm$^2$, a pulse duration (FWHM) in the range of 10 to 103 nsec, and a pulse repetition rate in the range of 10 Hz to 104 Hz.

While the computing arrangement 100, in the exemplary embodiment of the system shown in FIG. 1A, controls translations of the sample 170 via the sample stage 180 for carrying out the processing of the semiconductor thin film of the sample 170 according to the present invention, the computing arrangement 100 may also be adapted to control the translations of the mask 150 and/or the beam source 110 mounted in an appropriate mask/laser beam translation stage (not shown for the simplicity of the depiction) to shift the intensity pattern of the irradiation beam pulses 164, with respect to the semiconductor thin film of the sample 170, along a controlled beam path. Another possible way to shift the intensity pattern of the irradiation beam pulse is to have the computer 100 control a beam steering mirror. The exemplary system of FIG. 1 may be used to carry out the processing of the silicon thin film of the sample 170 in the manner described below in further detail. The mask 150 should be used by the exemplary system of the present invention to well define the profile of the resulting masked beam pulse 164 and to reduce the non-uniformity of the adjacent portions and edge regions of the portions of the semiconductor thin film when these portions are irradiated by such masked beam pulse 164 and then crystallized.

As illustrated in FIG. 1B, the semiconductor thin film 175 of the sample 170 can be directly situated on e.g., a glass substrate 172, and may be provided on one or more intermediate layers 177 there between. The semiconductor thin film 175 can have a thickness between 100 Å and 10,000 Å (1 μm) so long as at least certain necessary areas thereof can be completely melted throughout their entire thickness. According to an exemplary embodiment of the present invention, the semiconductor thin film 175 can be composed of silicon, germanium, silicon germanium (SeGe), all of which preferably have low levels of impurities. It is also possible to utilize other elements or semiconductor materials for the semiconductor thin film 175. The intermediary layer 177, which is situated immediately underneath the semiconductor thin film 175, can be composed of silicon oxide (SiO$_2$), silicon nitride (Si$_3$N$_4$), and/or mixtures of oxide, nitride or other materials that are suitable for promoting grain growth within the designated areas of the semiconductor thin film 175 of the sample 170. The temperature of the glass substrate 172 can be between room temperature and 800° C. Higher temperatures of the glass substrate 172 can be accomplished by preheating the substrate 172 which would effectively allow larger grains to be grown in the irradiated, re-solidified, and then crystallized areas of the semiconductor thin film 175 of the sample 170 due to the proximity of the glass substrate 172 to the thin film 175.

Figure 2:
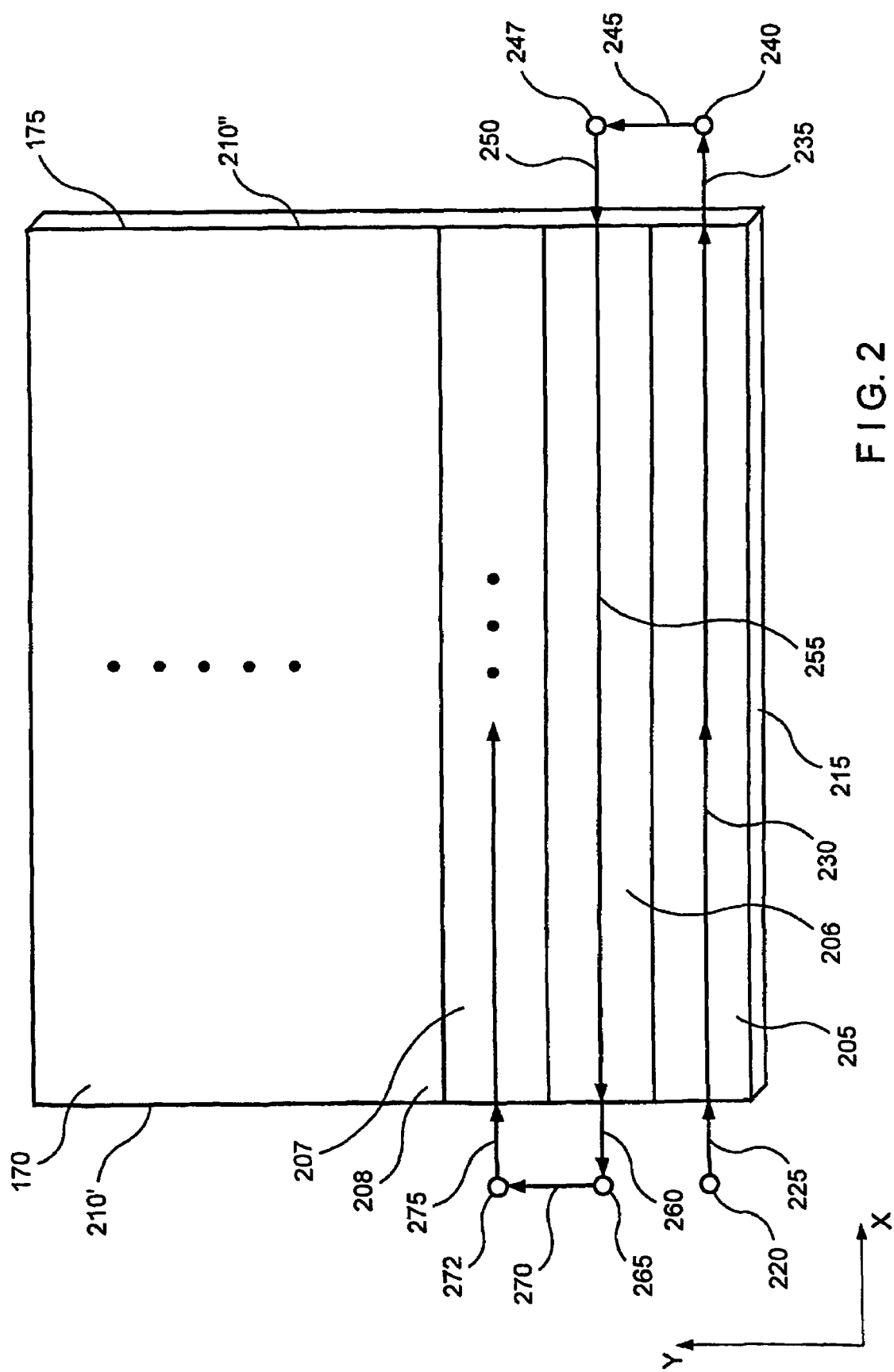
FIG. 2 is a top exploded view of an exemplary embodiment of the sample conceptually subdivided, and having a semiconductor thin film thereon on which a process according to the present invention is performed for the entire surface area of a semiconductor thin film using the exemplary system of FIG. 1A.

FIG. 2 shows an enlarged view of an exemplary embodiment of the semiconductor thin film 175 (e.g., an amorphous silicon thin film) of the sample 170, and the relative translation paths of the beam pulse 164 with respect to the locations on the sample 170. This exemplary sample 170 has exemplary dimensions of 40 cm in the Y direction by 30 cm in the X direction. The sample 170 can be conceptually subdivided into a number of columns (e.g., a first conceptual column 205, a second conceptual column 206, a third conceptual column 207, etc.). The location/size of each conceptual column may be stored in a storage device of the computing arrangement 100, and utilized by the computing arrangement 100 for later controlling the translation of the sample 170, and/or firing of the beam by the beam source 110 on these locations of the semiconductor thin film 175, or on other locations that are based on the stored locations. Each of the columns 205, 206, 207, etc. is dimensioned, e.g., ½ cm in the Y direction by 30 cm in the X direction. Thus, if the sample 170 is sized 40 cm in the Y direction, the sample 150 may be conceptually subdivided into eighty (80) columns. The sample 170 may also be conceptually subdivided into such columns having other dimensions (e.g., 1 cm by 30 cm columns, 2 cm by 30 cm columns, 2 cm by 30 cm columns, etc.). In fact, there is absolutely no restrictions on the dimensions of the conceptual columns of the sample 170 so long as the beam pulse 164 is capable of irradiating and completely melting certain areas of the semiconductor thin film 175 in such columns so as to promote small grain growth within such areas for forming uniform areas on the film sample 175 to allow the interposition of the areas irradiated by two different (e.g., sequential) beam pulses which generally have differing fluences between one another in the same region of the semiconductor thin film. The location/dimension of each column, and the locations thereof, are stored in the storage device of the computing arrangement 100, and utilized by such computing arrangement 100 for controlling the translation of the translation stage 180 with respect to the beam pulse 164 and/or the firing of the beam 111 by the beam source 110.

Figure 3:
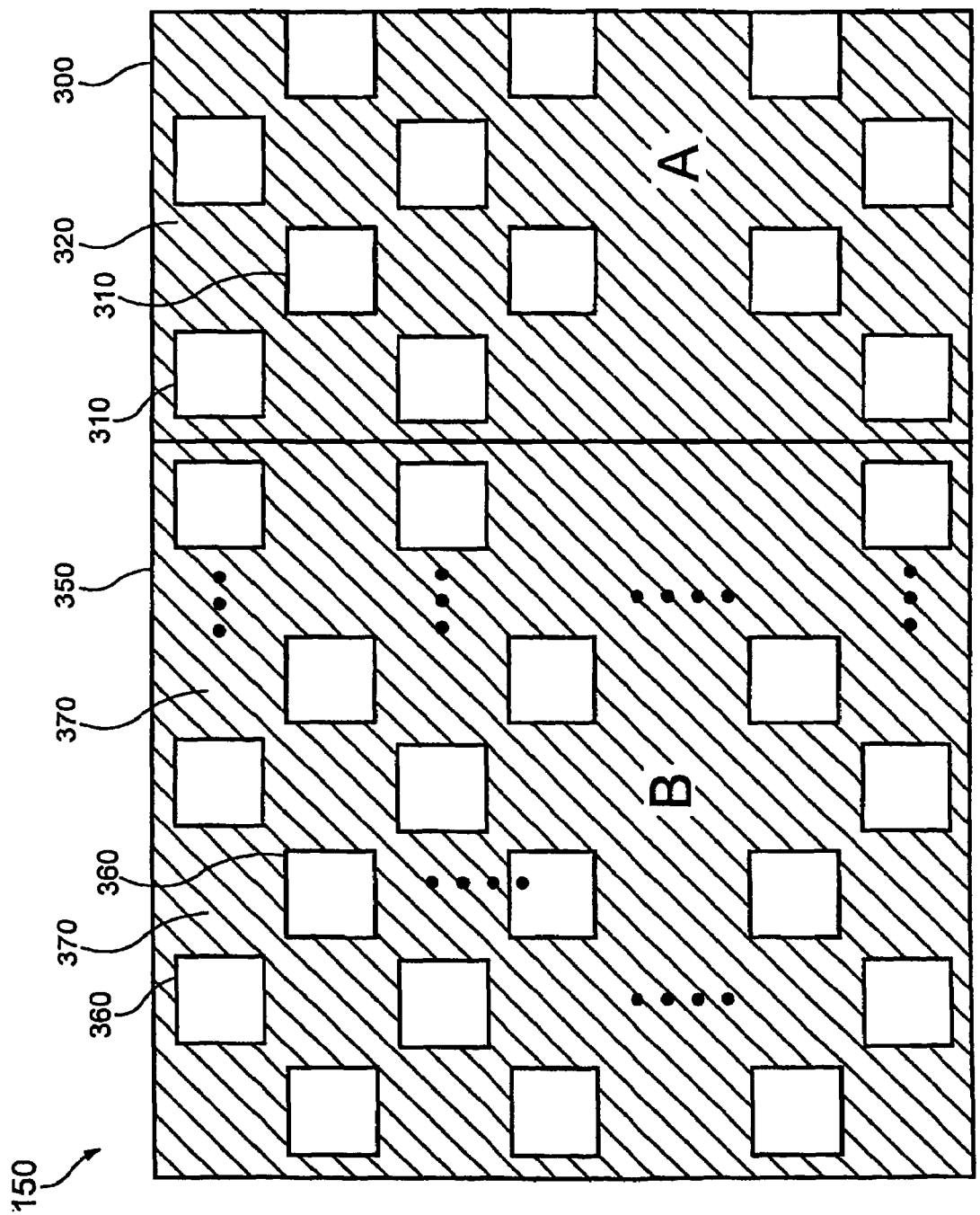
FIG. 3 is a top view of a first exemplary embodiment of a mask according to the present invention which is divided into two areas such that respective set of beamlets being patterned by the first area and second areas are capable of irradiating the same region of the thin film, and the sections of the regions irradiated by each of the set of beamlets are dispersed throughout that region.

The semiconductor thin film 175 can be irradiated by the beam pulse 164 which is patterned using the mask 150 according to a first exemplary embodiment of the present invention as shown in FIG. 3. The first exemplary mask 150 is sized such that its cross-sectional area is larger than that of the cross-sectional area of the beam pulse 164. In this manner, the mask 150 can pattern the pulsed beam to have a shape and profile directed by the open or transparent regions of the mask 150. The mask 150 is subdivided into a first section A 300 and a second section B 350. The first section A 300 has multiple open or transparent regions 310 which are separated from one another by beam-blocking regions 320. The second section B 350 has multiple open or transparent regions 360 which are separated from one another by beam-blocking regions 370. The open or transparent regions 310, 360 of first and second sections 300, 350 the mask 150, respectively, can also be referred to as "slits." These slits permit small beam pulses (or beamlets) to irradiate there-through and completely melt the areas of the semiconductor thin film 175 that they impinge. The dimensions of the slits 310, 360 can be 0.1 μm by 0.5 m, 0.5 μm by 0.5 μm, etc. It should be clearly understood that other dimensions of the slits are possible, and are within the scope of the present invention. For example, the slits can have a rectangular shape, a circular shape, a triangular shape, a chevron shape, a diamond shape, etc. In this manner, the mask 150 is capable of patterning the beam pulse 164 so as to impinge the semiconductor thin film 175 of the sample 170 at predetermined portions thereof as shall be described in further detail below.

A first exemplary embodiment of the process according to the present invention illustrated in FIG. 4A-4H and 5A-5H shall now be described below with reference to the relative movement of the sample 170 with respect to the impingement of the sections of the semiconductor thin film 175 by the beam pulse 164 patterned by the mask of FIG. 3. Exemplary translation of the sample 170 as it relates to the direction of the masked beam pulse 164 shall be described below also with reference to FIG. 2. The sample 170 may be either by moving the mask 150 or the sample translation stage 180, in order to irradiate selective areas of the semiconductor thin film 175 of the sample 170. For the purposes of the foregoing, the length and width of the masked beam pulse 164 may be 0.1 cm×0.5 cm. However, it should be understood the masked beam pulse 164 is not limited to such shape and size. Indeed, other shapes and/or sizes of the beam pulse 164, which is patterned and dimensioned by the mask 150.

After the sample 170 is conceptually subdivided into columns 205, 206, 207, etc., a pulsed laser beam 111 is activated (by actuating the beam source 110 using the computing device 100 or by opening the shutter 130), and produces the pulsed laser beamlets 164 which impinges on a first location 220 which is away from the semiconductor thin film 175. Then, the sample 170 is translated and accelerated in the forward X direction under the control of the computing arrangement 100 to reach a predetermined velocity with respect to the fixed position beamlets in a first beam path 225.

In one exemplary variation of the process of the present invention, the pulsed beamlets 164 can reach a first edge 210' of the sample 170 preferably when the velocity of the movement of the sample 170 with respect to the pulsed laser beam 149 reaches the predetermined velocity. Then, the sample 170 can be continuously (e.g., without stopping) translated in the −X direction at the predetermined velocity so that the pulsed beamlets 164 continue irradiating successive portions of the sample 170 for an entire length of a second beam path 230.

Upon the passing the first edge 210', the beam pulse 149 is passed through the first section A 300 and the section B 350 of the mask 150 which patterns the beam pulse 149 to become the masked beam pulse 164. As shown in FIG. 5A, the masked beam pulse 164 patterned by the first section A 300 of the mask 150 impinges a first region 410 on the first conceptual column 205 of the semiconductor thin film sample 170, while the masked beam pulse 164 patterned by the second section B 350 of the mask 150 irradiates an area away from the edge 210' of the semiconductor thin film 170. Therefore, as shown in FIGS. 4A and 5A, the first region 410 of the semiconductor thin film is irradiated only by the beam pulse 164 masked by the first section A 300 of the mask 150. As shown in FIG. 5A, the irradiated first region 410 is composed of irradiated first portions 415 which are provided at a distance from one another, and substantially match the positions and orientations of the slits 310 of the first section A 300 of the mask 150. In particular, the irradiated first portions 415 are provided such that the portions between these irradiated first portions 415 can be irradiated with another beam pulse (e.g., a subsequent masked beam pulse). In a preferred embodiment of the present invention, such portions provided between irradiated first portions 415 are sufficiently large to enable the entire new portions having an approximately the same size as the first portions 415 to be irradiated therein by another beam pulse (e.g., without overlapping any portion of the irradiated first portions 415). It is possible that the masked beam pulse 164 has sufficient fluence or intensity to completely melt the first portions 415 being irradiated throughout their entire thickness. In addition, these portions 415 can be partially melted by the masked beam pulse 164.

Figure 4C:
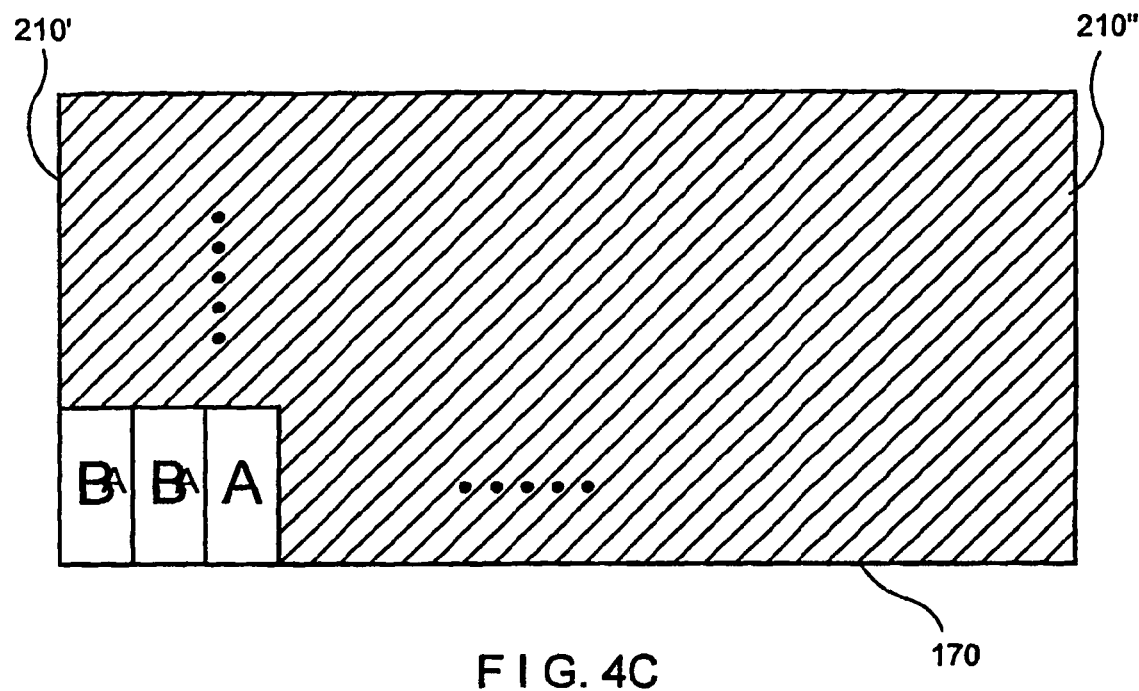
Figure 5A:
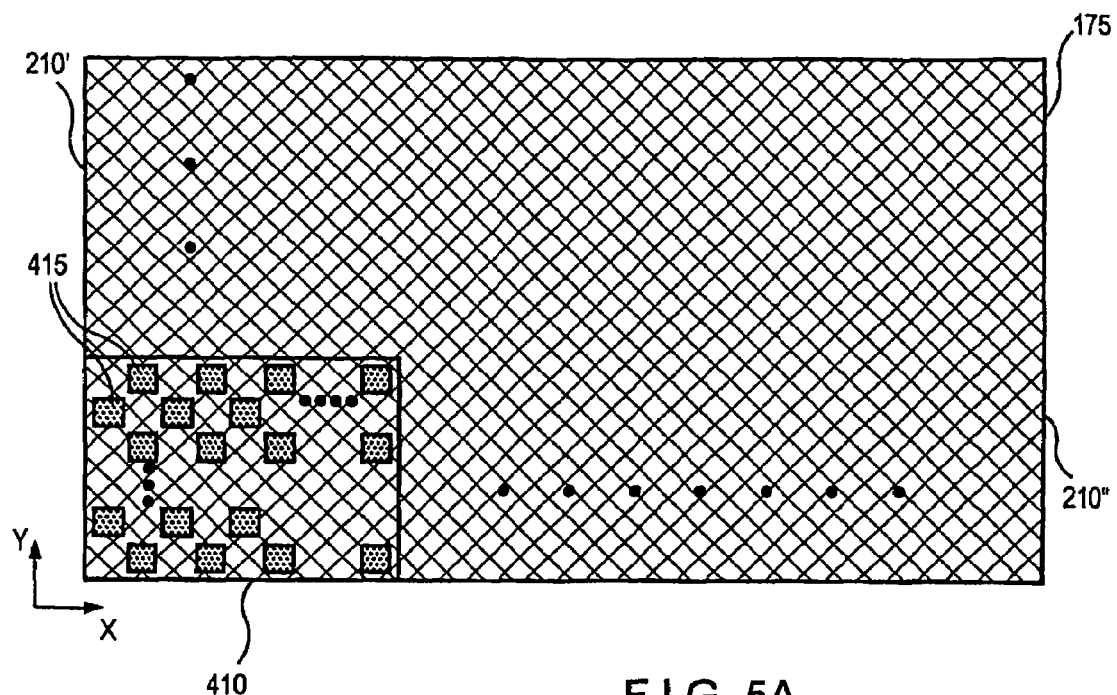
FIGS. 5A-5H are irradiations, by the radiation beam pulse which is masked by the mask of FIG. 3 (which correspond to the movements of the sample illustrated in FIGS. 4A-4H), and then re-solidifications and crystallizations of the particular portions of the semiconductor film provided on the sample at exemplary sequential stages of the processing according to the process of the present invention.
Figure 5B:
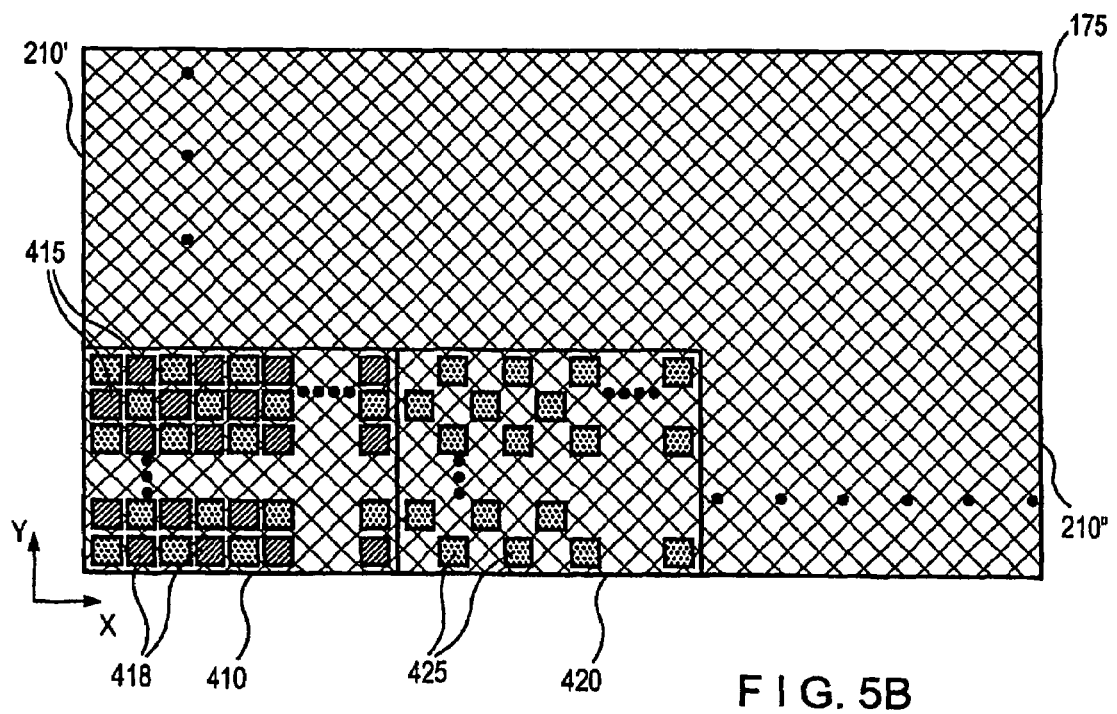

Thereafter, as shown in FIGS. 4B and 5B, the sample 170 is continued to be translated in the −X direction relative to the masked beam pulse 164, and the beam pulse is masked by the first section A 300 and the second section B 350 of the mask 150 such that the first half portion of the masked beam pulse 164 patterned by the first section A 300 irradiates a second region 420 on the conceptual first column 205 of the semiconductor thin film 175, and the second half portion of the masked beam pulse 164 patterned by the second section B 350 irradiates the first region 410. Thus, first areas 425 of the second region 420 are positioned and irradiated in a substantially the same manner as the first areas 415 of the first region 410. It should be noted that prior to the irradiation of the first region 410 by the second half portion of the masked beam pulse 164 which is patterned by the second section B 350, the first portions 415 which were irradiated by the previous beam pulse (as shown in FIG. 5A) are allowed to solidify and crystallize. In addition, second portions 418 of the first region 410 which were irradiated by the second half portion of the beam pulse 164 masked by the second section B 350 of the mask 150 are interposed between the crystallized first portions 415. It is noted that the fluence used by the half portion of the masked beam pulse 164 to irradiate the first areas 415 is different from the fluence used to by a half portion of another masked beam pulse 164 to irradiate the second areas 418. Due to the fact that the first and second areas 415, 418 are interposed between one another, the performance of the TFT devices placed on such crystallized areas 415, 418 is preferably uniform throughout the first region 410.

Figure 5C:
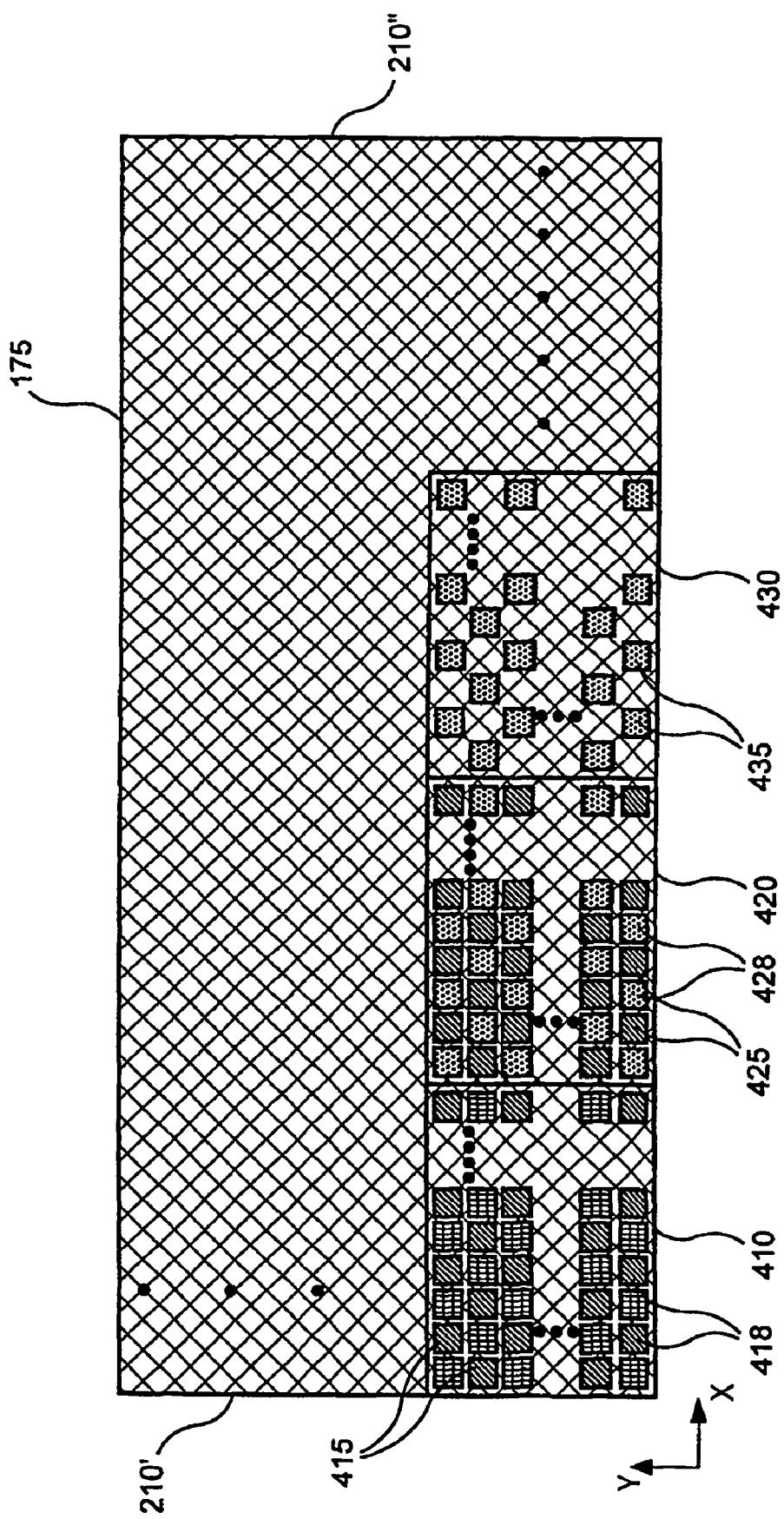

Next, as shown in FIGS. 4C and 5C, the sample 170 is continued to be translated in the −X direction relative to the masked beam pulse 164, and the beam pulse 149 is again masked by the first section A 300 and the second section B 350 of the mask 150 such that the half portion of the masked beam pulse 164 patterned by the first section A 300 irradiates a third region 430 on the conceptual first column 205 of the semiconductor thin film 175, and the second half portion of the masked beam pulse 164 patterned by the second section B 350 irradiates the second previously partially irradiated) region 420. First areas 435 of the third region 430 are positioned and irradiated in a substantially the same manner as the first areas 415 of the first region and the first areas 425 of the second region 420. Similar to the discussion above regarding the crystallization of the first irradiated areas 415 of the first region 410, the first areas 425 which were irradiated by the previous beam pulse (as shown in FIG. 5B) are allowed to solidify and crystallize. Further, second areas 428 of the second region 420 which were irradiated by the second half portion of the beam pulse 164 masked by the second section B 350 of the mask 150 are interposed between the crystallized first portions 425. In addition, the first areas 415 and the second areas 418 (and in particular all areas) of the first region 410 are crystallized.

Figure 4D:
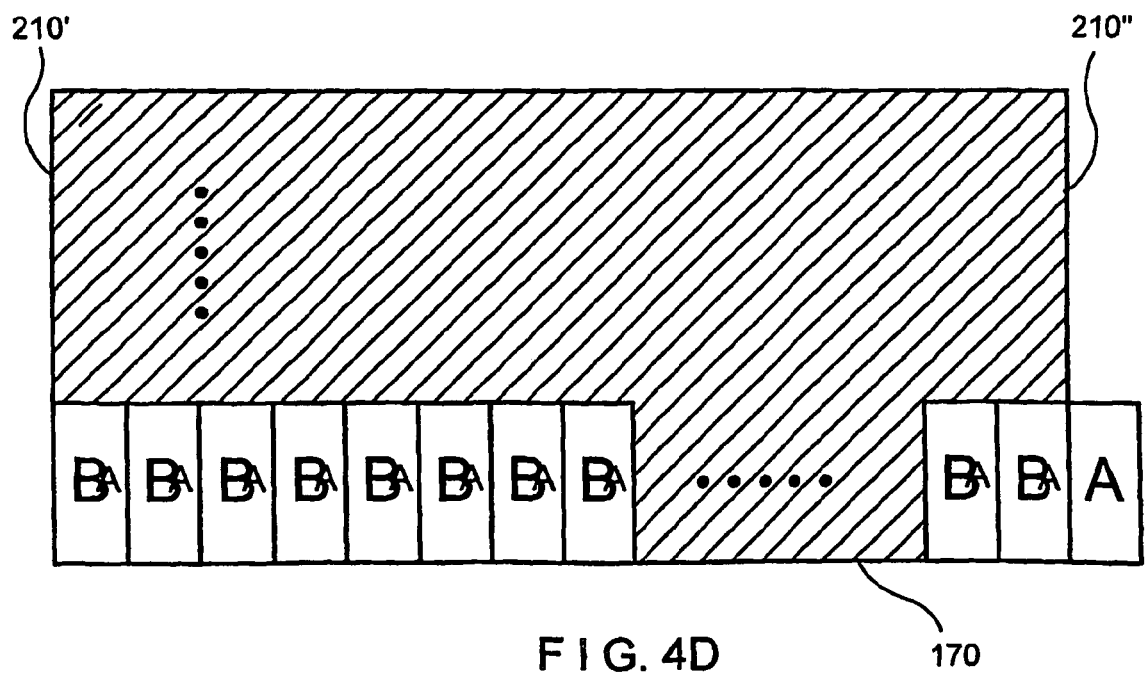
Figure 5D:
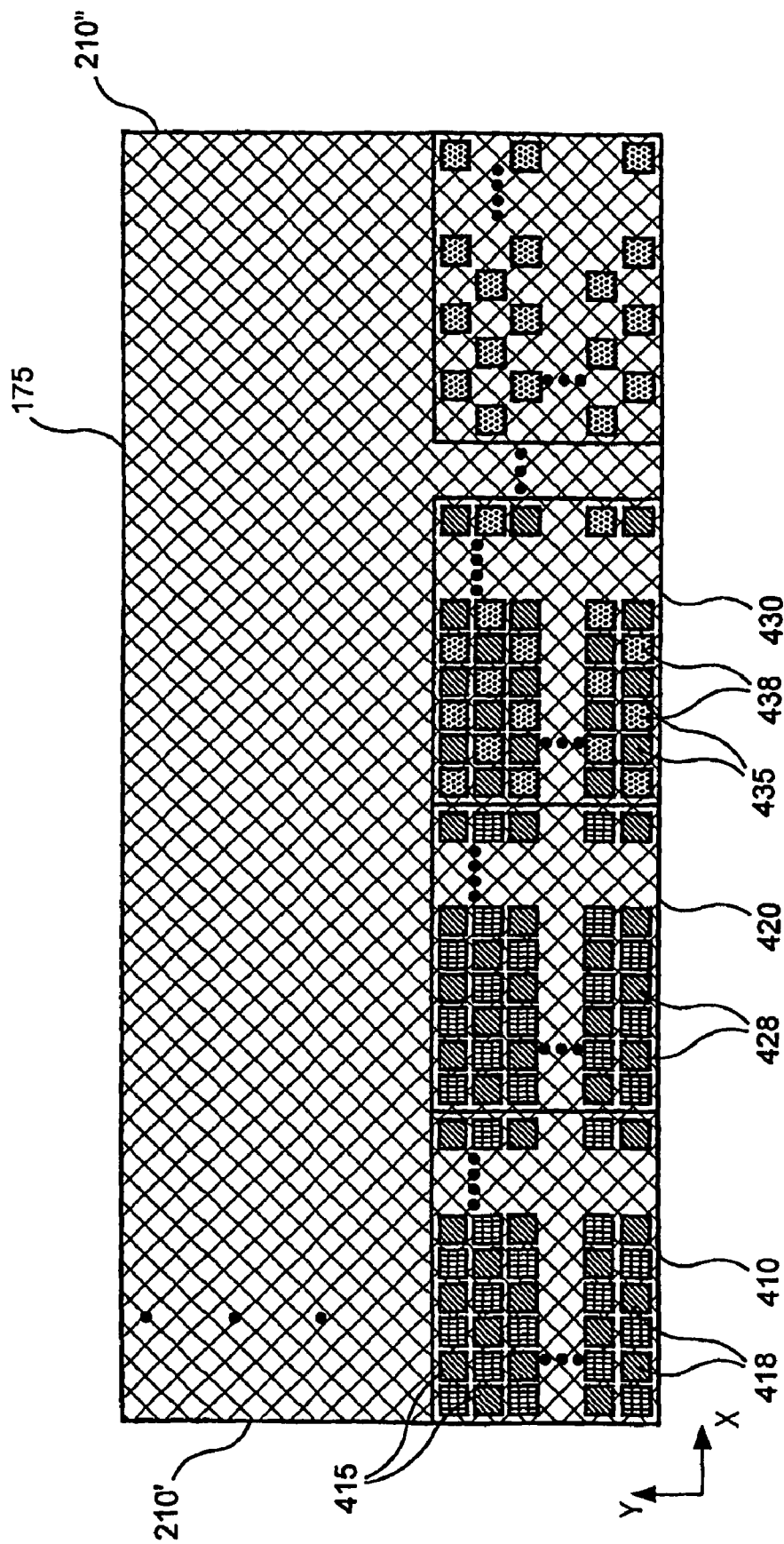

FIGS. 4D and 5D show the sample 170 being translated in the −X direction relative to the masked beam pulse 164, and the beam pulse is again masked by the first section A 300 and the second section B 350 of the mask 150 such that the half portion of the masked beam pulse 164 patterned by the first section A 300 irradiates a further region 430 on the conceptual first column 205 of the semiconductor thin film 175, and the second half portion of the masked beam pulse 164 patterned by the second section B 350 irradiates the third (previously partially irradiated) region 430. Thus, second portions 438 of the third region 430 that are irradiated by the half portion of the masked beam pulse 164 are interposed between the crystallized first portions 435.

Figure 4E:
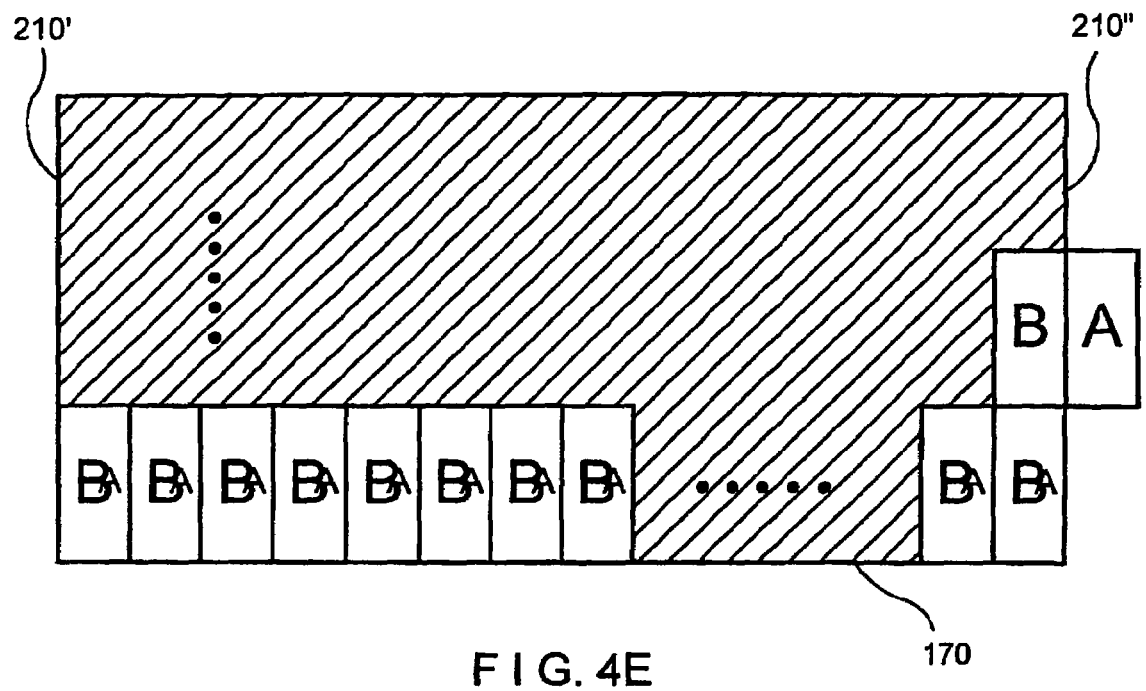
Figure 5E:
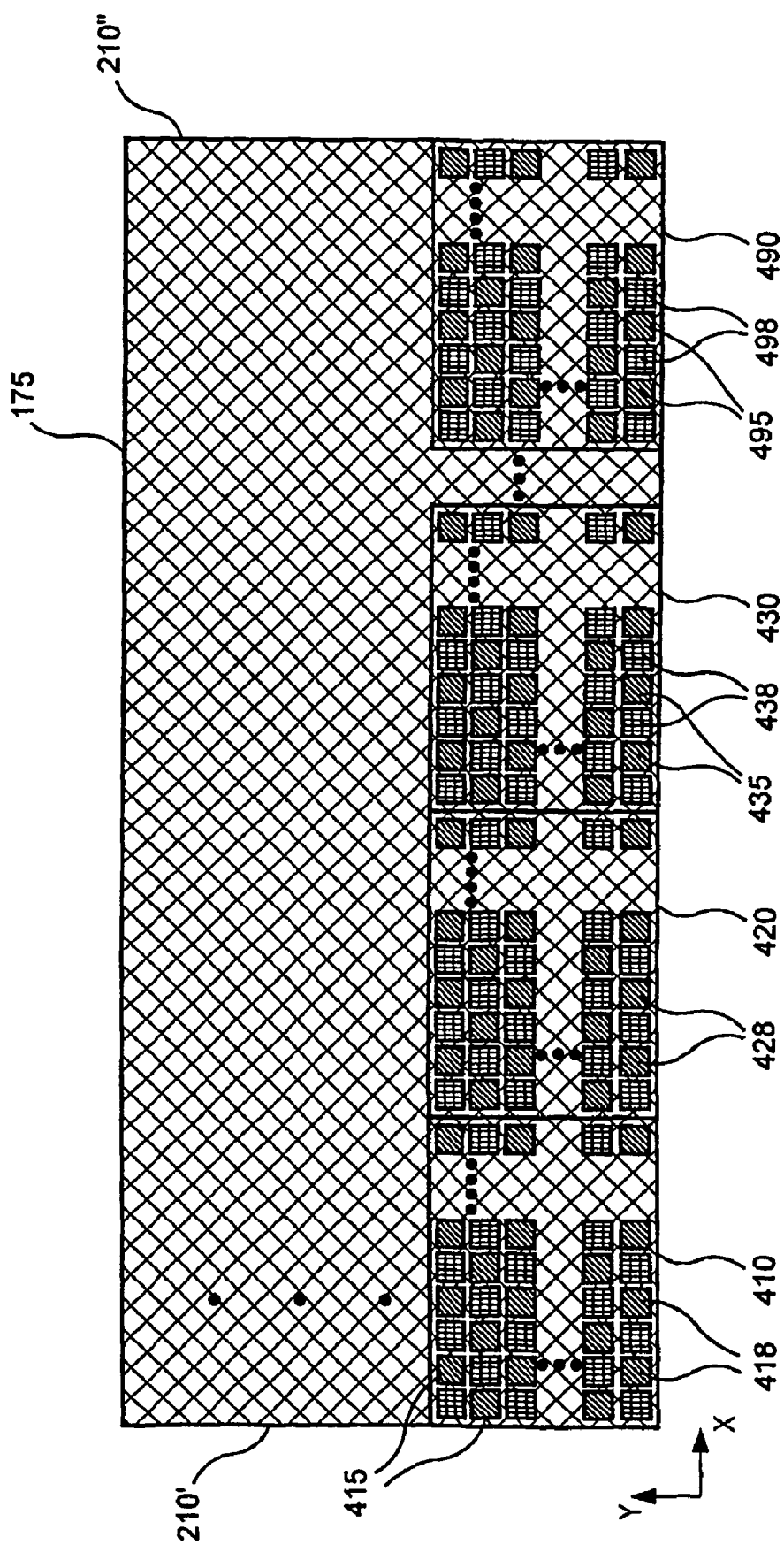

This translation continues until all regions 410, 420, 430, . . . , 490 are completed such that all of the respective first and second portions thereof are crystallized in the first conceptual column 205, i.e., until the pulsed beamlets 164 reach a second edge 210" of the sample 170, as illustrated in FIGS. 4E and 5E. When the beam pulse 164 passes the second edge 210", the translation of the sample 170 may be slowed with respect to the beam pulse 164 (in a third beam path 235) to reach a second location 240 (see FIG. 2). It should be noted that it is not necessary to shut down the pulsed beam 111 after the beam pulse 164 has crossed the second edge 210" of the sample 170 because it is no longer irradiating the sample 170.

While being away from the sample 170 and the second edge 210", the sample 170 is continued to be translated in a −Y direction to a third location 247 via a fourth beam path 245 so as to be able to irradiate the sections of the semiconductor thin film 175 along the second conceptual column 206. Then, the sample 170 is allowed to settle at that location 247 to allow any vibrations of the sample 170 that may have occurred when the sample 170 was continued to be translated to the third location 247 to cease. Indeed, for the sample 170 to reach the second conceptual column 206, it is continued to be translated approximately ½ cm for the columns having a width (in the −Y direction) of ½ cm. The sample 170 is then accelerated to the predetermined velocity via a fourth beam path 250 in the −X direction so that the impingement of the semiconductor thin film 175 by the beam pulse 164 reaches, and then bypasses the second edge 210".

Thereafter, the sample 170 is continued to be translated along a fifth beam path 255, and the exemplary process described above with respect to the irradiation of the first column 205 may then be repeated for the second conceptual column 206 to irradiate further areas 410, 420, and their respective small-grained regions 415, 425 and laterally-grown regions 418, 428 while translating the sample in the +X direction. However, instead of using the first section A 300 as providing the half beam pulse to first irradiate a first region 510 of the second conceptual column 205 of the semiconductor thin film 175, the second section B 350 of the mask is used for the patterning of the beam pulse, and irradiating the first region 510 of the second conceptual column 206.

Figure 4F:
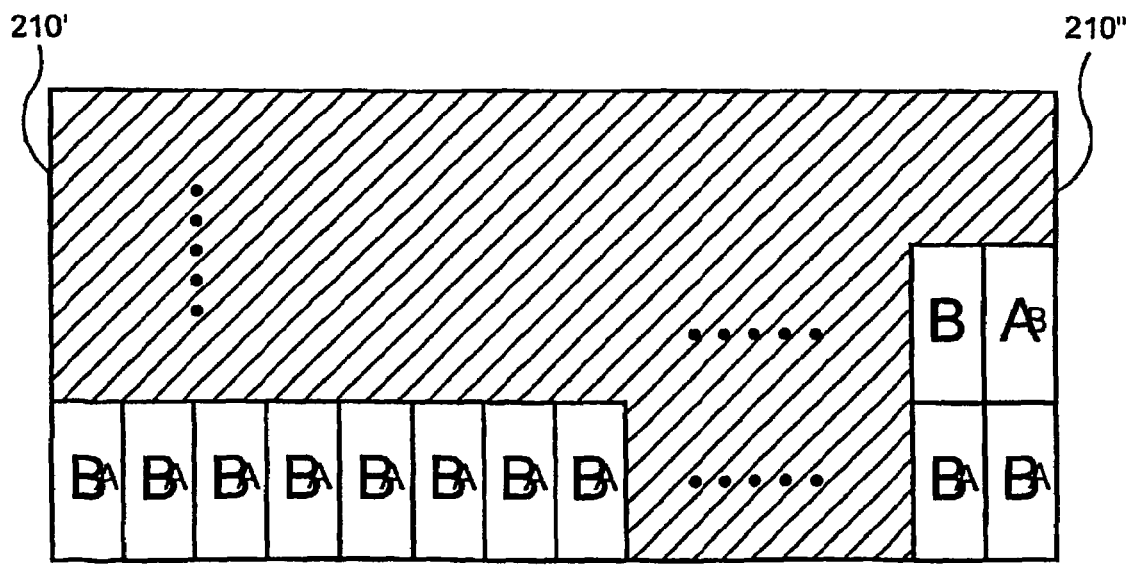
Figure 4G:
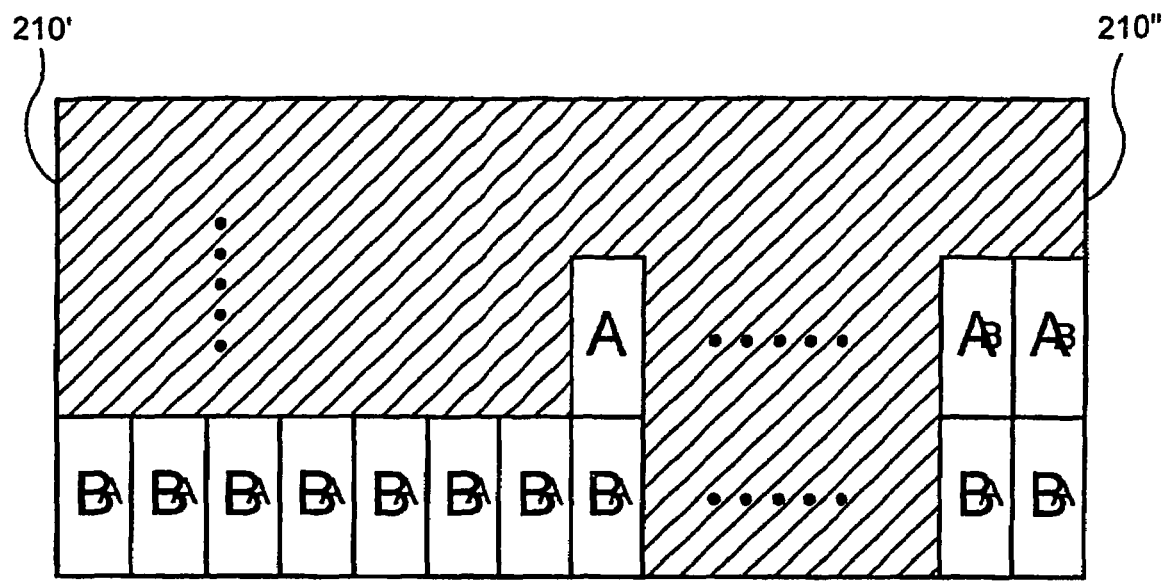
Figure 4H:
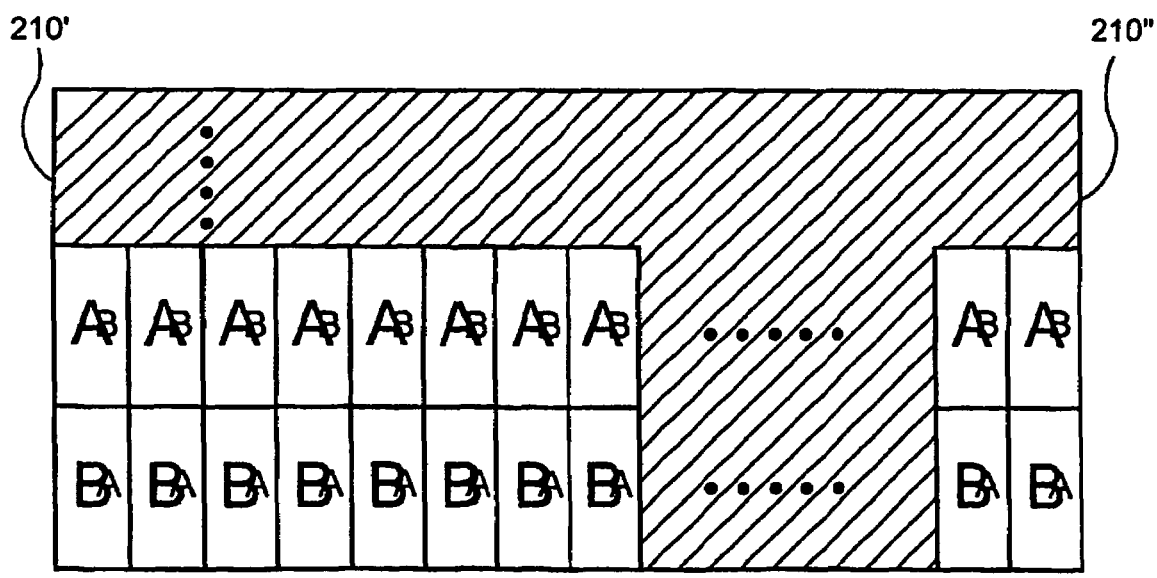
Figure 5F:
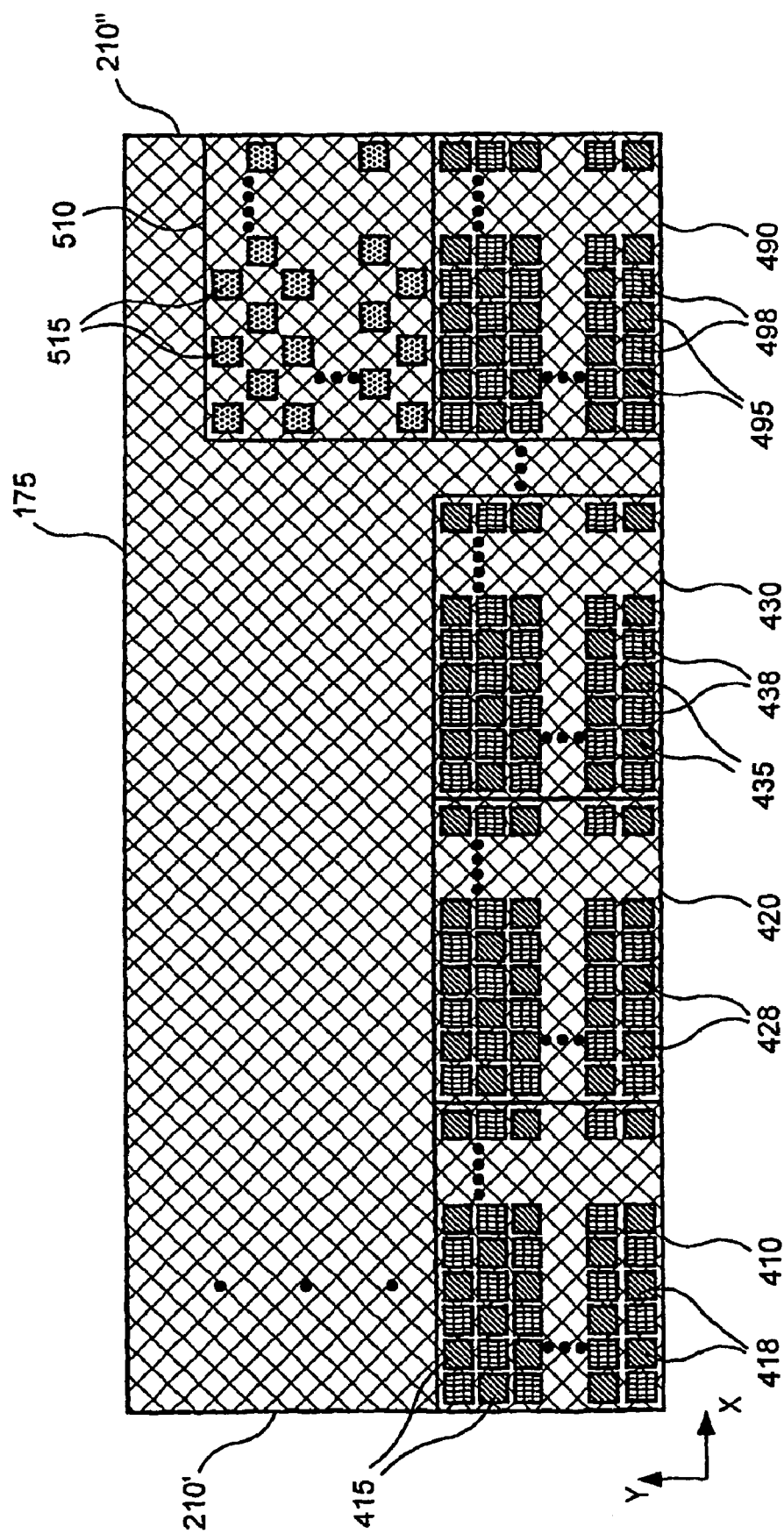
Figure 5G:
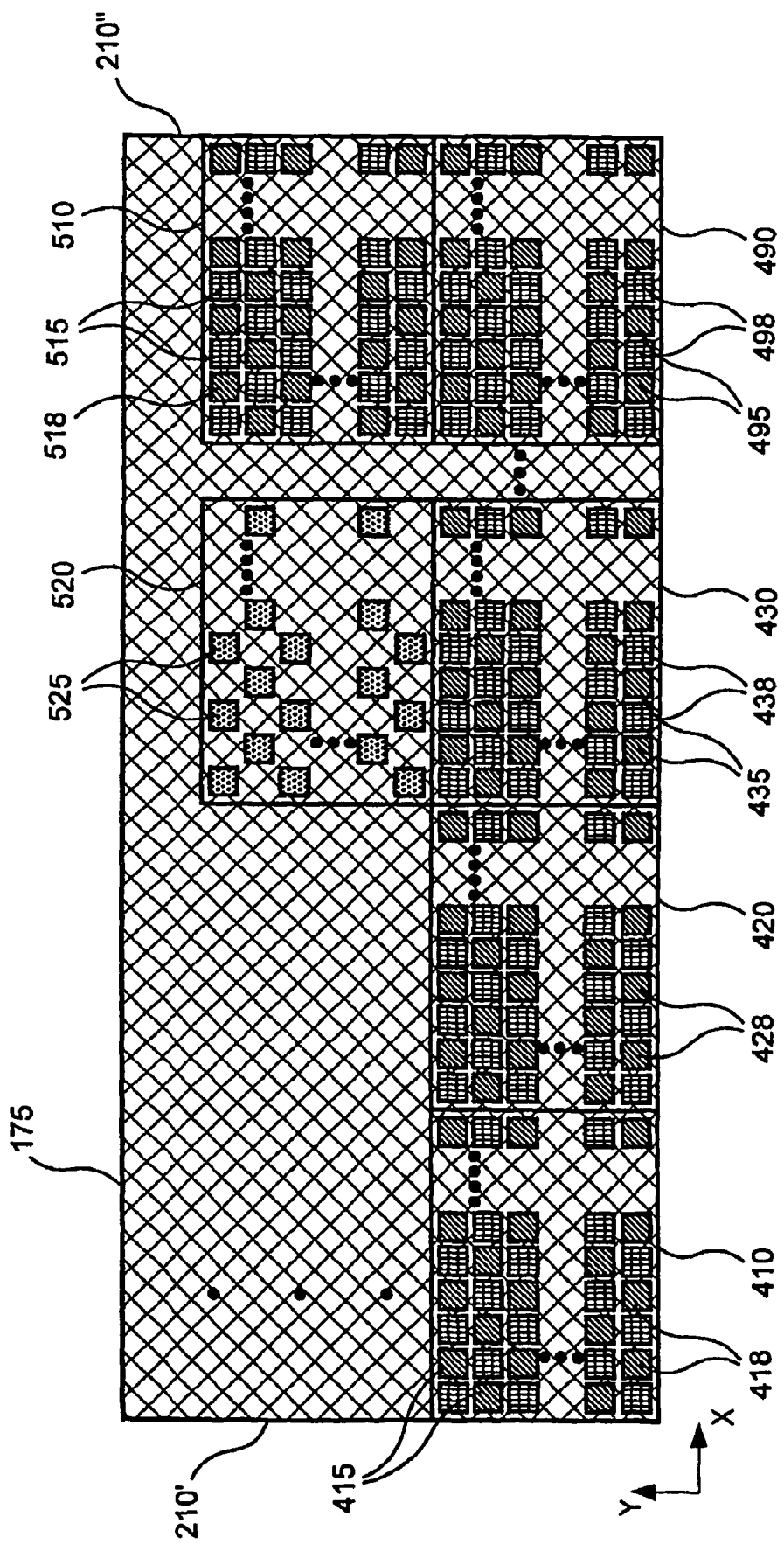
Figure 5H:
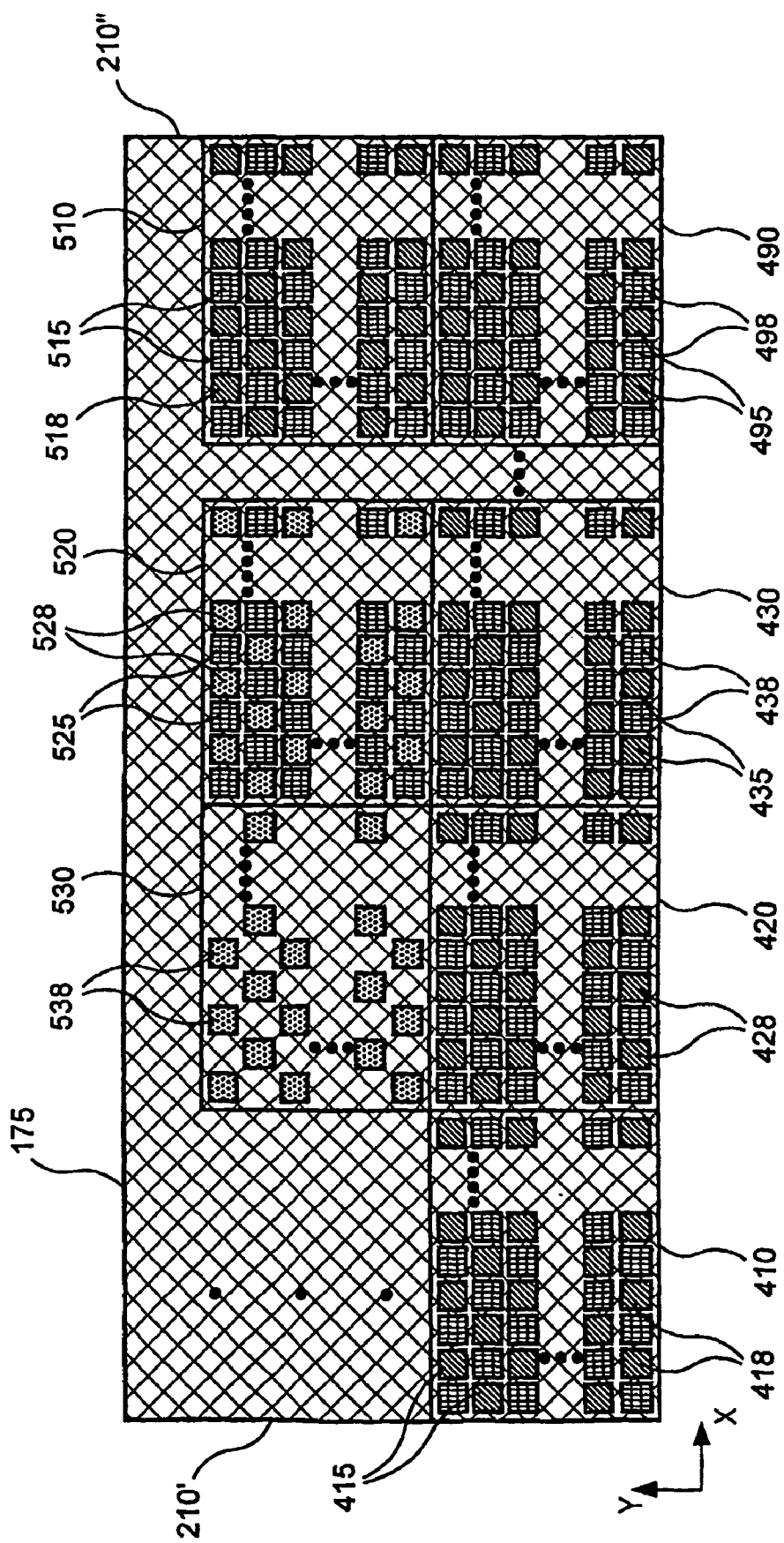

In particular, FIGS. 4F and 5F show that the masked beam pulse 164 patterned by the second section B 350 of the mask 150 impinges the first region 510 on the second conceptual column 206 of the semiconductor thin film sample 170, while the masked beam pulse 164 patterned by the first section A 300 of the mask 150 irradiates an area away from the semiconductor thin film 175. Therefore, the first region 410 of the semiconductor thin film 175 is irradiated only by the beam pulse 164 masked by the second section B 350 of the mask 150. As shown in FIG. 5F, the irradiated first region 510 of the second conceptual column 206 is composed of irradiated first portions 515 which are provided at a distance from one another, and substantially match the positions and orientations of the slits 360 of the second section B 350 of the mask 150. FIGS. 4G, 4H, 5G, 5H show that the regions of the second conceptual column 206 of the semiconductor thin film 175 are irradiated by the beam pulses patterned by the mask 150, such that the second half portion of the masked beam pulse 164 lead the first half portion of the masked beam pulse 164 in their irradiation of all of the regions of the second conceptual column 206 of the semiconductor thin film 175.

In this manner, all conceptual columns of the sample 170 can be properly irradiated. In particular, when the beam pulse 164 reaches the first edge 210', the translation of the sample 170 is decelerated along a sixth beam path 260 to reach a fourth location 265. At that point, the sample 170 is continued to be translated in the −Y direction along the seven beam path 270 for the beam pulse to be outside the periphery of the sample 170 to reach fifth location 272, and the translation of the sample 170 is allowed to be stopped so as to remove any vibrations from the sample 170. Thereafter, the sample 170 is accelerated along the eighth beam path 275 in the −X direction so that the beam pulse 164 reaches and passes the first edge 210' of the sample 170, and the beam pulse 164 irradiates and at least partially melts certain areas in the third conceptual column 207 so that they can crystallize in substantially the same manner as described above for the areas 410, 420, 430, . . . , 490 of the first conceptual column 205 and shown in FIGS. 5A-5E.

This procedure may be repeated for all conceptual columns of the semiconductor thin film 175, or for selective columns of particular sections of the thin film 175 which are not necessarily conceptually subdivided into columns. With this exemplary procedure according to the present invention, because the first and second crystallized areas of all regions in the semiconductor thin film 175 are interposed between one another, the performance of the TFT devices placed on such crystallized areas is approximately uniform throughout the TFT device situated on such crystallized areas.

In addition, it is possible for the computing arrangement 100 to control the firing of the beam 111 by the beam source 110 based on the predefined location stored in the storage device of the computing arrangement 100 (e.g., instead of irradiating the semiconductor thin film 175 by setting predetermined pulse durations). For example, the computing arrangement 100 can control the beams source 110 to generate the beam 111 and irradiate only at the predetermined locations of certain areas of the thin film 175 with its corresponding beam pulse 164, such that these locations are stored and used by the computing arrangement 100 to initiate the firing of the beam 111 which results in the irradiation by the beam pulse only when the sample 170 is continued to be translated to situate those areas directly in the path of the beam pulse 164. The beam source 110 can be fired via the computing arrangement 100 based on the coordinates of the location in the X direction.

In addition, it is possible to translate the sample 170 in a manner which is not necessary continuous, when the path of the irradiation of the beam pulse 164 points to the areas on the semiconductor thin film 175 to be melted and crystallized. Thus, it is possible for the translation of the sample 170 to be stopped in the middle of the sample 170, with the area in the middle being irradiated, at least partially melted, and then re-solidified and crystallized. Thereafter, the sample 170 can be moved so that another section of the semiconductor thin film 175 is arranged in the path of the beam pulse 164, such that the translation of the sample is then stopped again and the particular section is irradiated and at least partially melted in accordance with the exemplary embodiment of the process described in great detail above, as well as the embodiments of the process which shall be described below.

Figure 6A:
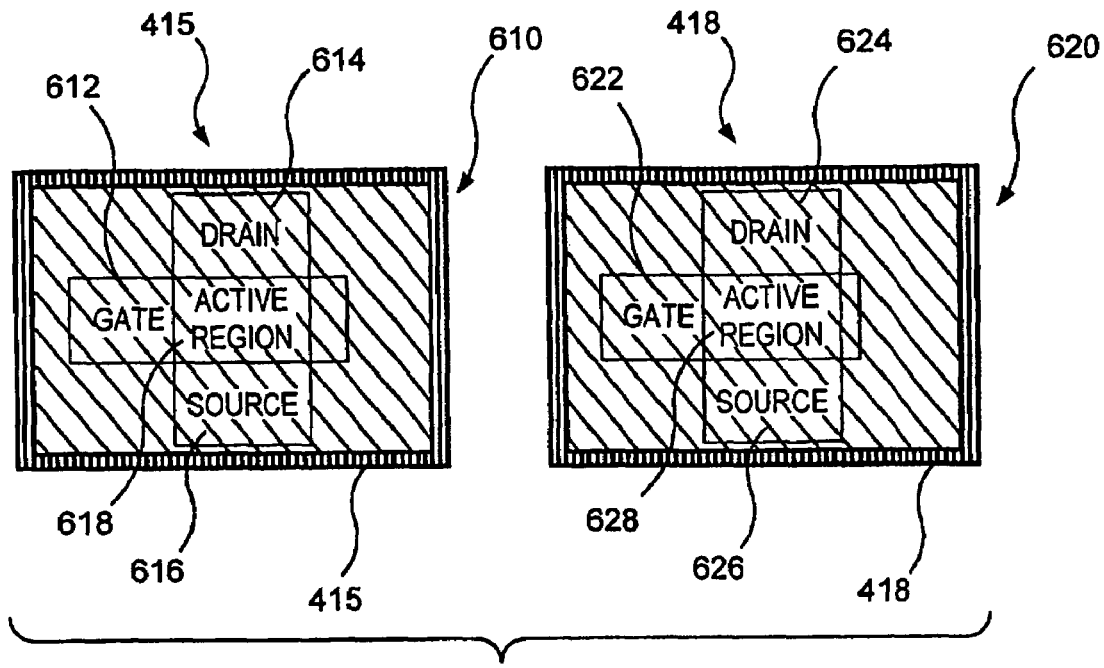
FIG. 6A is an illustration of the two particular areas irradiated, re-solidified and crystallized areas corresponding to the crystallized areas of FIGS. 5G and 5H in which the entire TFT device is situated in the crystallized areas.
Figure 8A:
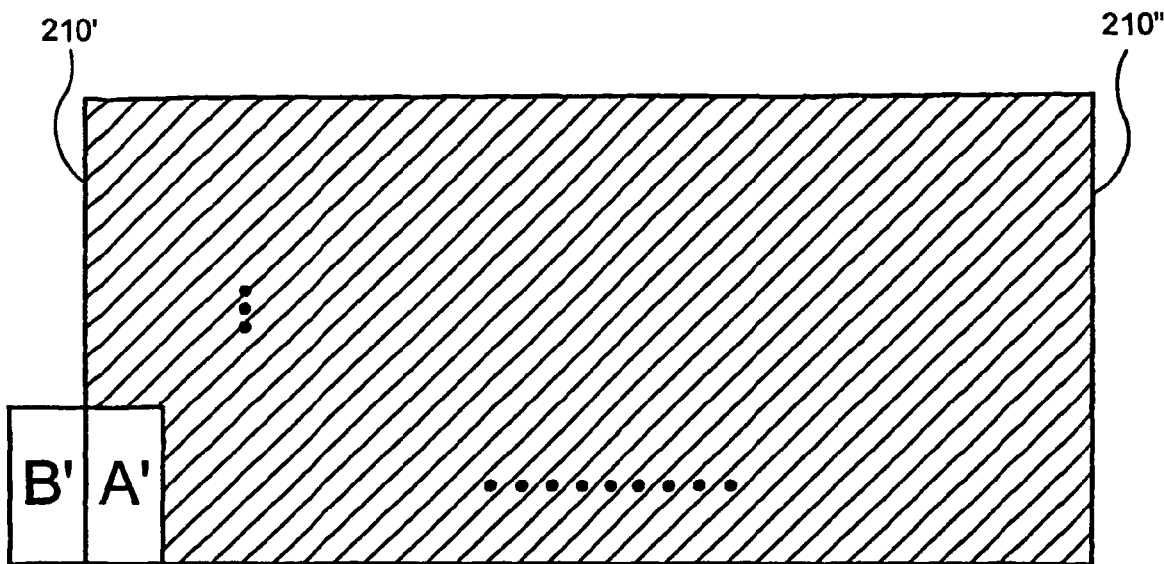
FIGS. 8A-8H are sequential movements of the semiconductor film of a sample with respect to the pulsed beam as the beam pulse is patterned by the mask of FIG. 7 according to an exemplary embodiment of the present invention.

FIG. 6A shows an illustration of the first and second irradiated, re-solidified and crystallized areas 415 and 418 of the first region 410 illustrated in FIGS. 5C-5H. In particular, FIG. 8A shows that the entire TFT devices 610, 620 can be situated within the respective first and second areas 415, 418 of the first region. The first TFT device 610 situated in the first area 415 of the first region 410 includes a gate 612, a drain 614, a source 616 and an active region 618, all of which are provided away from the border area of the first area 415. Similarly, for the second TFT device 610, its gate 622, drain 624, source 626, and especially active region 628 are also situated such that that they do not overlap the second are 418 of the first region 410.

Figure 6B:
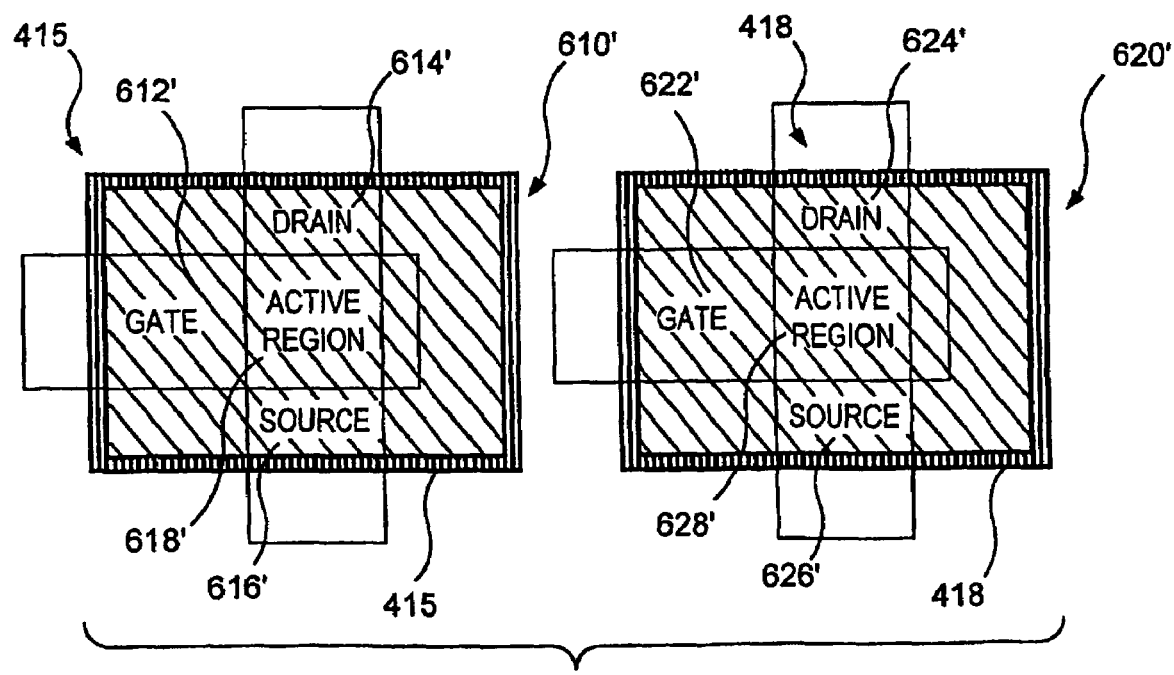
FIG. 6B is an illustration of the two particular areas irradiated, re-solidified and crystallized areas corresponding to the crystallized areas of FIGS. 5G and 5H in which an active region of the TFT device is situated in the crystallized areas, while other regions are provided over border areas between the crystallized areas.

FIG. 6B shows an illustration of the first and second irradiated, re-solidified and crystallized areas 415 and 418 of the first region 410 illustrated in FIGS. 5C-5H with the respective TFT devices 610', 620' provided thereon. In this exemplary embodiment, only respective active regions 618', 628' of the TFT devices 610', 620' are provided within the respective first and second crystallized areas 415, 418, while other portions of the TFT devices 610', 620' are situated on the borders of the these areas 415, 418. In particular, the first TFT device 610' includes an active region 618' which entirely situated in the first area 415 of the first region 410, while a gate 612', a drain 614' and a source 616' of this TFT device 610' overlap the borders of the first area 415. Also, for the second TFT device 610', an active region 628' thereof is entirely situated within the respective second area 418 of the first region 410, while a gate 622', a drain 624' and a source 626' of the second TFT device 620' are provided directly on the borders of such second area 418. It should be understood that any one of the gate 612, 612', 622, 622', drain 614, 614', 624, 624' and source 616, 616', 626, 626' can be provided on the first and second areas 415, 418 and the border regions thereof. In addition, according to still another embodiment of the present invention, it is possible to situate a small portion of the active regions 618', 628' of the respective TFT devices 610', 620' on the border regions of the first area 415 and/or the second area 418, while still having the major portions of these active regions 618', 628' provided within such first and second areas 415, 418.

Figure 7:
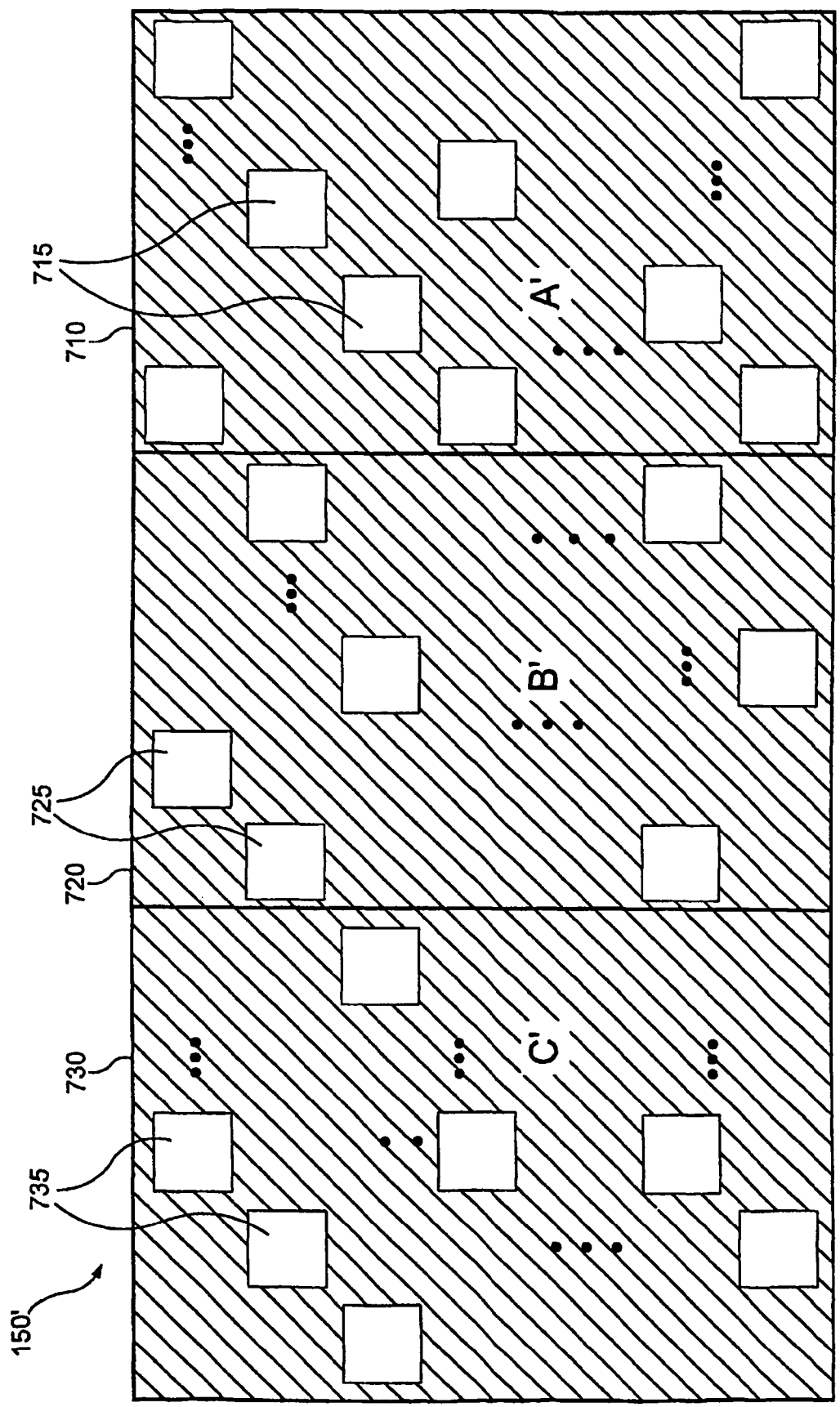
FIG. 7 is a top view of a second exemplary embodiment of a mask according to the present invention which is divided into three areas such that respective set of beamlets being patterned by the first, second and third areas are capable of irradiating the same region of the thin film, and the sections of the regions irradiated by each of the set of beamlets are dispersed throughout that region.

FIG. 7 is a top view of a second exemplary embodiment of the mask 150' according to the present invention which is divided into a first section A' 710, a second section B' 720 and a third section C' 730 such that respective set of beamlets being patterned by the first, second and third sections 710, 720, 730 are capable of irradiating the same region of the thin film, and the sections of the regions irradiated by each of the set of beamlets are dispersed throughout that region. Similar to the first exemplary mask 150 illustrated in FIG. 3, the first, second and third sections 710, 720, 730 have respective multiple open or transparent regions 715, 725, 735 which are separated from one another by beam-blocking regions, and can be referred to as slits. These slits permit small beam pulses (or beamlets) to irradiate there-through and at least partially melt the areas of the semiconductor thin film 175 that they impinge.

A second exemplary embodiment of the process according to the present invention is described below with reference FIGS. 8A-8H and 9A-9H. as for the first embodiment of the process, the relative translation of the sample 170 is accelerated until the beam pulse 164 reaches the first edge 210'. Upon the passing the first edge 210', the beam pulse 149 is passed through the first section A' 710, the second section B' 720 and the third section C' 730 of the mask 150' which patterns the beam pulse 149 to become the masked beam pulse 164 in the substantially the same patterns as that of the mask 150'. As shown in FIGS. 8A and 9A, the masked beam pulse 164 patterned by the first section A' 710 of the mask 150' so as to impinge and irradiate a first region 810 on the first conceptual column 205 of the semiconductor thin film sample 170, while the masked beam pulse 164 patterned by the second section B' 720 and the third section C' 730 of the mask 150' irradiates an area away from the edge 210' of the semiconductor thin film 170. Therefore, as shown in FIGS. 8A and 9A, the first region 810 of the semiconductor thin film is irradiated only by the beam pulse 164 masked by the first section A' 710 of the mask 150'. As shown in FIG. 9A, the irradiated first region 810 is initially composed of irradiated first portions 815 which are provided at a distance from one another, and substantially match the positions and orientations of the slits 715 of the first section A' 710 of the mask 150'. As with the first embodiment shown in FIGS. 4A-4H and 5A-5H, the irradiated first portions 815 of the first region 810 are provided such that the portions between these irradiated first portions 815 can be irradiated with another beam pulse (e.g., a subsequent masked beam pulse).

Figure 8B:
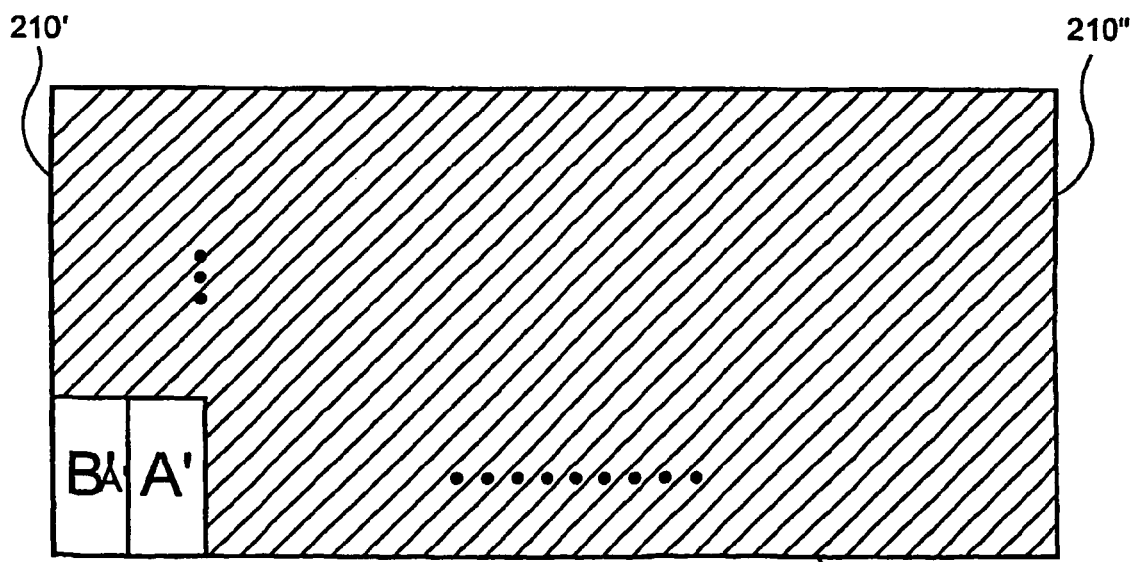
Figure 9A:
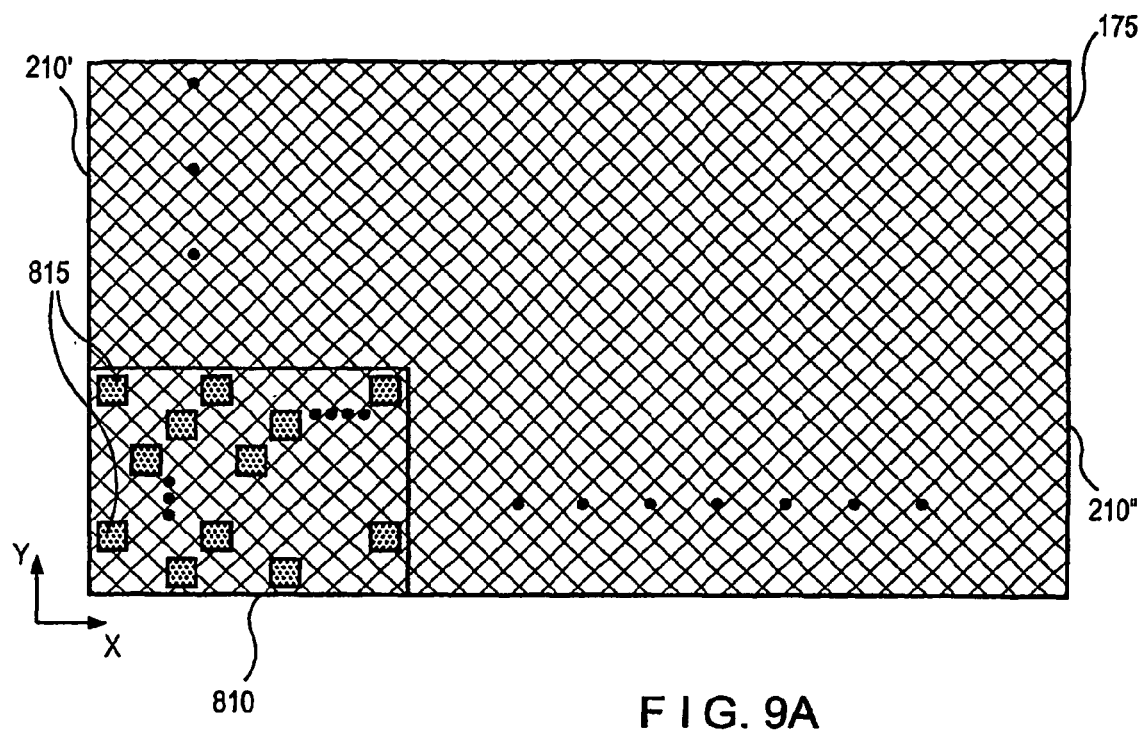
Figure 9B:
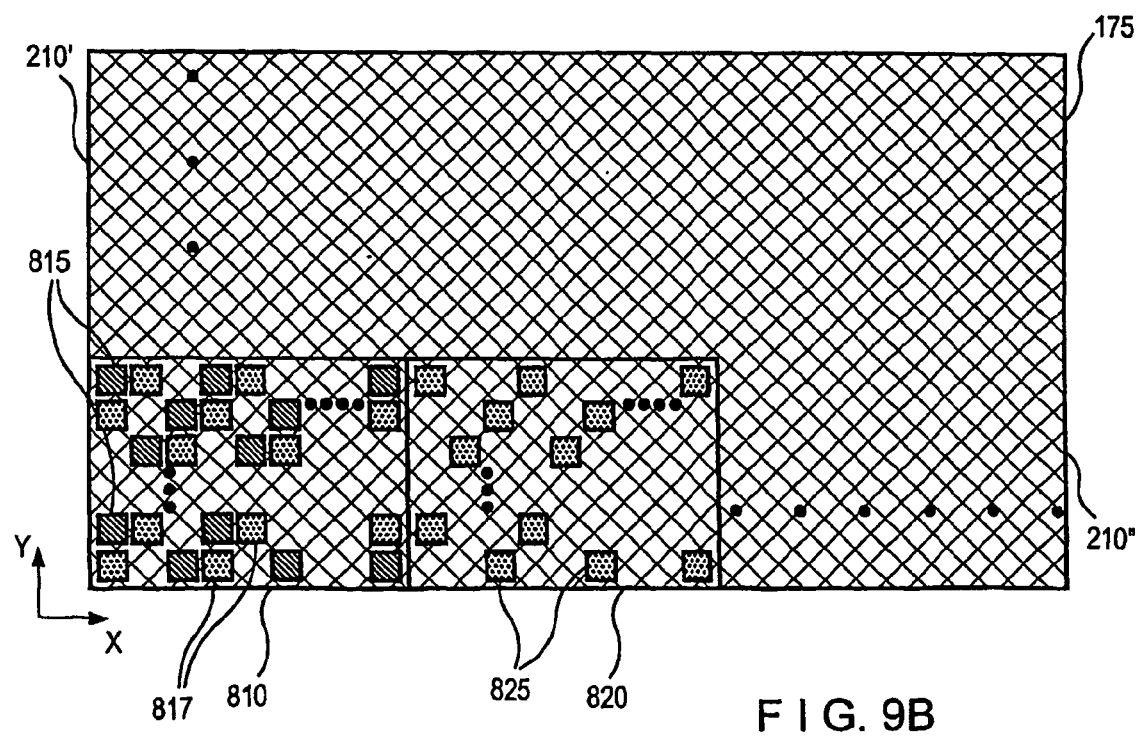

Thereafter, as shown in FIGS. 8B and 9B, the sample 170 is continued to be translated in the −X direction relative to the masked beam pulse 164, and the beam pulse is masked by the first section A' 710 and the second section B' 720 of the mask 150' such that the first one-third portion of the beam pulse 164 (i.e., patterned by the first section A' 710) irradiates a second region 820 on the conceptual first column 205 of the semiconductor thin film 175, and the second one-third portion of the masked beam pulse 164 (i.e., patterned by the second section B' 720) irradiates the first region 810. The third one-third portion of the masked beam pulse 164 which is patterned by the third section C' 730 of the mask 150' is irradiated away from the semiconductor thin film 175 (i.e., outside of the edge 210'). Thus, first areas 825 of the second region 820 are irradiated and situated in a substantially the same manner as the first areas 815 of the first region 810. It should be noted that prior to the irradiation of the first region 810 by the second one-third portion of the masked beam pulse 164 which is patterned by the second section B' 720, the first portions 815 which were irradiated by the previous beam pulse (as shown in FIG. 9A) are allowed to solidify and crystallize. In addition, second portions 817 of the first region 810 which were irradiated by the second one-third portion of the beam pulse 164 masked by the second section B' 720 of the mask 150' are interposed between the crystallized first portions 815. Based on the configuration of the first, second and third sections 710, 720, 730 of the mask 150', at such point, there are still unirradiated portions provided in the first region 810, even though first and second portions 815, 817 have been irradiated by the first one-third portion of the first masked beam pulse 164 and the second one-third portion of the subsequent masked beam pulse 164.

Figure 8C:
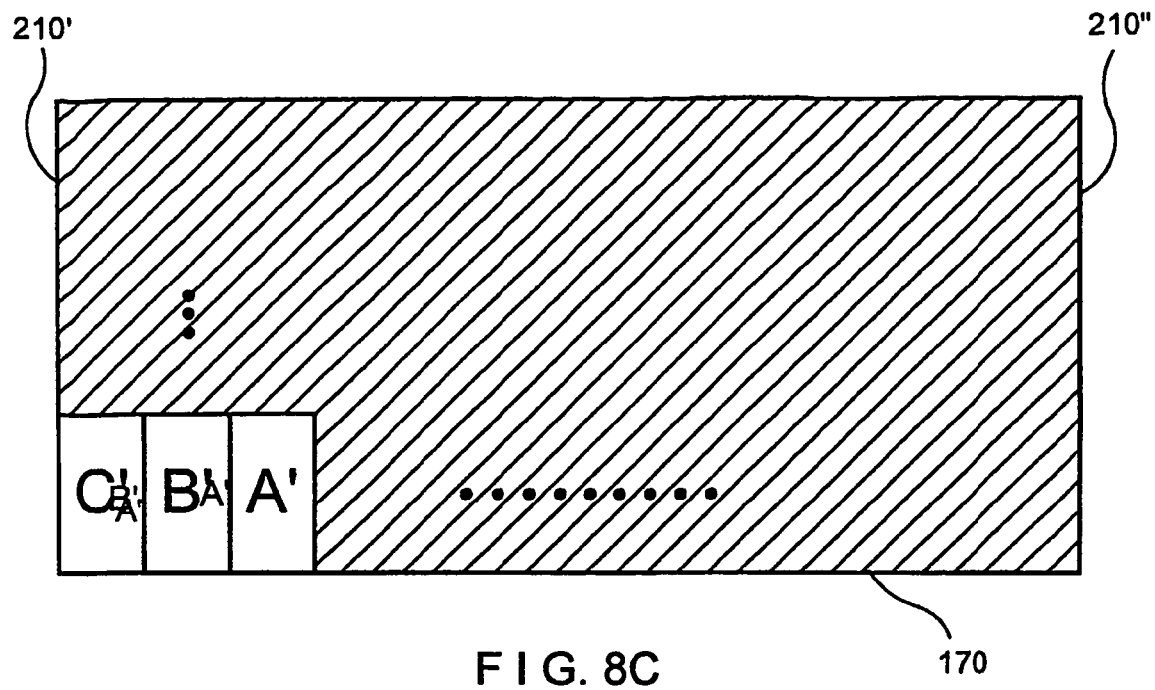

Then, as shown in FIGS. 8C and 9C, the sample 170 is again continued to be translated in the −X direction relative to the masked beam pulse 164, and the beam pulse is masked by the first, second and third sections 710, 720, 730 of the mask 150' such that the first one-third portion of the beam pulse 164 (i.e., patterned by the first section A' 710) irradiates a third region 830 on the conceptual first column 205 of the semiconductor thin film 175, the second one-third portion of the masked beam pulse 164 (i.e., patterned by second section B' 720) irradiates the second region 820, and the third one-third portion of the masked beam pulse 164

(i.e., patterned by the third section C' 730) irradiates the first region 810. Thus, first areas 835 of the second region 820 are irradiated and situated in a substantially the same manner as the first areas 815, 825 of the first and second regions 810, 820, respectively. Also, second areas 827 of the second region 820 are irradiated and situated in a substantially the same manner as the second areas 817 of the first region 810. Prior to the irradiation of the first region 810 by the third one-third portion of the masked beam pulse 164 which is patterned by the third section C' 730, the first and second portions 815, 817 which were irradiated by two previous beam pulses (as shown in FIGS. 9A and 9B) are allowed to solidify and crystallize. Also, before the irradiation of the first region 820 by the second one-third portion of the masked beam pulse 164 which is patterned by the second section B' 720, the first portions 825 which were irradiated by the first previous beam pulse (as shown in FIG. 9A) are also allowed to solidify and crystallize.

Figure 8D:
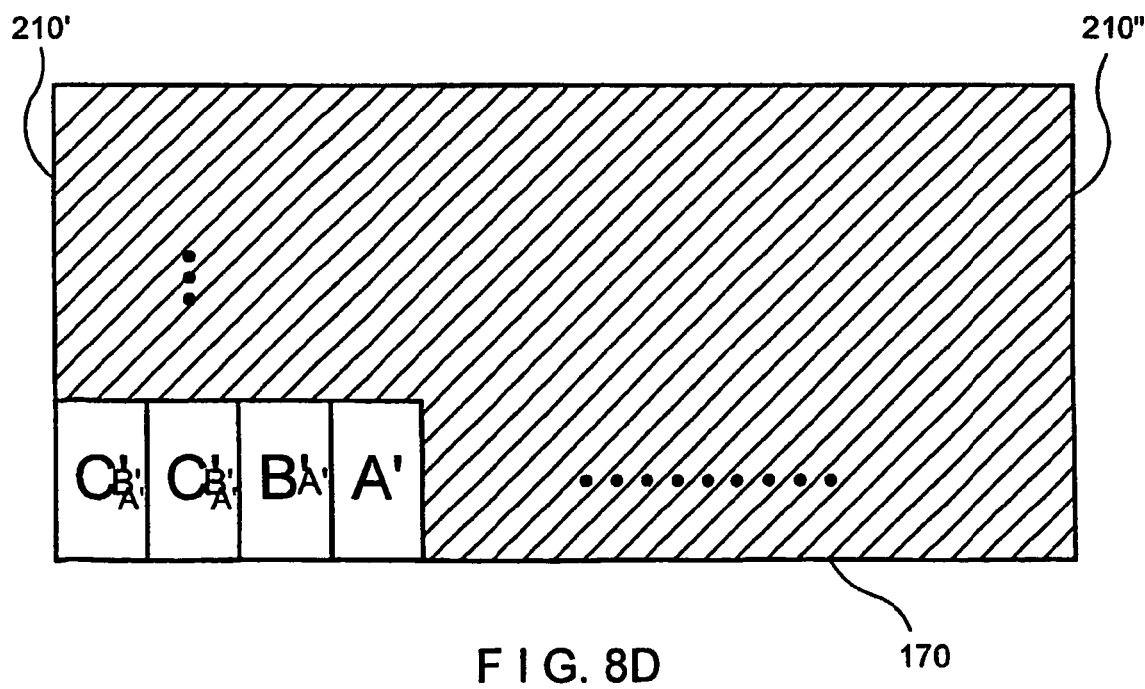
Figure 8E:
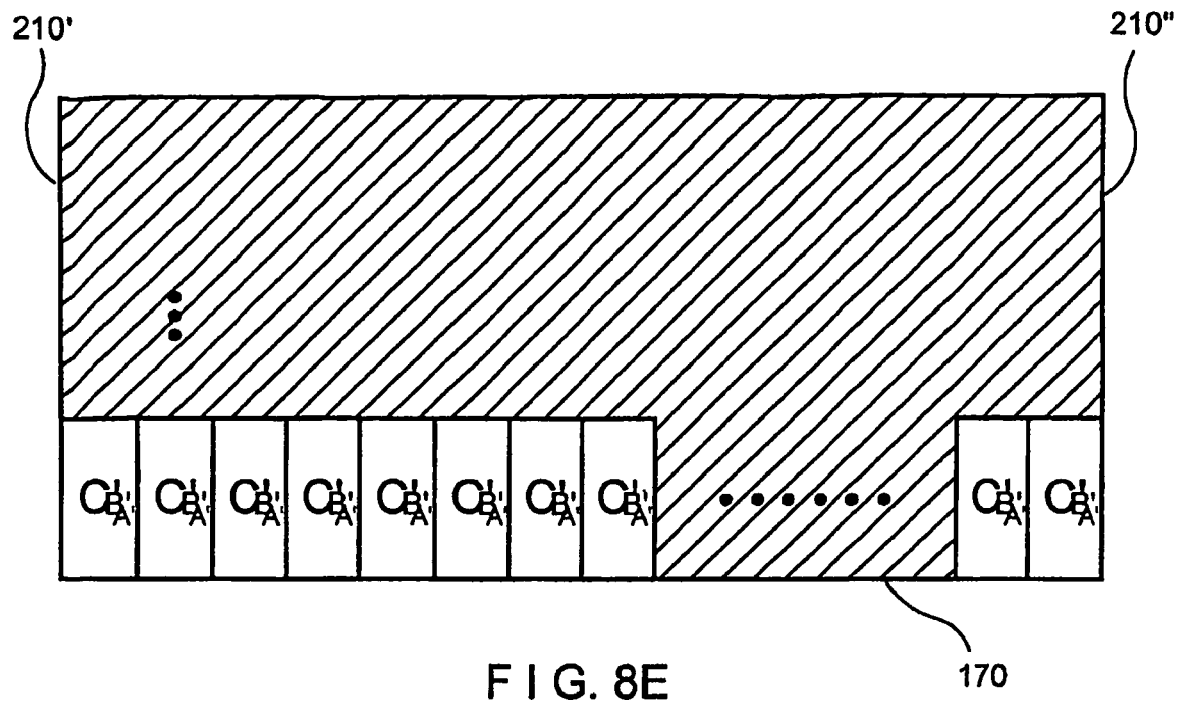
Figure 9D:
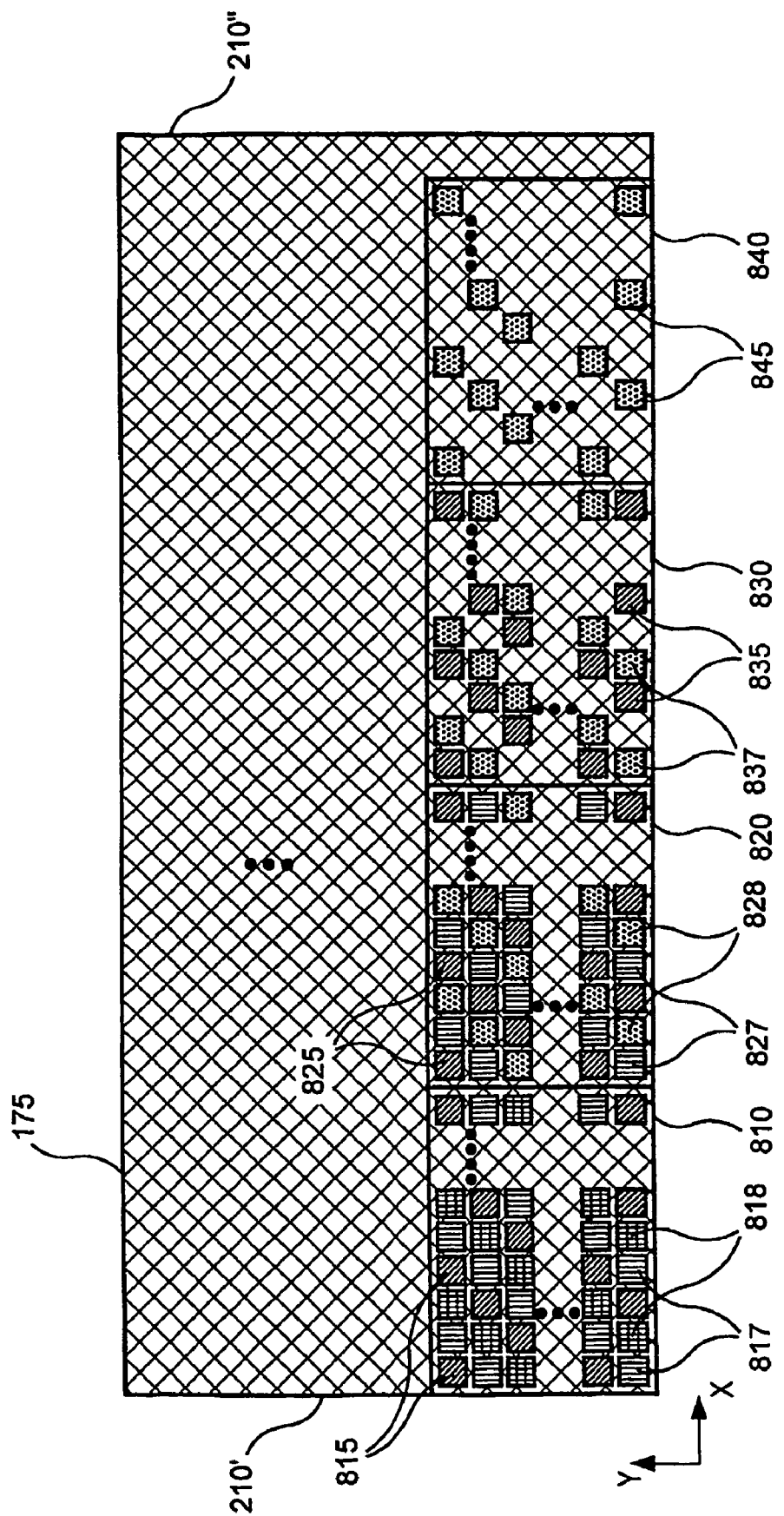
Figure 9E:
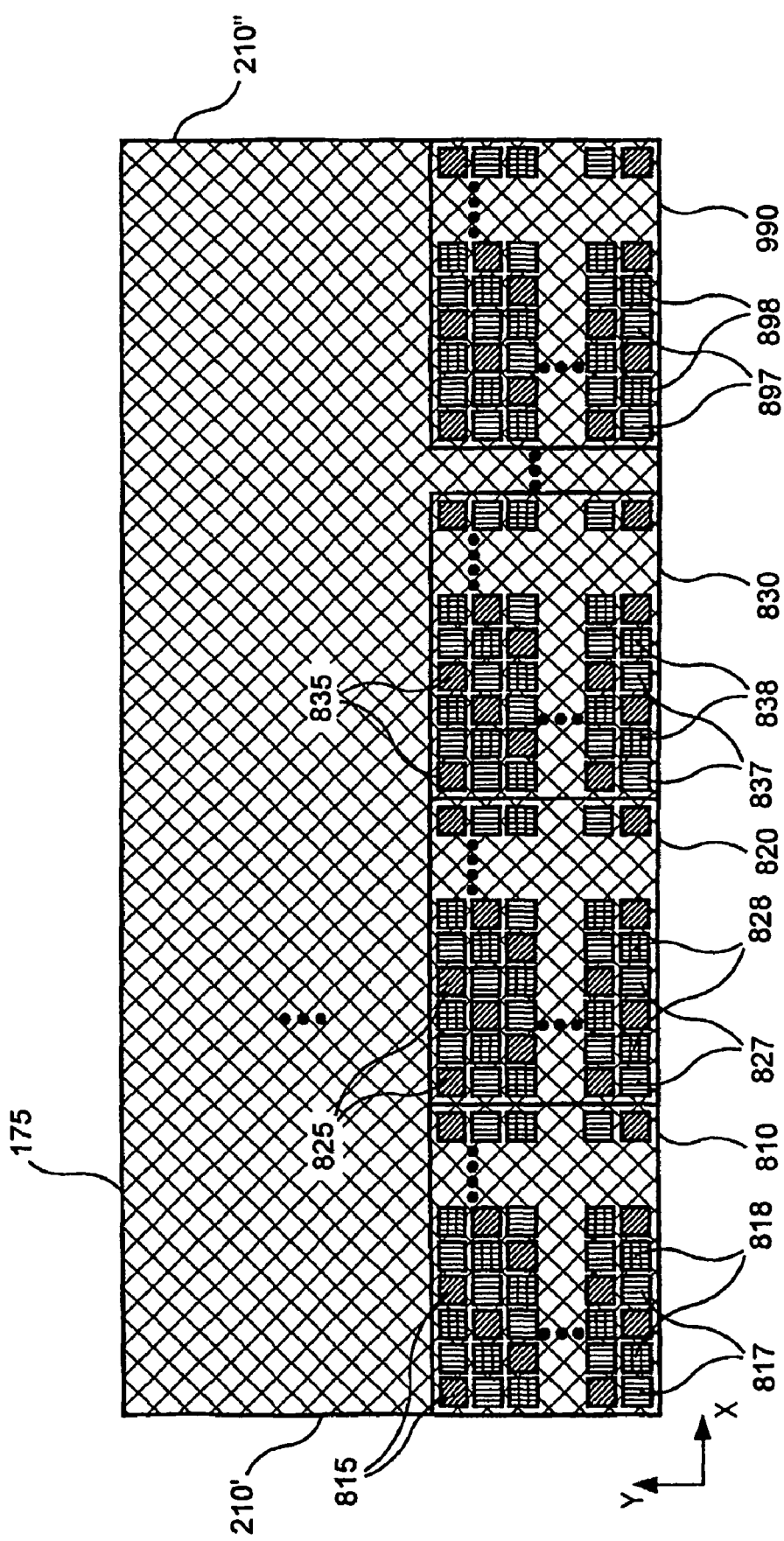

Further, the third portions 818 of the first region 810 which were irradiated by the third one-third portion of the beam pulse 164 masked by the third section C' 730 of the mask 150' are interposed between the crystallized first and second portions 815, 817. Also, the second portions 827 of the second region 820 which were irradiated by the second one-third portion of the beam pulse 164 masked by the second section B' 730 of the mask 150' are interposed between the crystallized first portions 825. Based on the configuration of the first, second and third sections 710, 720, 730 of the mask 150', there are no longer any unirradiated portions provided in the first region 810 after the irradiation thereof by the third one-third portion of the masked beam pulse 164. FIGS. 8D and 9D illustrate that upon the translation of the sample 170 in the −X direction and irradiating the first conceptual row 205 of the semiconductor thin film 175 by the fourth sequential masked beam pulse 164, the first region 810 has all portions 815, 817, 818 thereof irradiated and crystallized.

Similar to the discussion above with reference to the embodiment of the present invention illustrated in FIGS. 4A-4H and 5A-5H, the fluence used by the first one-third portions of the masked beam pulse 164 to irradiate the first areas 815 is different from each of the second and third one-third portions of the masked beam pulse 164 used to irradiate the second and third areas 817, 818, respectively. Due to the fact that the first, second and third areas 815, 817, 818 are interposed between one another, the performance of the TFT devices placed on such crystallized areas 815, 817, 818 is uniform throughout the first region 810. This procedure is repeated in the same manner for the entire first conceptual column 205 of the semiconductor thin film 175 until all regions thereof are irradiated and crystallized substantially in the same manner as provided above for with reference to the first region 810 of the semiconductor thin film 175, and as shown in FIGS. 8D, 8E, 9D, 9E.

Figure 8F:
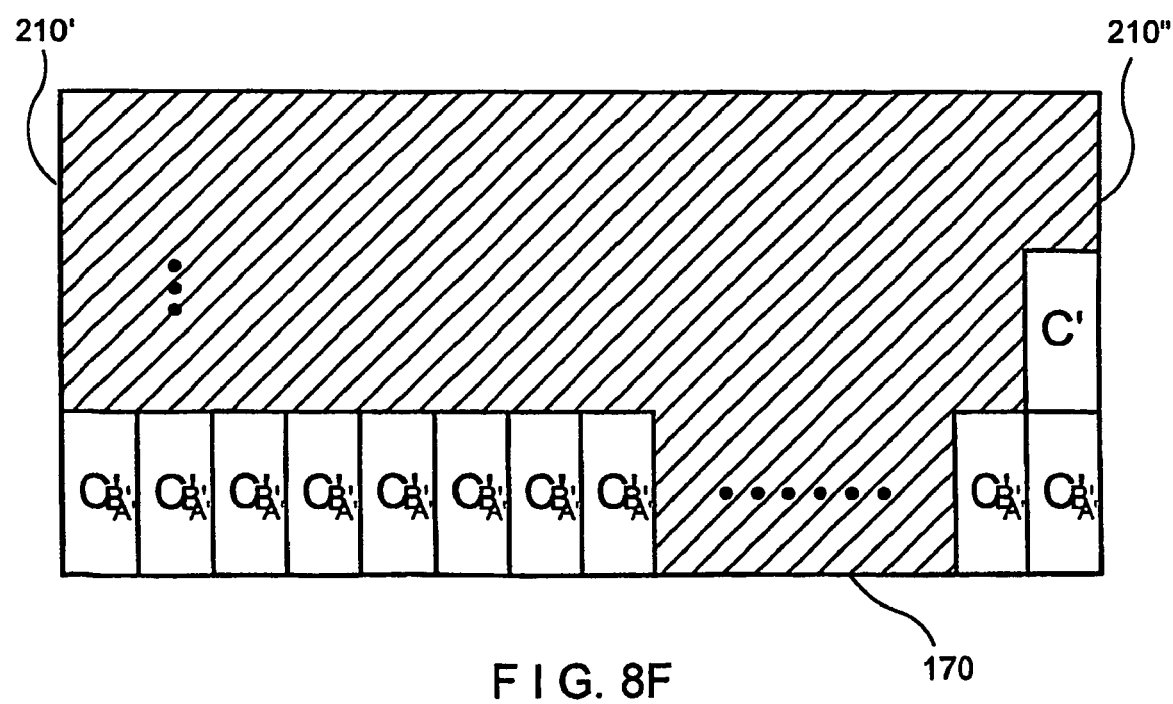
Figure 8G:
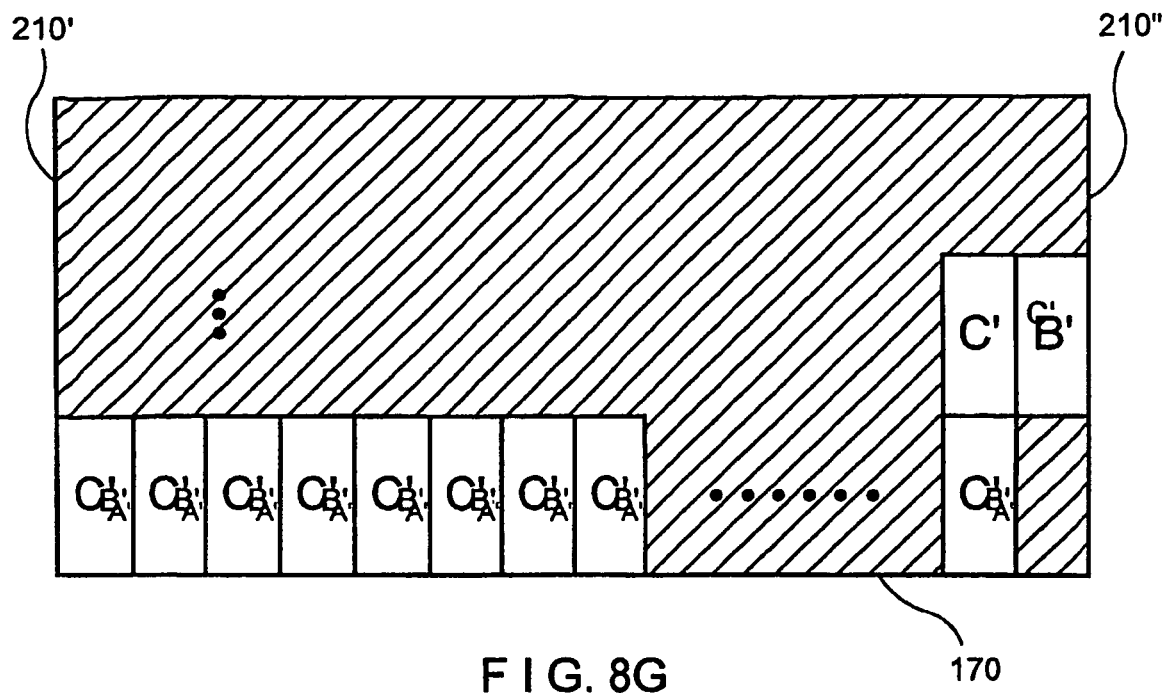
Figure 8H:
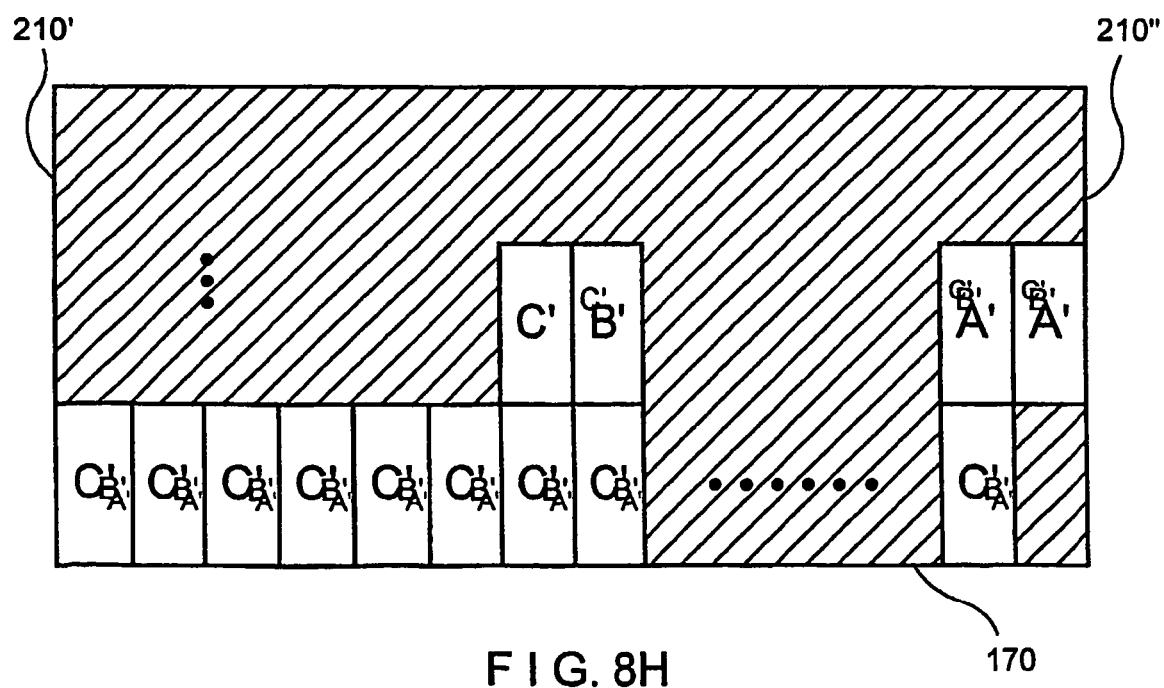
Figure 9F:
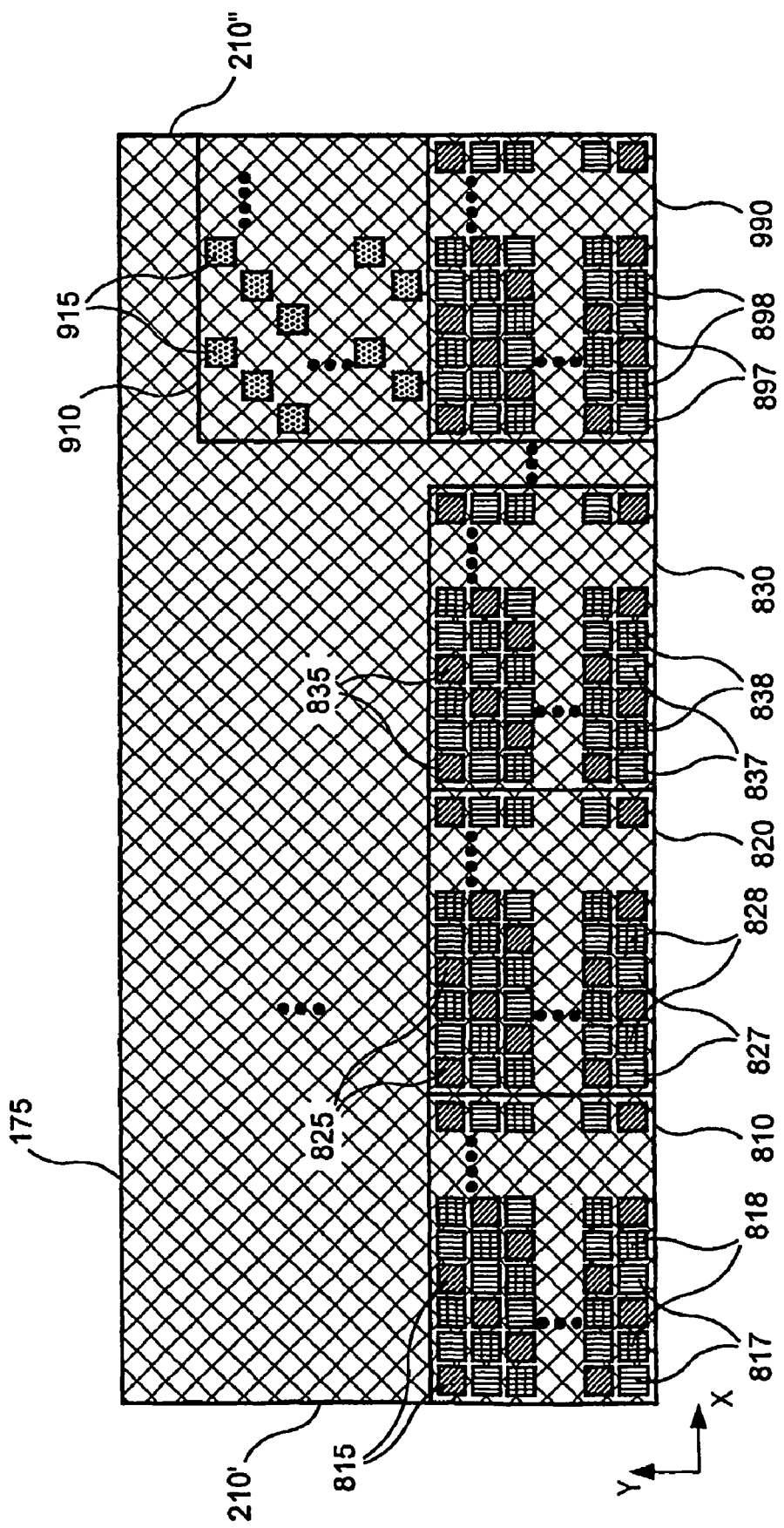
Figure 9G:
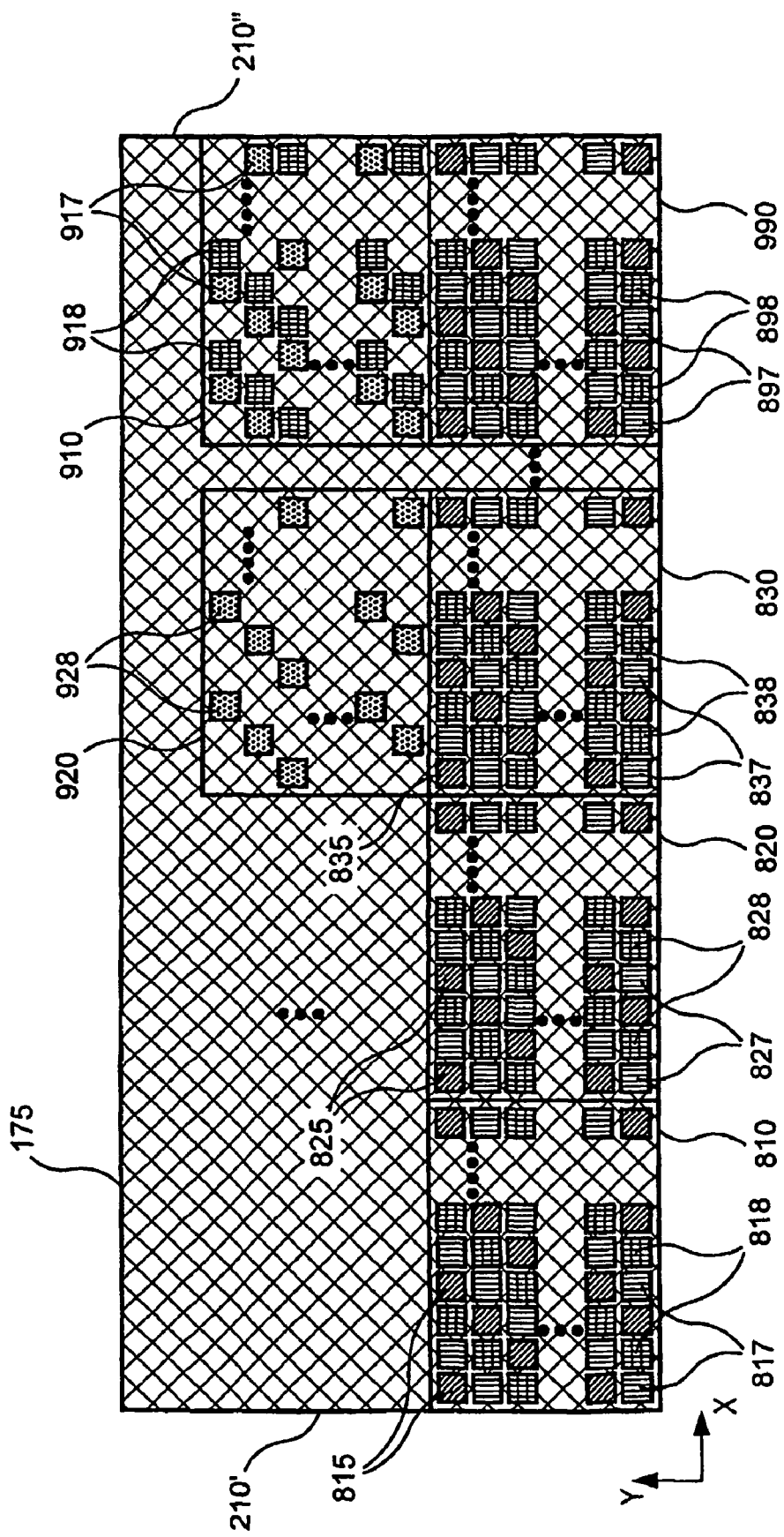
Figure 9H:
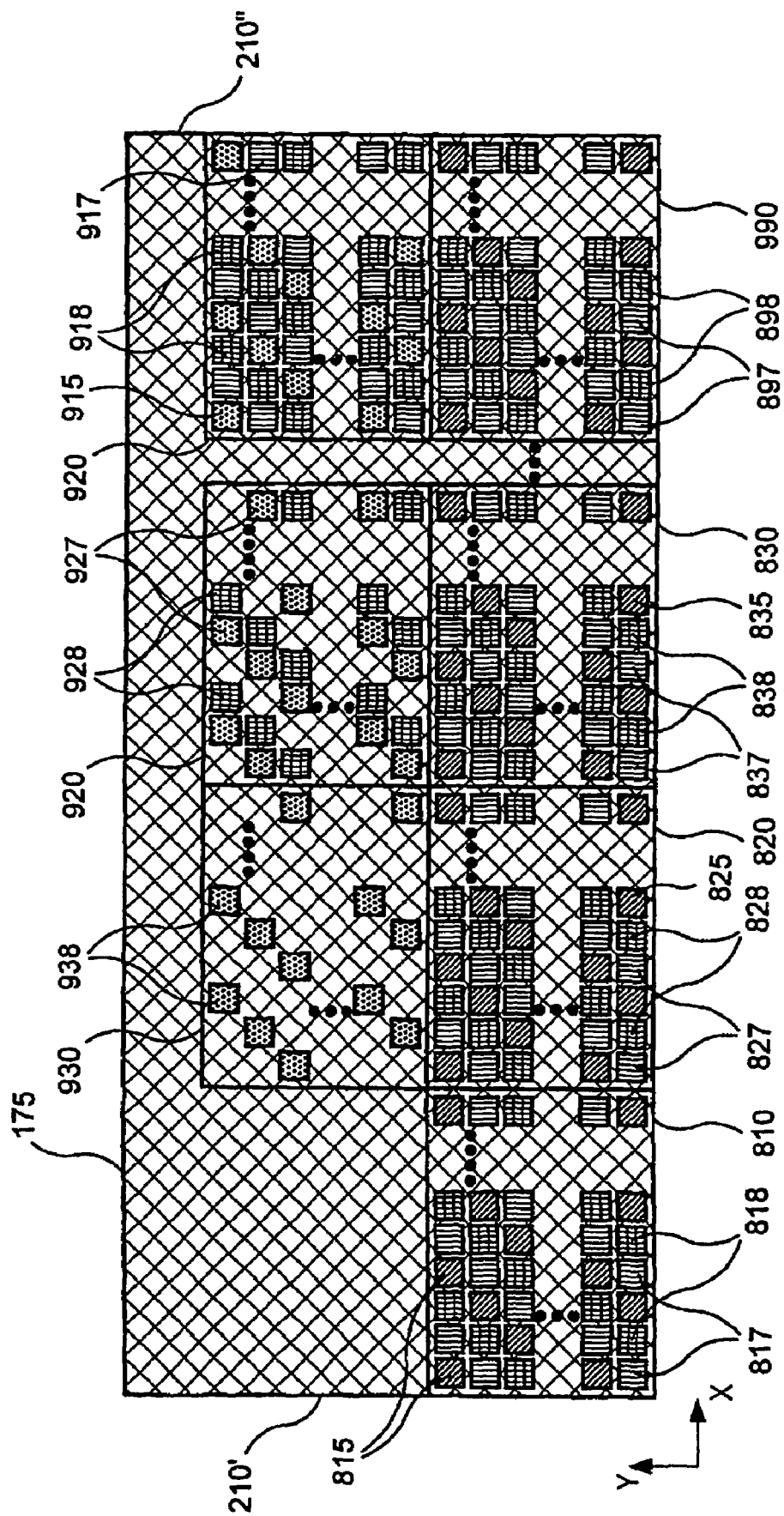

Then, when the second conceptual column 206 is started to be processed, the first one-third portion of the beam which impinges and irradiates first portions 915 of the first region 910 of this second conceptual column 206 of the semiconductor thin film 175 which were masked by the third section C' 730 of the mask 150' (see FIGS. 8F, 9F). Thus, FIGS. 8G, 8H, 9G, 9H show that the regions of the second conceptual column 206 of the semiconductor thin film 175 is irradiated by the beam pulses patterned by the mask 150', such that the third one-third portion of the masked beam pulse 164 leads the second one-third portion of the masked beam pulse 164, which then lead the third one-third portion of the masked beam pulse 164 in their irradiation of all of the regions of the second conceptual column 206 of the semiconductor thin film 175 according to the second embodiment of the present invention.

In this manner, all conceptual columns of the sample 170 can be properly irradiated by the beam pulses 164 that are patterned by the mask 150'. The translation and irradiation of the third conceptual column 207 is substantially the same as the irradiation of the first conceptual column 205, and shall not be described in further detail below.

Figure 10:
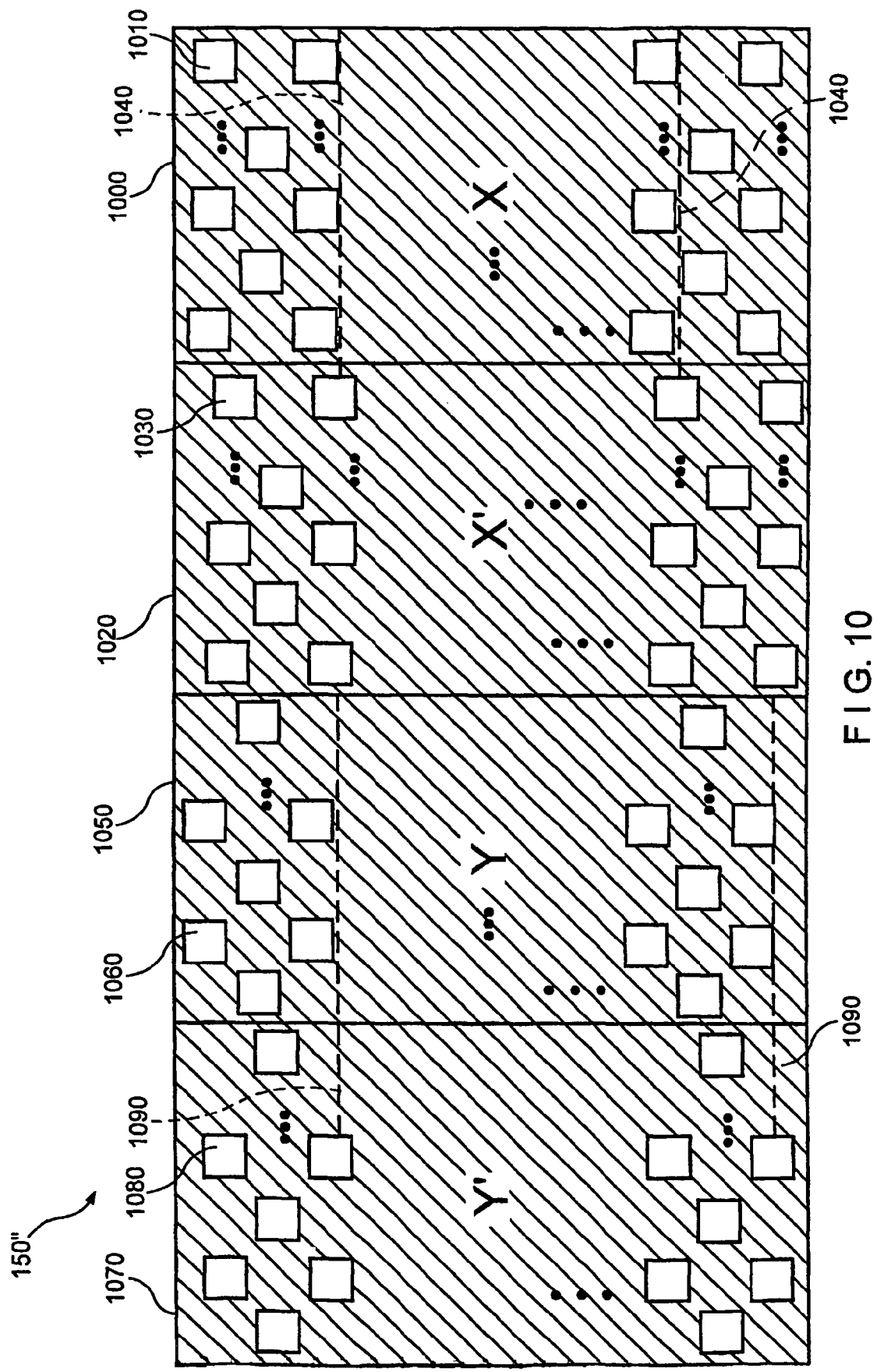
FIG. 10 is a top view of a third exemplary embodiment of a mask according to the present invention which is divided into four areas such that respective set of beamlets being patterned by the first and second areas are used to laterally grow grains in first irradiated sections of the irradiated, respective set of beamlets being patterned by the third and fourth areas are used to laterally grow grains in second irradiated sections of the irradiated region, and the first and second sections of the regions irradiated by the beamlets are dispersed throughout that region.

FIG. 10 shows a top view of a third exemplary embodiment of the mask 150" according to the present invention which is divided into four sections (i.e., the first top section 1000, a first bottom section 1020, a second top section 1050 and a second bottom section 1070). In particular, the respective set of beamlets being patterned by the slits 1010, 1030 of the first top and bottom sections 1000, 1020 are used to laterally grow grains in first irradiated portions of irradiated regions. The slits 1030 of the first bottom section 1020 are provided at an vertical offset 1040 from the slits 1010 of the first top section 1000. In addition, the respective set of beamlets being patterned by the slits 1060, 1080 of the second top and bottom sections 1050, 1170, respectively, are used to laterally grow grains in second irradiated portions of the same irradiated regions. The slits 1080 of the second bottom section 1070 are provided at an vertical offset 1090 from the slits 1060 of the second top section 1050. The first and second portions of these regions irradiated and laterally grown by the beamlets in this manner are dispersed throughout that region between one another. It is noted that using this exemplary third mask 150", the layout of the resulting crystallized portions of the semiconductor thin film 175 is substantially similar as that of the first exemplary embodiment of the mask 150 illustrated in FIG. 3. However, the first portions 415, 425, etc. and the second portions 418, 428, etc. of the regions 410, 420, etc. in the semiconductor thin film 175 of FIGS. 5A-5H are somewhat smaller than the first and second portions in the regions of the semiconductor thin film 175 as shall be described herein below with reference to FIGS. 11A-11H and 12A-12F according to the third exemplary embodiment of the present invention. This is because the first and second portions of the semiconductor thin film 164 that are crystallized using the third exemplary embodiment of the process according to the present invention undergo lateral grain growth as provided in further detail below.

Figure 11A:
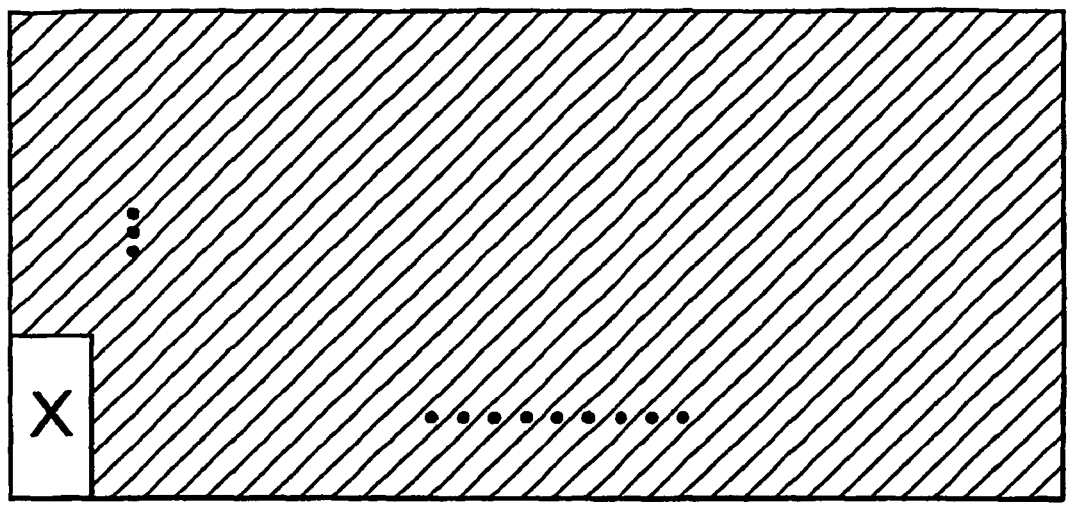
FIGS. 11A-11H are sequential movements of the semiconductor film of a sample with respect to the pulsed beam as the beam pulse is patterned by the mask of FIG. 10 according to an exemplary embodiment of the present invention so as to promote a sequential lateral solidification ("SLS") of grains in certain areas of the same region of the semiconductor thin film.
Figure 12A:
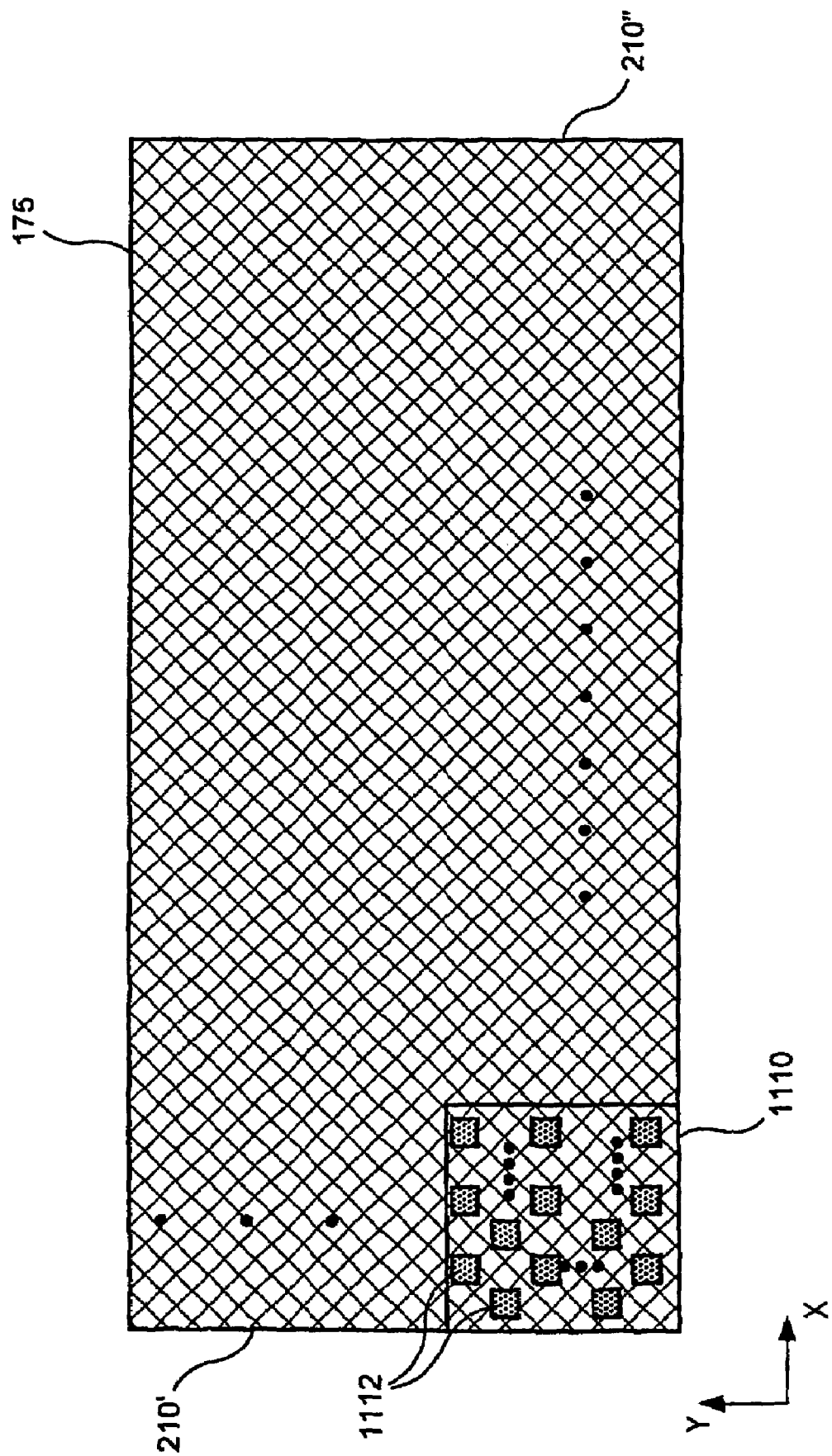
FIGS. 12A-12F are irradiations, by the radiation beam pulse which is masked by the mask of FIG. 10 (which correspond to the movements of the sample illustrated in FIGS. 11A-11H), and then re-solidifications and crystallizations of the particular portions of the semiconductor film provided on the sample at exemplary sequential stages of the processing according to the process of the present invention based on SLS principles.

As shown in FIGS. 11A and 12A, the masked beam pulse 164 patterned by the first top section X 1000 of the mask 150" so as to impinge and irradiate a first region 810 on the first conceptual column 205 of the semiconductor thin film sample 170, while the masked beam pulse 164 patterned by the first bottom section X' 1030, the second top section Y 1050, and the second bottom section Y' 1070 of the mask 150" irradiate an area away from the edge 210' of the semiconductor thin film 170. Therefore, as shown in FIGS. 11A and 12A, the first region 1110 of the semiconductor thin film is irradiated only by the beam pulse 164 masked by the first top section X 1000 of the mask 150". As shown in FIG. 12A, the irradiated first region 1110 is initially composed of irradiated first portions 1112 which are provided at a distance from one another, and substantially match the positions and orientations of the slits 1010 of the first top section X 1000 of the mask 150". As with the first embodiment shown in FIGS. 4A-4H and 5A-5H, the irradiated first portions 1112 of the first region 1110 are provided such that the portions between these irradiated first portions 1112 can be irradiated with another beam pulse (e.g., a later-applied masked beam pulse).

Figure 11B:
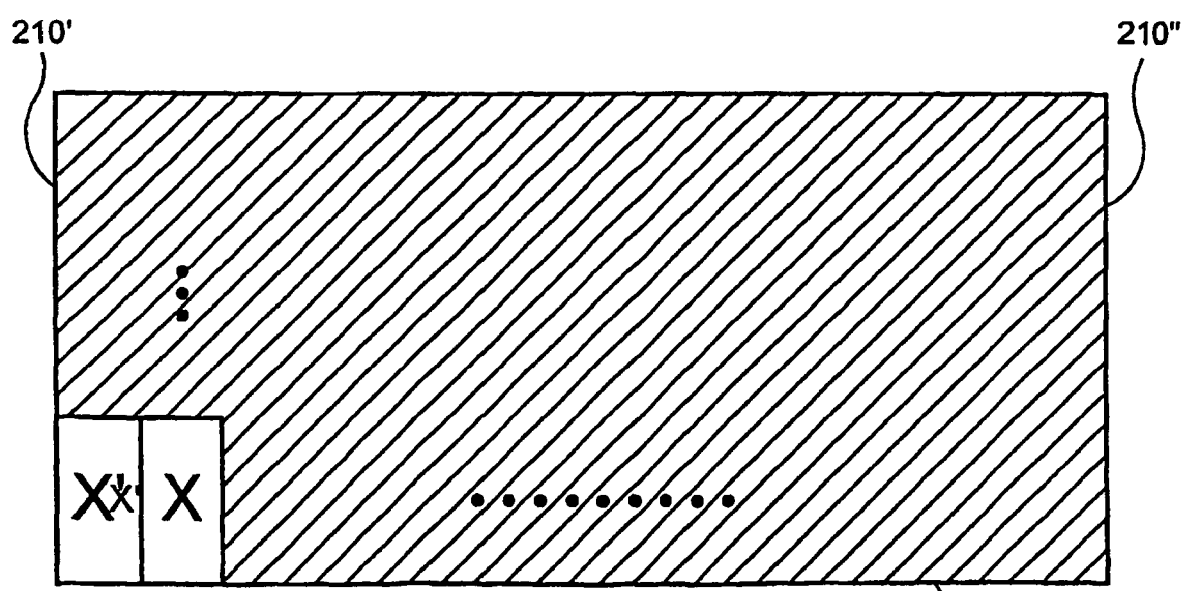
Figure 12B:
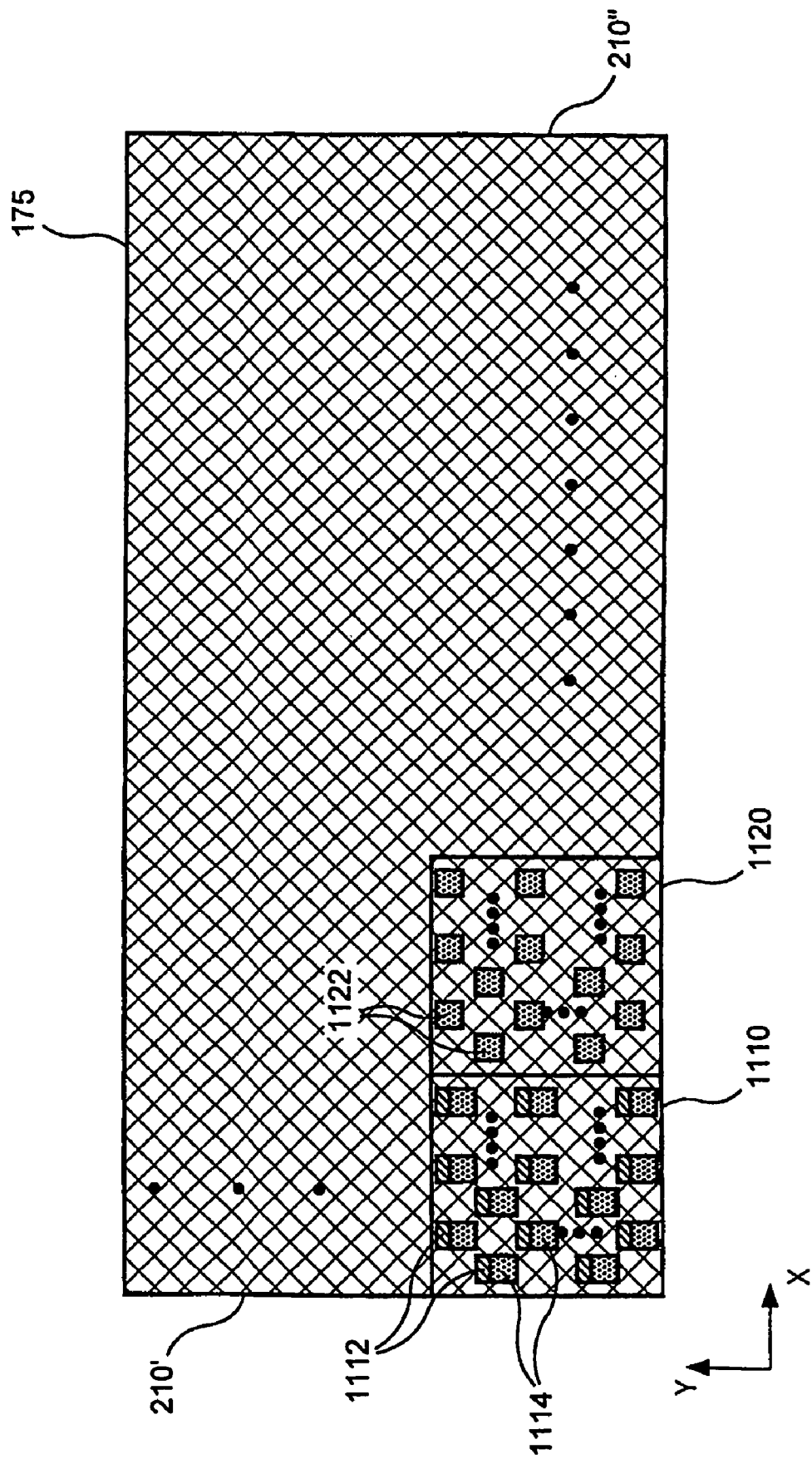

Thereafter, as shown in FIGS. 11B and 12B, the sample 170 is continued to be translated in the −X direction relative to the masked beam pulse 164, and the beam pulse is masked by the first top section X 1000 and the first bottom section X' 1020 of the mask 150" such that the first one-fourth portion of the beam pulse 164 (i.e., patterned by the first top section X 1000) irradiates a second region 1120 on the conceptual first column 205 of the semiconductor thin film 175, and the second one-fourth portion of the masked beam pulse 164 (i.e., patterned by the first bottom section X' 1020) irradiates the first region 1110. The second top and bottom one-fourth portions of the masked beam pulse 164 which are patterned by the second top section Y 1050 and the second bottom section Y' 1070 of the mask 150', respectively. is irradiated away from the semiconductor thin film 175 (i.e., outside of the edge 210'). First areas 1122 of the second region 1120 are irradiated and situated in a substantially the same manner as the first areas 1112 of the first region 1110.

It should be noted that prior to the irradiation of the first region 1110 by the second one-fourth portion of the masked beam pulse 164 which is patterned by the first bottom section X' 1020, the first portions 1112 which were irradiated by the previous beam pulse (as shown in FIG. 12A) are allowed to solidify and crystallize. With respect to the irradiation of the first area 1110 by the second one-fourth portion of the masked beam pulse 164 (i.e., patterned by the first bottom section X' 1020), this second one-fourth portion irradiates second portions 1114 in the first region 1110 such that the second irradiated portions 1114 overlap an area of the first crystallized portions 1112 of the first region 1110. The second portions 1114 are preferably provided at a vertical offset from the first crystallized portions 1112 of the first region substantially corresponding to the offset 1040 between the slits 1010 of the first top section X 1000 and the slits 1030 of the first bottom section X' 1020. In this manner, the grains provided in the first crystallized portions 1112 would likely grow into the second portions 1114 which overlap them upon cooling and crystallization thereof. In this manner, it is possible to increase the grains size in the first portions 1112 so that the grains therein grow into the second crystallizing portion. Such processing utilizes the principles of the sequentially lateral solidification ("SLS") techniques as described in further detail in the '535 application. In the preferred embodiment of the present invention, the grain growth is even further promoted is the intensity of the masked beam pulse 164 is high enough to at least partially melt the first and second portions 1112, 1114 of the first region 1110 throughout their thickness.

Figure 11C:
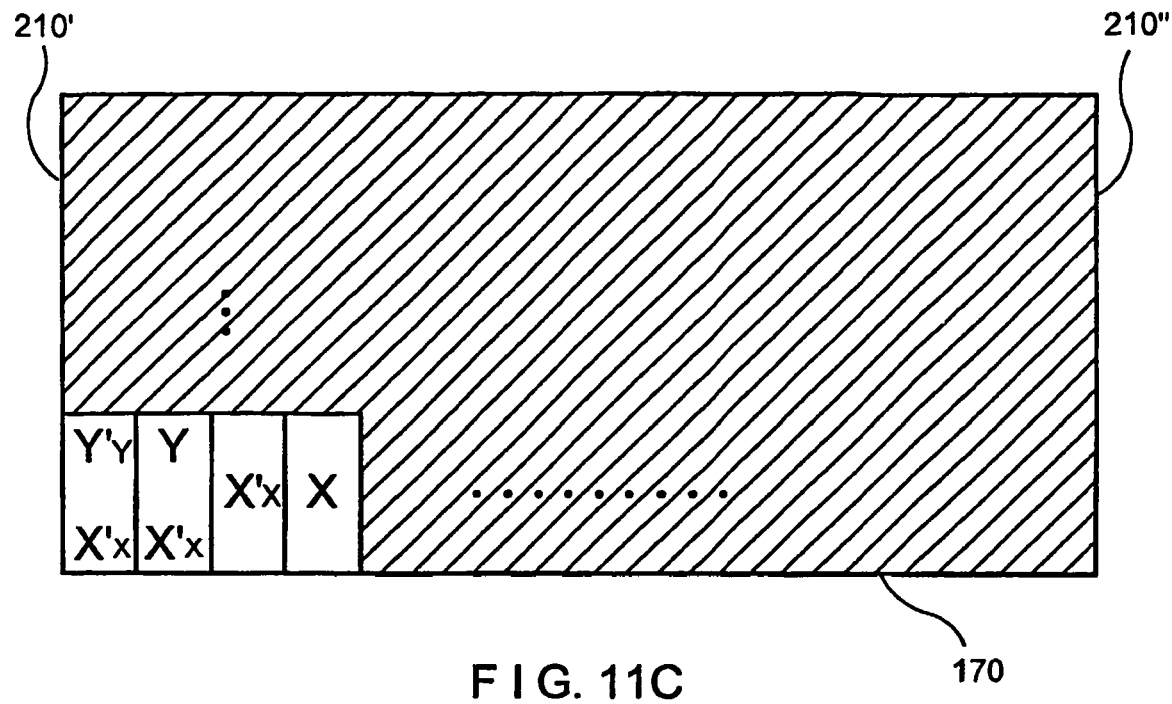
Figure 12C:
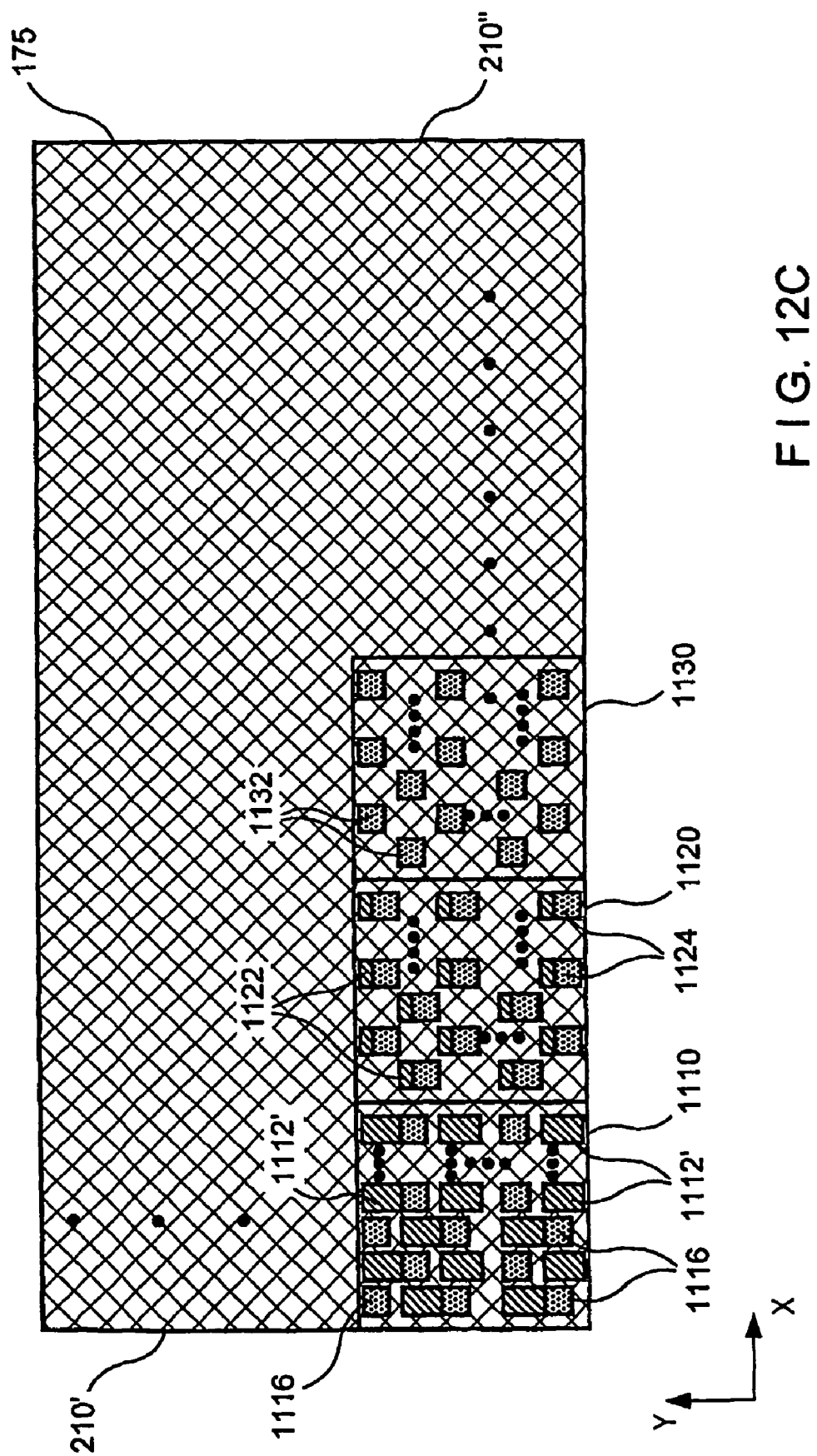

Thereafter, as shown in FIGS. 11C and 12C, the sample 170 is continued to be translated in the −X direction relative to the masked beam pulse 164, and the beam pulse is masked by the first top and bottom sections 1000, 1020 and the second top and bottom sections 1050, 1070 of the mask 150" such that the first one-fourth portion of the beam pulse 164 (i.e., patterned by the first top section X 1000) irradiates a third region 1130 on the first conceptual column 205 of the semiconductor thin film 175, the second one-fourth portion of the masked beam pulse 164 (i.e., patterned by the first bottom section X' 1020) irradiates the second region 1120, and the third one-fourth portion of the masked beam pulse 164 (i.e., patterned by the second top section Y' 1050) irradiates the first region 1110. The fourth one-fourth portion of the masked beam pulse 164 which is patterned by the second bottom section Y' 1070 of the mask 150" is irradiated away from the semiconductor thin film 175 (i.e., outside of the edge 210'). Thus, first areas 1135 of the third region 1130 are irradiated and situated in a substantially the same manner as the first areas 1122 of the second region 1120. It should again be noted that prior to the irradiation of the second region 1120 by the second one-fourth portion of the masked beam pulse 164 which is patterned by the first bottom section X' 1020, the first portions 1122 which were irradiated by the previous beam pulse (as shown in FIG. 12B) are allowed to solidify and crystallize, and then the second portions 1124 overlap an area of the first crystallized portions 1122 of the second region 1120, and the lateral growth of the grains from the first portions 1122 into the irradiated and crystallizing second portions 1124 in a substantially similar manner as described above with reference to the first and second portions 1112, 1114 of the first region 1110 of the semiconductor thin film 175.

In addition, third portions 1116 of the first region 1110 which were irradiated by the third one-third portion of the beam pulse 164 masked by the second top section Y 1050 of the mask 150" are interposed between the first crystallized laterally-grown portions 1112' (created due to the lateral growth of the grains from the first portions 1112 into the second irradiated portions 1114 which overlap the first portions 1112). The third portions 1116 are interposed between the first laterally-grown portions 1112' of the first region 1110.

Figure 11D:
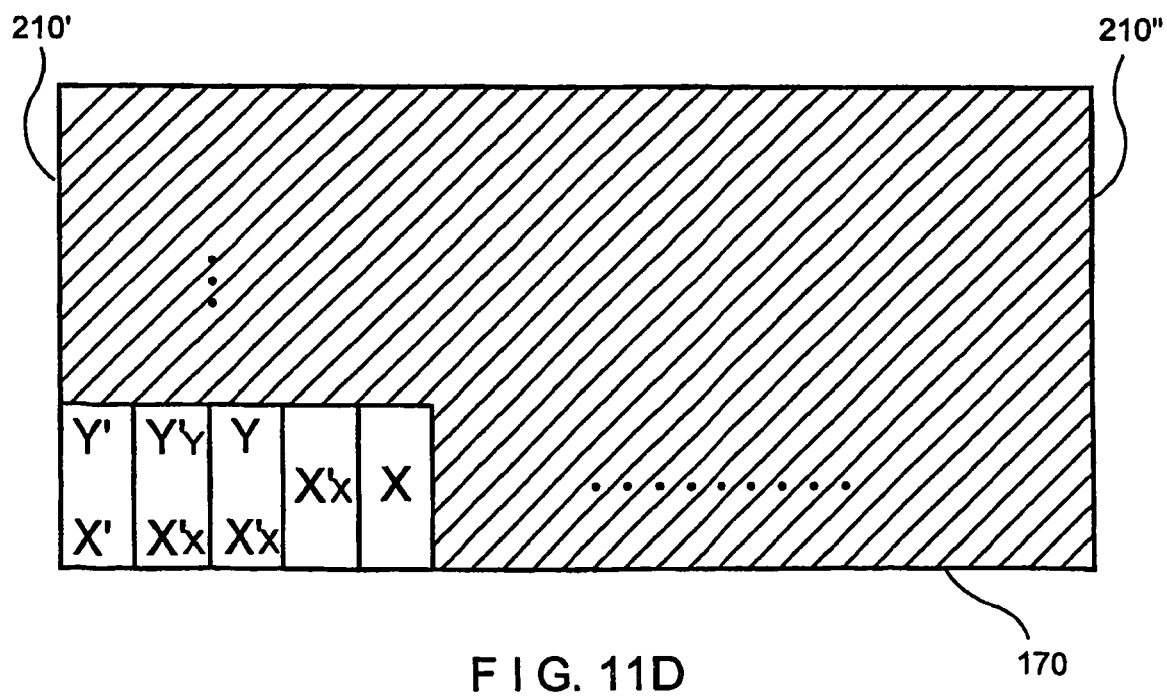
Figure 11E:
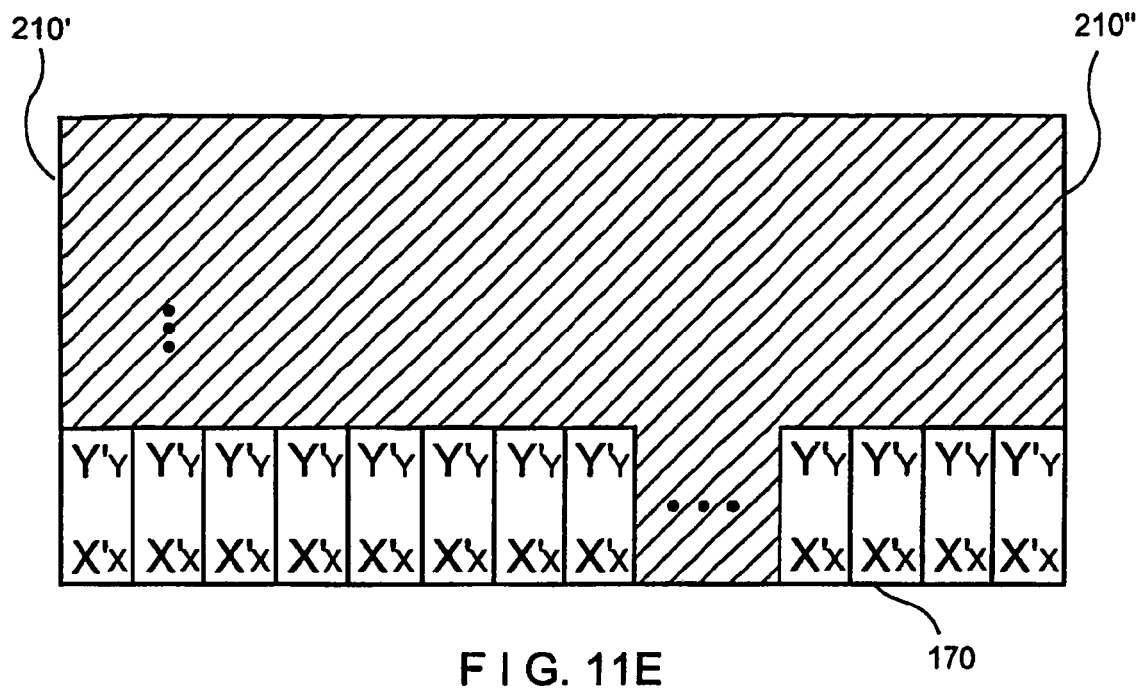
Figure 12D:
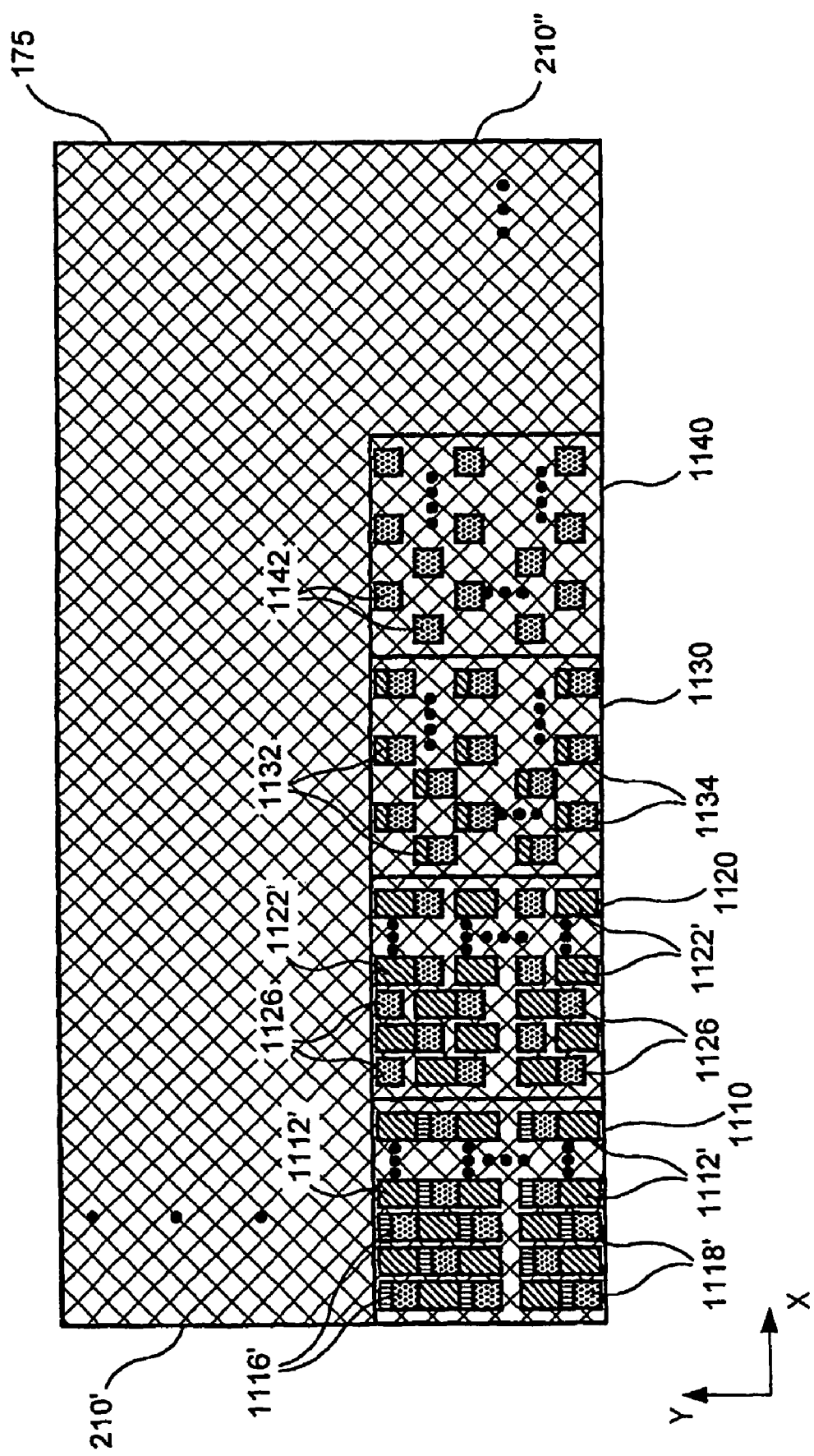
Figure 12E:
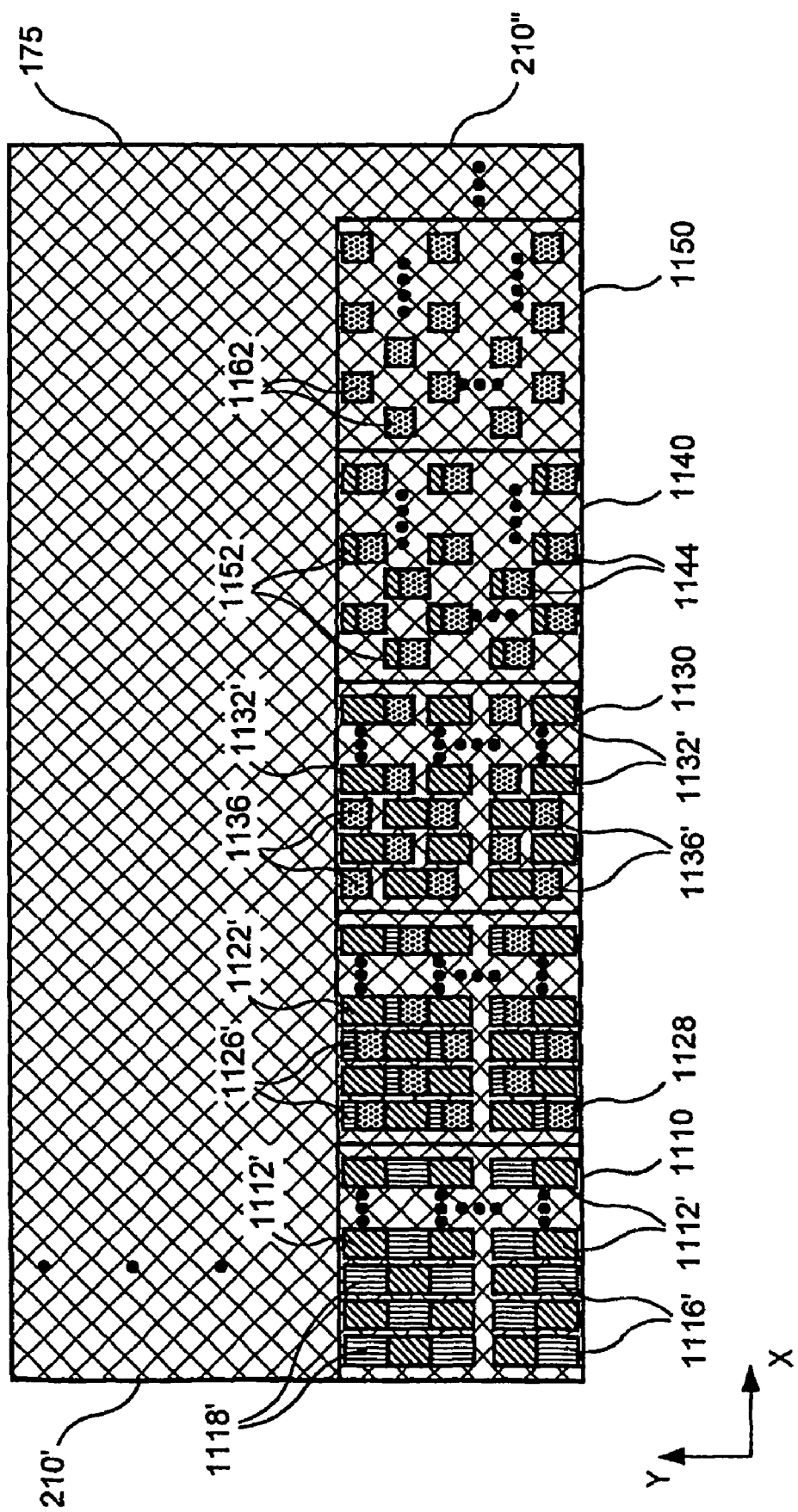

Further, as shown in FIGS. 11D and 12D, the sample 170 is continued to be translated in the −X direction relative to the masked beam pulse 164, and the beam pulse is patterned by the all sections 1000, 1020, 1050, 1070 of the mask 150" such that the first one-fourth portion of the beam pulse 164 (i.e., patterned by the first top section X 1000) irradiates a fourth region 1140 on the first conceptual column 205 of the semiconductor thin film 175, the second one-fourth portion of the masked beam pulse 164 (i.e., patterned by the first bottom section X' 1020) irradiates the third region 1130, the third one-fourth portion of the masked beam pulse 164 (i.e., patterned by the second top section Y 1050) irradiates the second region 1120, and the fourth one-fourth portion of the masked beam pulse 164 (i.e., patterned by the second bottom section X' 1070) irradiates the first region 1110. The first areas 1142 of the fourth region 1140 are irradiated and situated in a substantially the same manner as the first areas 1132 of the third region 1130, and the third areas 1126 of the second region 1120 are irradiated and situated in a substantially the same manner as the third areas 1116 of the first region 1110. Similarly to the description of the lateral growth prompted by the overlapping of the second irradiated portion 1114 over the first crystallized portion 1112 of the first region 1110, the fourth one-fourth portion of the beam pulse 164 masked by the second bottom section Y' 1070 of the mask 150" irradiates fourth portions 1118 in the first region 1110 such that the fourth irradiated portions 1118 overlap an area of the third crystallized portions 1116 of the first region 1110. The second portions 1118 are preferably provided at a vertical offset from the first crystallized portions 1116 of the first region 1110 substantially corresponding to the offset 1090 between the slits 1060 of the second top section Y 1050 and the slits 1080 of the second bottom section Y' 1070. In this manner, the grains provided in the third crystallized portions 1116 would likely grow into the fourth portions 1118 which overlap them upon cooling and crystallization thereof to form third crystallized laterally-grown portions 1116'. FIGS. 11E and 12E illustrate that upon the translation of the sample 170 in the −X direction, and irradiating the first conceptual row 205 of the semiconductor thin film 175 by the fourth sequential masked beam pulse 164, the first region 1110 has all portions thereof irradiated, laterally grown and crystallized.

Figure 11F:
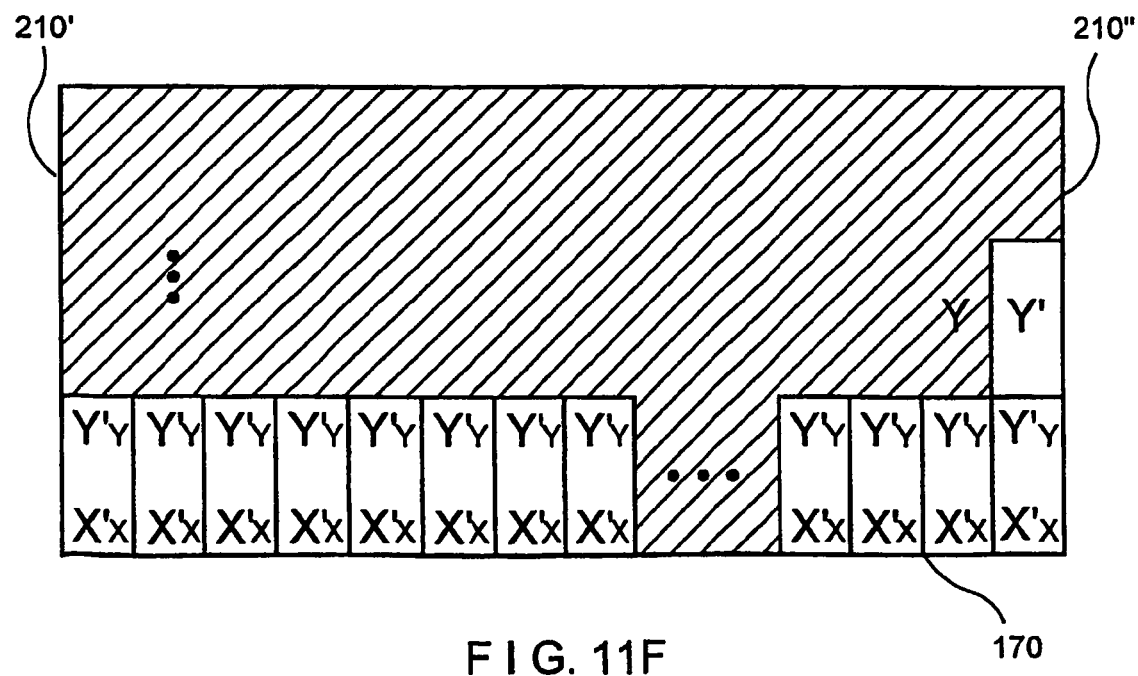
Figure 11G:
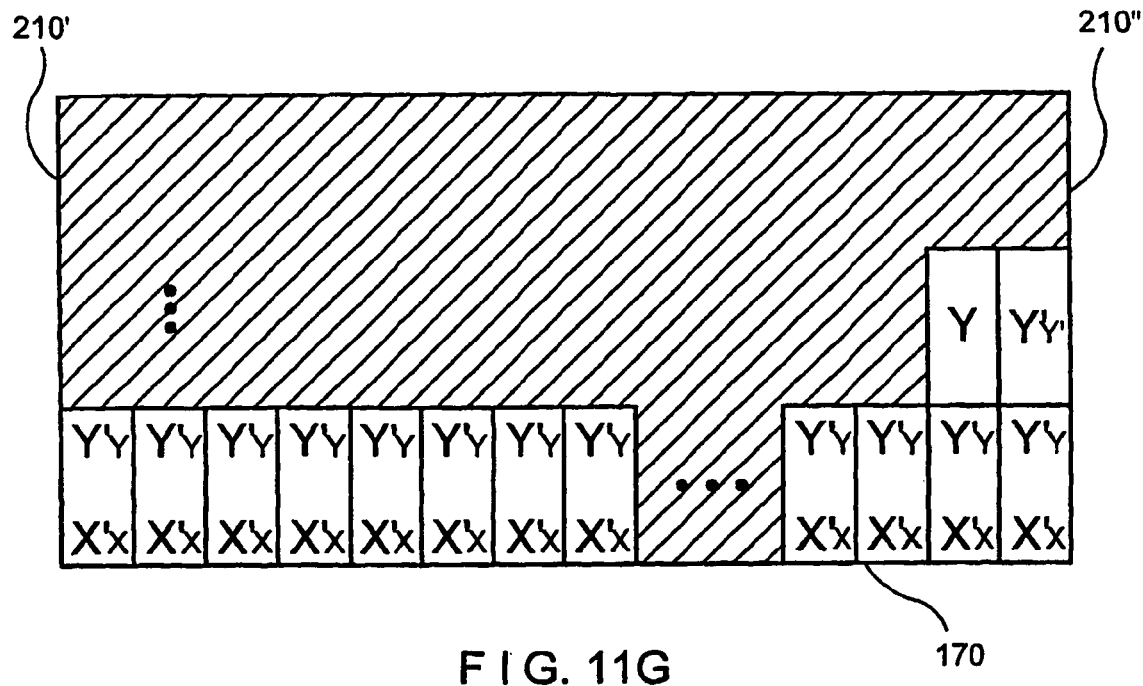
Figure 11H:
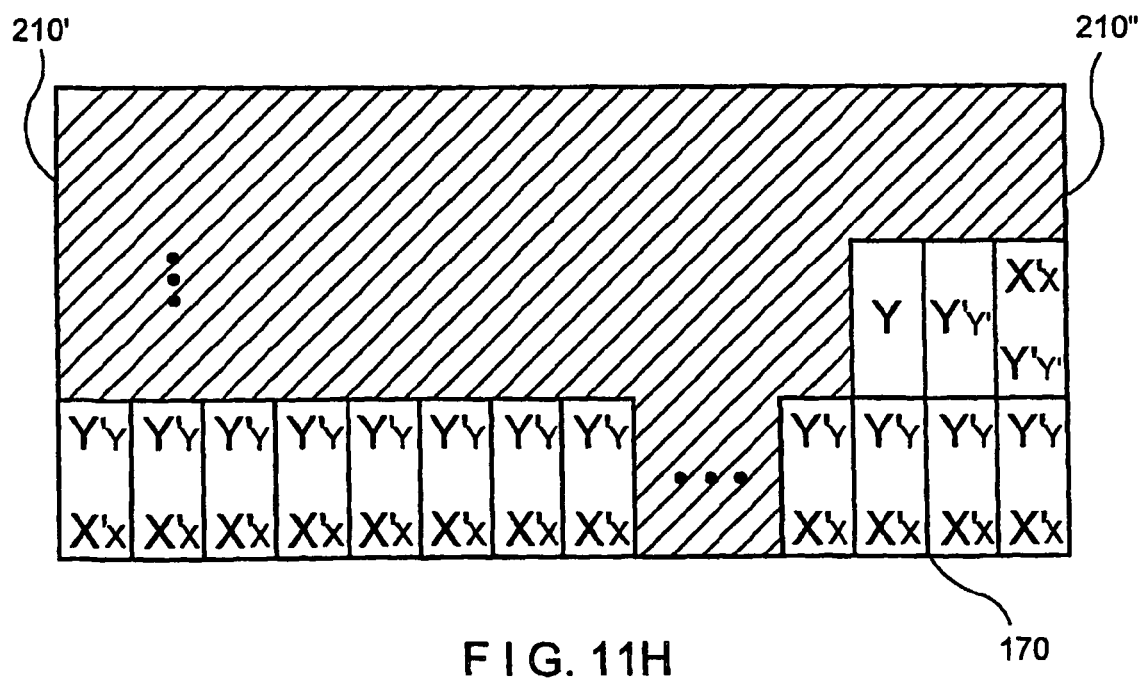
Figure 12F:
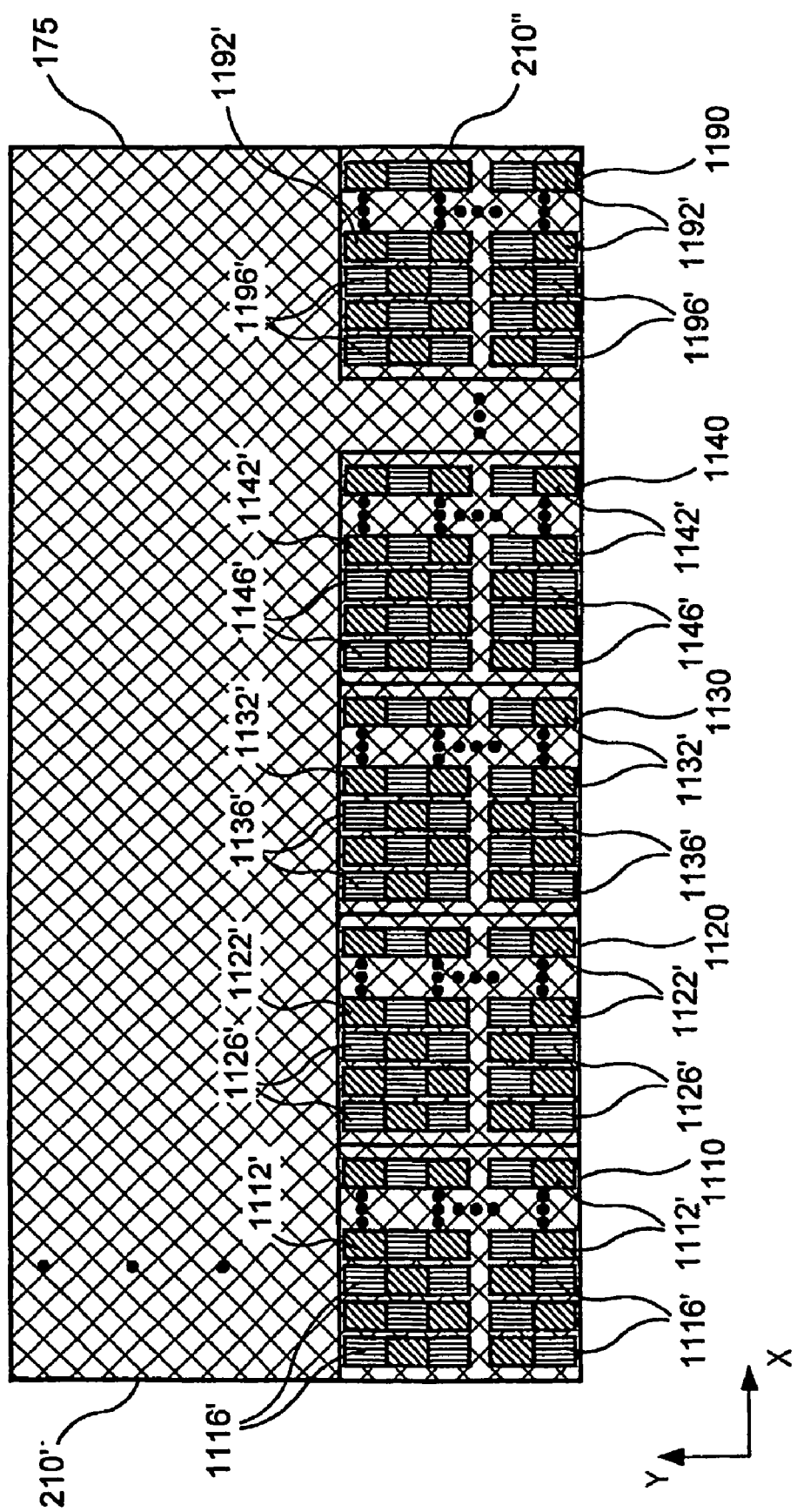

This procedure is repeated in the same manner for the entire first conceptual column 205 of the semiconductor thin film 175 until all regions thereof are irradiated and crystallized substantially in the same manner as provided above for with reference to the first region 810 of the semiconductor thin film 175, and as shown in FIGS. 11F, 12F. The conceptual columns 206, 207, . . . can be irradiated, laterally-grown and crystallized in the same manner, except that when the sample is translated in the +X direction, the first one-fourth portion of the beam pulse 164 is masked by the second bottom section Y' 1070 of the mask 150", followed by the second one-fourth portion of the beam pulse masked by the second top section Y 1050 of the mask 150", then followed by third one-fourth portion of the beam pulse masked by the first bottom section X 1020, and finally by the fourth one-fourth portion of the beam pulse masked by the first top section Y 1000 of the mask 150".

It should be understood that for all exemplary embodiments of the process according to the present invention, the number of pulses irradiating and interposing irradiated arias between previously crystallized areas can be more than four such irradiations for the same regions of the semiconductor thin film 164 as described herein above. In addition, the lateral grain growth can be promoted by more than one portion offset from and overlapping the previously crystallized portions of the regions so as to promote a longer grain growth. Furthermore, it is possible to re-irradiate the portions of the previously irradiated portions by irradiating these already crystallized areas with corresponding portions of later beam pulses. Indeed, the processes according to the present invention allow the previously crystallized portions of the regions of the semiconductor thin film 175 to be re-irradiated and re-crystallized.

Figure 13:
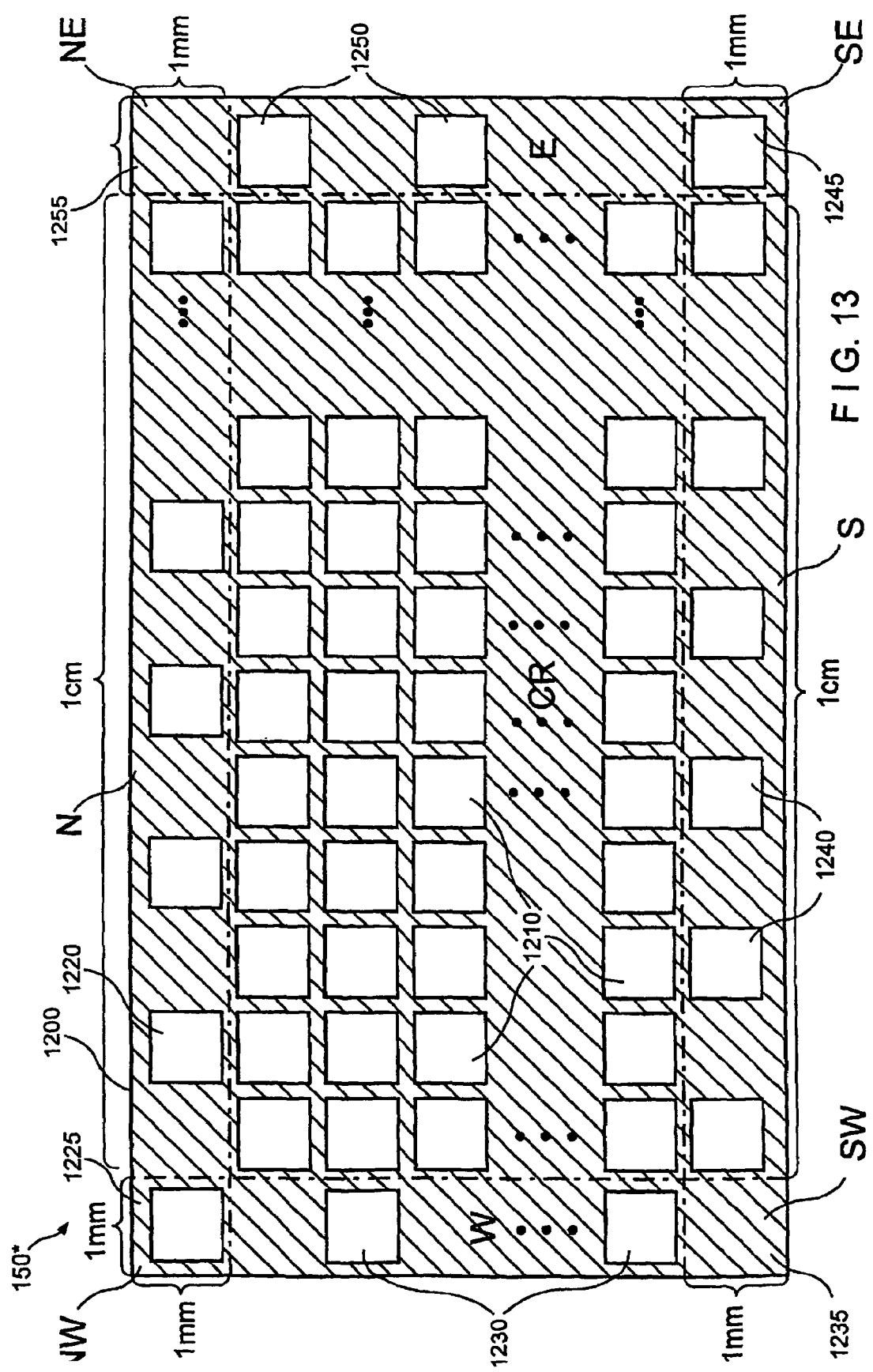
FIG. 13 is a top view of a fourth exemplary embodiment of a mask according to the present invention which is divided into a center area and border areas such that respective set of beamlets being patterned by the border areas irradiate a region so that they are interposed between the sections of the region irradiated by the beamlets patterned by the next sequential beam pulse irradiating the adjacent region, and the border sections of the neighboring regions irradiated by the beamlets of later beam pulses are dispersed throughout that border sections.

FIG. 10 shows a FIG. 13 is a top view of a fourth exemplary embodiment of the mask 150* according to the present invention which is divided a center region section CR, an east edge section E, a south edge section S, a west edge section W and a north edge section N. In addition, at the corner edge portions thereof, the mask 150* includes a south east edge section SE, a south west edge section SW, a north west edge section NW and a north east edge section NE. The center region section CR includes a set of slits 1210 which can be provided substantially close to one another. The edge sections of the mask 150* each have their respective slits. While the illustration of the edge sections of the mask 150* provided in FIG. 13 may show one slit therein (or even no slits), its should be understood that the edge regions mat have more or less of the slits than shown in FIG. 13. In particular, the east edge section E has slits 1250, the south east edge section has at least one slit 1245, the south edge region S has slits 1240, the south west edge section SW may have no slits or at least one slit 1235, the west edge section W has slits 1230, the north west edge section NW includes at least one slit 1225, the north edge section N has slits 1220 and the north east edge section NE SW may have no slits or at least one slit 1255. each of the edge sections of the masked can have a width of approximately 1 mm, and the width and length of the center regions section CR can be 1 cm×1 cm. Accordingly, the east, south, west and north edge sections can be sized 1 cm×1 mm, while the corner edge sections may be sized 1 mm×1 mm.

The border sections of the mask 150* are provided such that respective set of beamlets being patterned thereby irradiate an edge area of a region of the semiconductor thin film 175 so that they are later interposed between the edge areas of this region such that this edge area is irradiated by the beamlets of another (e.g., next sequential) beam pulse masked by the same mask 150* as well as the adjacent region of such previously irradiated and now crystallized region. In this manner, the border areas of the neighboring regions irradiated by the beamlets of later beam pulses are dispersed throughout that border areas between the adjacent regions of the semiconductor thin film 175. The details of such positioning and irradiation are provided below.

Figure 14A:
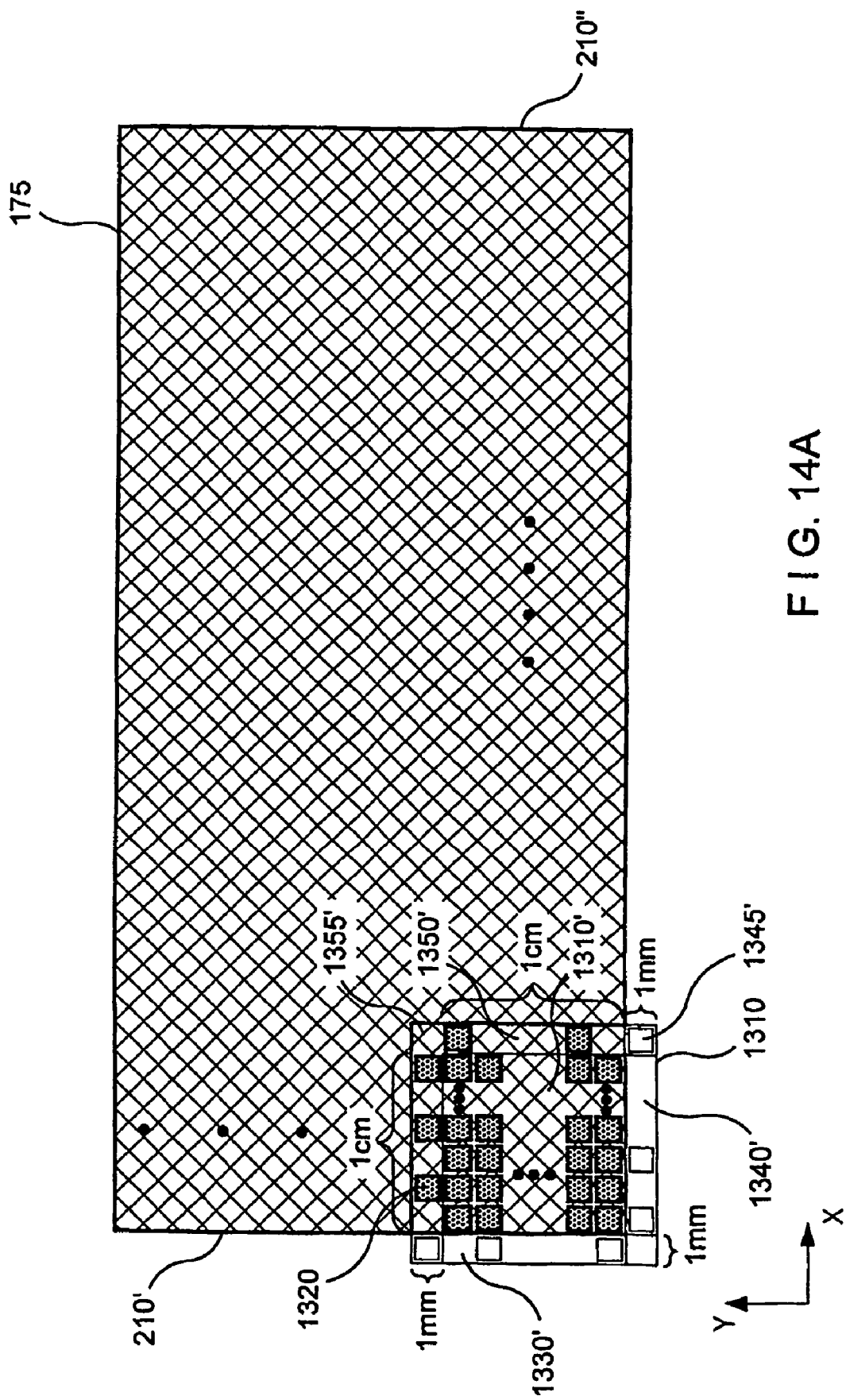
FIGS. 14A-14D are irradiations, by the radiation beam pulse which is masked by the mask of FIG. 13, and then re-solidifications and crystallizations of the particular portions of the semiconductor film provided on the sample at exemplary sequential stages of the processing according to the process of the present invention.

FIGS. 14A-14D show irradiations, by the radiation beam pulse which is masked by the mask 150* of FIG. 13, and then re-solidifications and crystallizations of the particular portions of the semiconductor film provided on the sample at exemplary sequential stages of the processing according to the process of the present invention. As shown in FIG. 14A, the masked beam pulse 164 patterned by the center region section CR, as well as by the north and east edge sections N, E (and the corner north west edge section NE there between) of the mask 150* so as to impinge and irradiate a first region 1310 on the first conceptual column 205 of the semiconductor thin film sample 170. Therefore, as shown in FIG. 14A, the first region 1310 of the semiconductor thin film is irradiated only by the beamlets of the masked beam pulse 164 corresponding to the slits 1210, 1220, 1250, 1255 of these center region section CR and edge sections of the mask 150*. The masked beam pulse 164 patterned by the south edge section S, the west edge section W, the south east edge section SE, the north west edge section NW and the south west edge section SW of the mask 150* irradiate an area away from the edge of the semiconductor thin film 170. As shown in FIG. 12A, the irradiated first region 1310 of the semiconductor thin film 164 is initially composed of irradiated first areas 1310', 1320', 1350', 1355'which have been irradiated and preferably completely (and at least partially) melted by the beamlets generated by the slits 1210, 1220, 1250, 1255 of the mask 150*. At the edge areas 1320', 1355' and 1350' of the first region 1310, the irradiated portions are provided at a distance from one another, and substantially match the positions and orientations of the slits 1220, 1255 and 1250 of the mask 150*, respectively. The irradiated first portions in the areas 13320', 1355', 1350' of the first region 1310 are provided such that the portions between these irradiated portions can be irradiated with another beam pulse (e.g., a later-applied masked beam pulse) in the unirradiated areas thereof so that the irradiation portions in these border regions by two distinct beam pulses can be dispersed throughout such border regions.

Figure 14B:
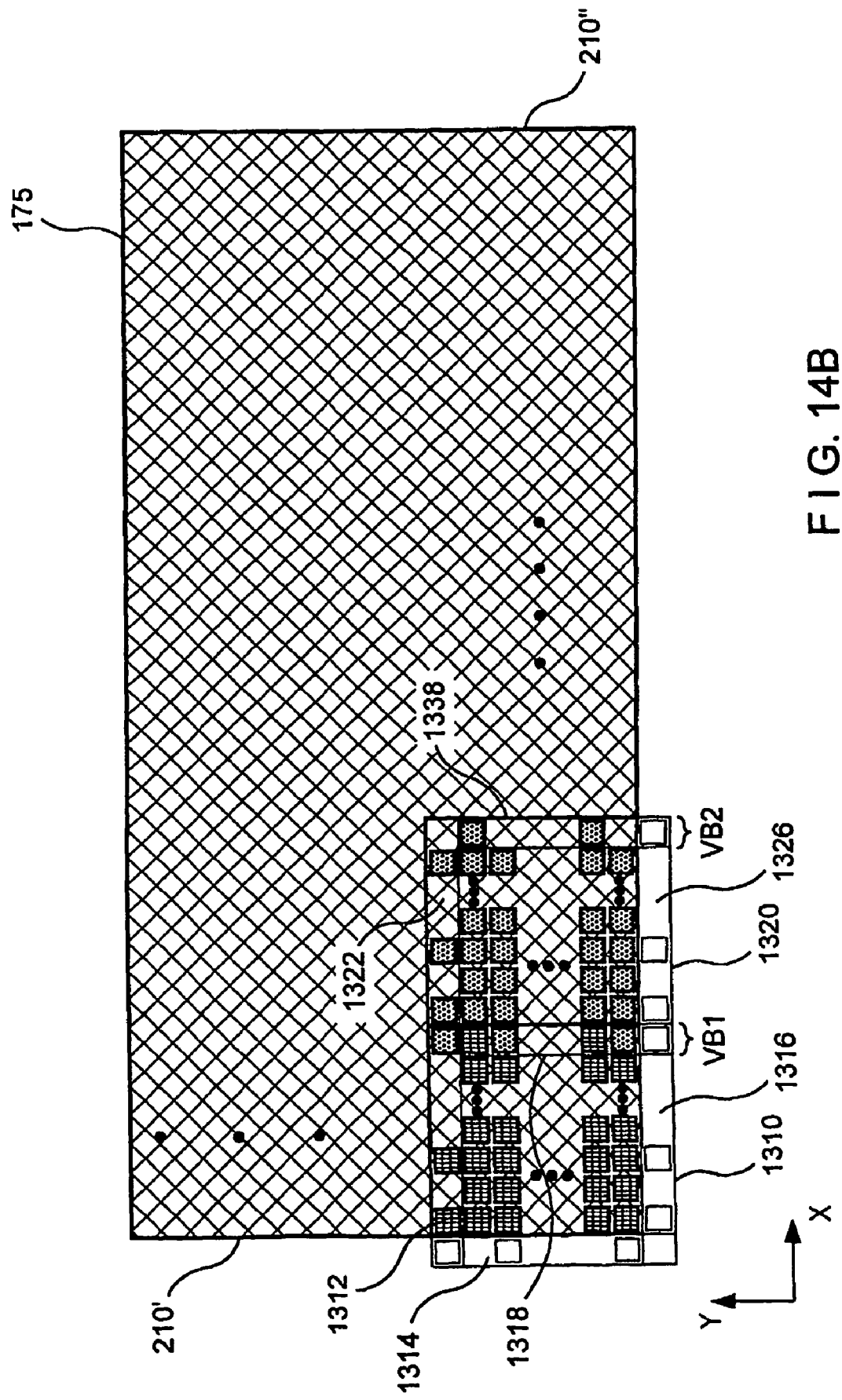

Thereafter, as shown in FIG. 14B, the sample 170 is continued to be translated in the −X direction relative to the masked beam pulse 164, and the beam pulse is masked again by the mask 150*. In the meantime, the irradiated portions of the first region 1310 solidify and crystallize. In this relative position of the sample 170 with respect to the direction of the irradiation of the masked beam pulse 164, the masked beam pulse 164 irradiates a second region 1320 on the first conceptual column 205 of the semiconductor thin film 175. The west border area of the second region 1320 overlaps the east border region VB1 of the first region 1310 composed of the areas 1350', 1355'. In particular, the beam pulse 164 is masked by the west edge section W and the north west edge section NW of the mask 150* such that the beamlets of the masked beam pulses 164 produced by such edge sections of the mask 150* irradiate the unirradiated portions on the border region VB1 that are dispersed between the crystallized portions 1350', 1355' previously irradiated by the masked beam pulse 164 for the first region's 1310 irradiation and then crystallization. Similarly to the irradiation of the first regions 1310, the portions of the masked beam pulse 164 intended for the second region 1320 patterned by the south edge section S, the south west edge section SW and the south east edge section SE of the mask 150* irradiate an area away from the edge of the semiconductor thin film 170 and do not irradiate any portion of the second region 1320.

Figure 14C:
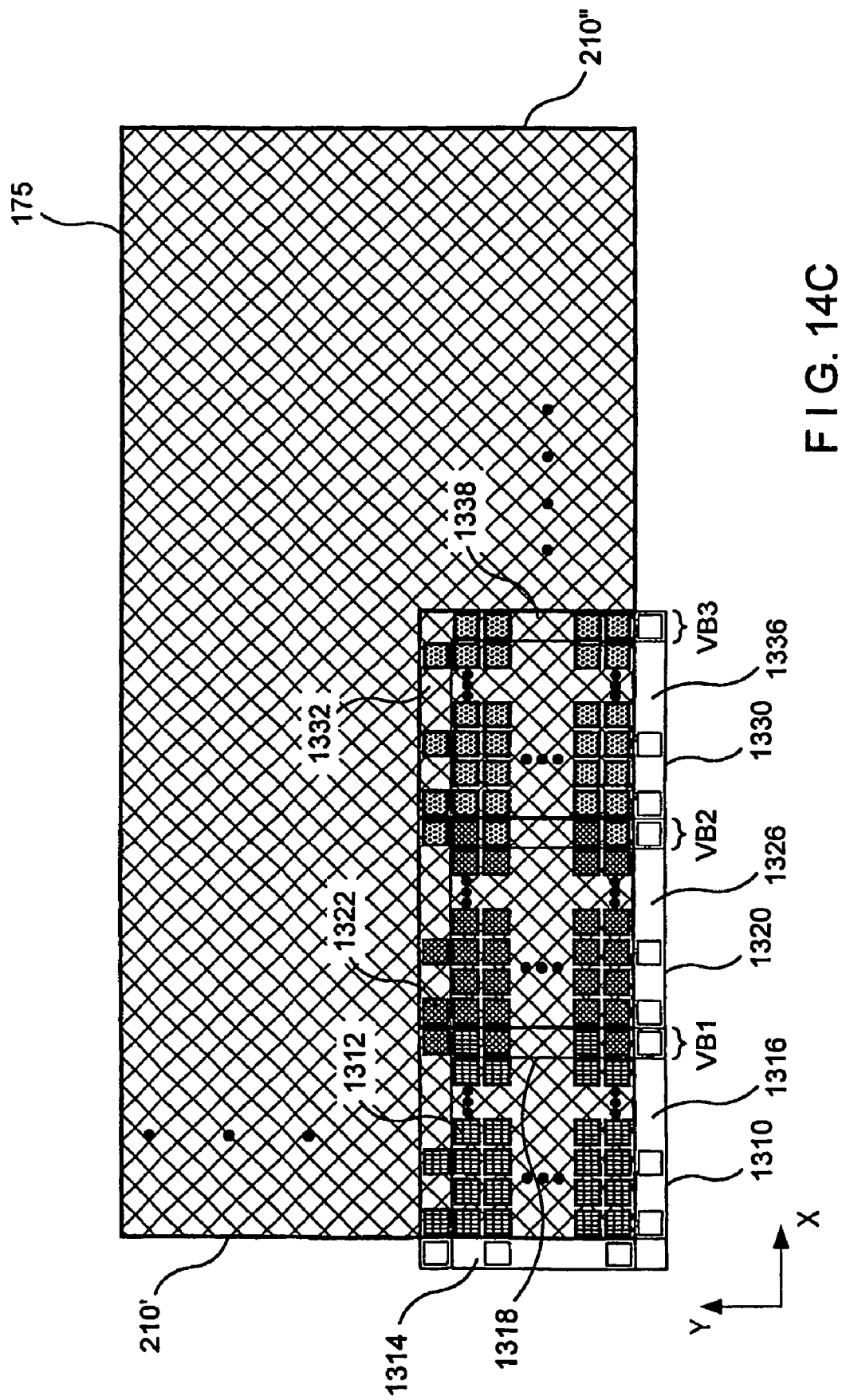

Thereafter, as shown in FIG. 14C, the sample 170 is continued to be translated in the −X direction relative to the masked beam pulse 164 to irradiate a third region 1330 of the semiconductor thin film 164 (which is adjacent to the second region 1320), and the beam pulse is masked by the mask 150* to generate the beamlet pattern which is substantially the same as the beamlet pattern generated during the irradiation of the second region 1320. Before the irradiation of the third region 1330, the irradiated portions of the second region 1320 solidify and crystallize. Thereafter, the masked beam pulse 164 irradiates the third region 1330 on the first conceptual column 205 of the semiconductor thin film 175. Similarly to the description above with reference to the irradiation of the border region VB1 of the first region 1310, the west border area of the third region 1330 overlaps the east border region VB2 of the second region 1320. Again, the beam pulse 164 is masked by the west edge section W and the north west edge section NW of the mask 150* such that the beamlets of the masked beam pulses 164 produced by such edge sections of the mask 150* irradiate the unirradiated portions on the border region VB2 that are dispersed between the crystallized portions of the border region VB2 previously irradiated by the masked beam pulse for the second region's 1320 irradiation and then crystallization. Also, the portions of the masked beam pulse 164 intended for the third region 1330 patterned by the south edge section S, the south west edge section SW and the south east edge section SE of the mask 150* irradiate an area away from the edge of the semiconductor thin film 170, and do not irradiate any portion of the third region 1320.

This processing continues until all regions 1310, 1320, 1330, . . . , 1390 of the first conceptual column 206 are irradiated and crystallized in substantially the same manner as provided above, with the border regions between such first, second, third, etc. regions 1310, 1320, 1330, . . . , 1390 (having crystallized portions that have been irradiated by separate and distinct masked beam pulses 164) being dispersed between one another. The conceptual columns 206, 207, . . . can be irradiated, laterally-grown and crystallized in the same manner, except that when the sample is translated in the +X direction, the beamlets generated by the west edge section W of the mask 150* lead the irradiation of the regions of the second conceptual column 206 before the irradiation by all beamlets patterned by the other sections of the mask 150*.

Figure 14D:
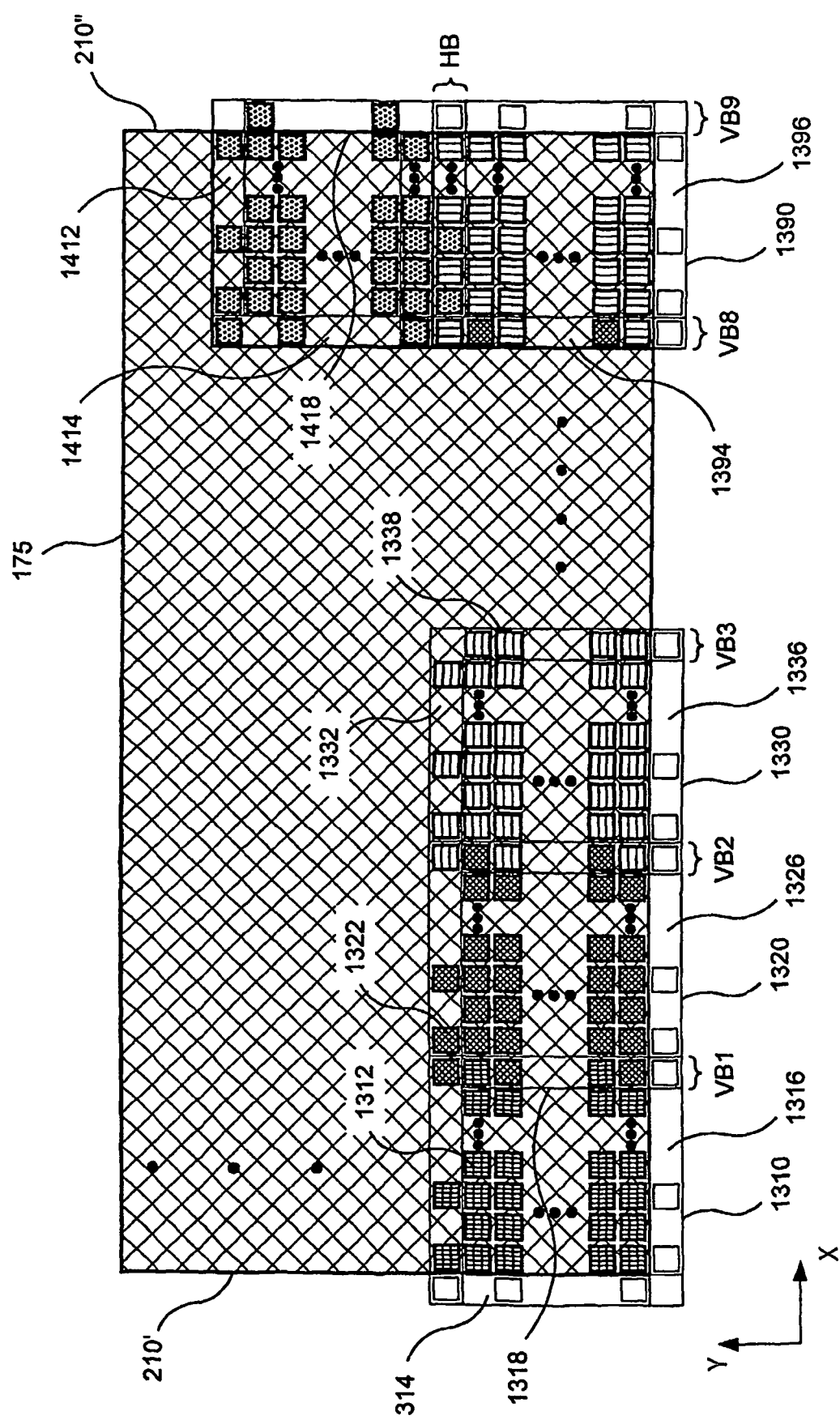

In particular, as shown in FIG. 14D, the first region 1410 of the second conceptual column 206 is irradiated to have the irradiated portions thereof substantially match the irradiated portions of the last region 1390 of the first conceptual column 205, but provided at an offset from such last region 1390 which approximately equals to slightly less than the distance between the first conceptual column 205 and the second conceptual column. In addition, the beamlets of the beam pulse 164 being patterned by the south edge section S and the south west edge section SW of the mask 150* irradiate the unirradiated portions on a north horizontal border region HB1 between the last region 1390 of the first conceptual column 205 that it has with the first region 1410 of the second conceptual column. The portions in this border region HB1 irradiated by the beamlets generated by the south edge section S and the south west section SW of the mask 150* are dispersed between the crystallized portions of the horizontal border region HB1 that were previously irradiated by the beamlets generated by the north edge section N and the north west edge section NW of the mask 150* which are crystallized. This processing of the regions in the second conceptual column 206 is continued until the portions of all regions in this column 206 are irradiated and crystallized. The processing of the third conceptual column 207 and other conceptual columns continues until the processing of the entire semiconductor thin film 164 (or a selected portion thereof) is completed.

As shown in FIGS. 4A-4D, the border regions between the irradiated regions include portions of the crystallized portions therein which have been irradiated by separate and distinct beam pulses that are likely to have differing fluences. These irradiated and then crystallized portions are dispersed throughout the edge regions so as to have portions irradiated by one beam pulse interdisposed between the portions irradiated by another beam pulse. Also, turning back to FIG. 14D, the portion in the north west corner of the last region 1390 of the first conceptual column 205 is irradiated four times. This is because the neighboring last and next to last regions 1380, 1390 of the first conceptual column 205 of the semiconductor thin film 164 each irradiate this area, and the first and second regions 1410, 1420 of the second conceptual column 206 irradiate this portion as well. This is due to the fact that this north west portion is provided on the vertical border VB8 and the horizontal border HB1.

Figure 15:
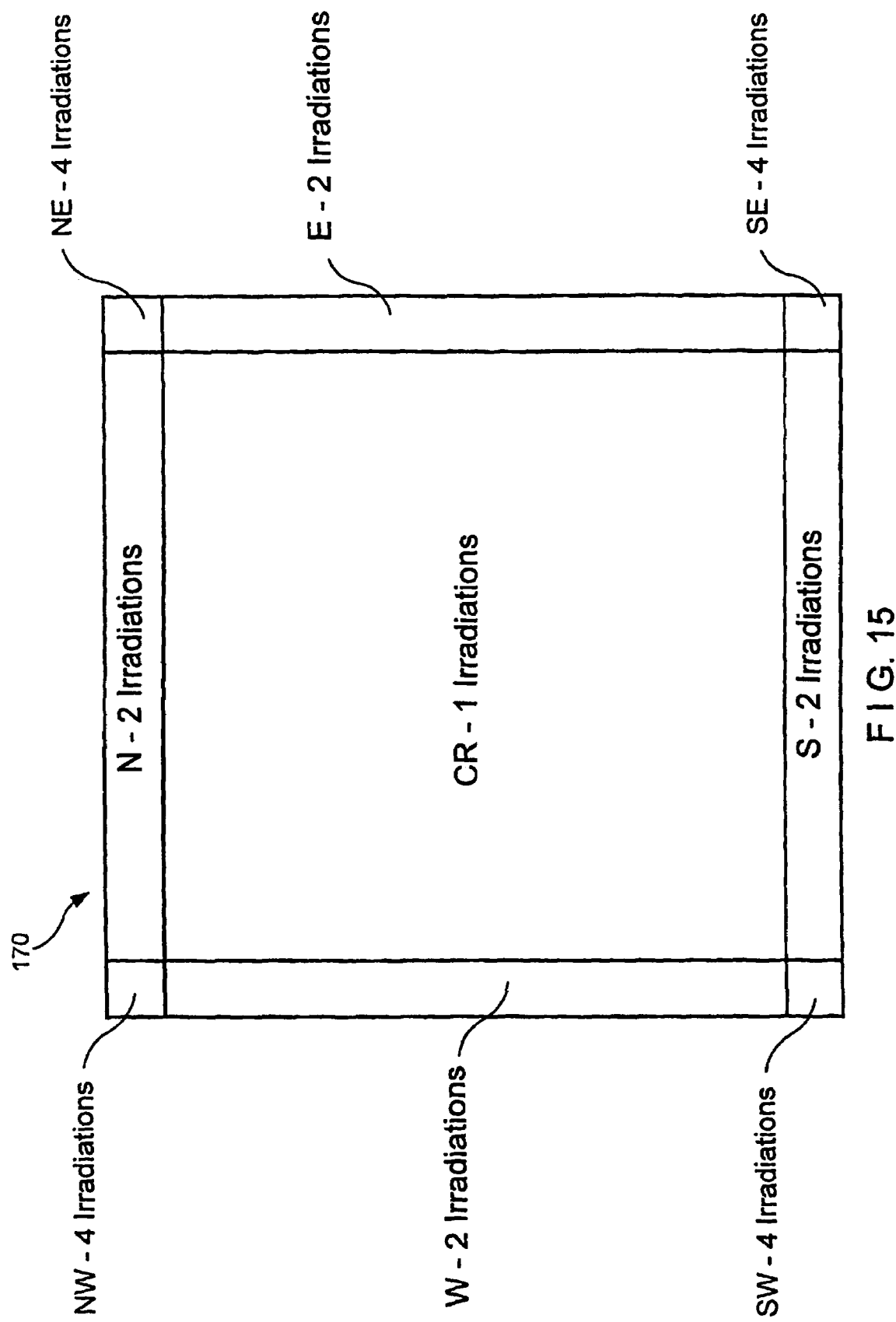

This fact is evident in FIG. 15 which illustrates that substantially all corner portions of the irradiated regions (i.e., irradiated by the respective corner sections of the mask 150*) are impinged by the respective beamlets at least four times during the processing of the semiconductor thin film 164. The edge areas irradiated by the beamlets patterned by the north, east, west and south edge sections N, E, W, S of the mask 150* are processed two times due such areas being either on the horizontal or vertical edge regions between the adjacent regions. The portions of the regions irradiated by the center region section of the mask 150* is irradiated once, since irradiation and crystallization of the center region does not need to be intermixed with the irradiation and crystallization of the neighboring regions. This is because what is achieved by the exemplary embodiment of the present invention is that the contrast between the border regions (and not the center regions) is reduced by interleaving the areas irradiated by the separate and distinct beam pulse having differing fluence levels in these border regions. This is done by placing the TFT devices in such specifically arranged and interleaved areas in the border regions (as well as in the center areas of the regions) so that sharp contrast that may be generated by such TFT devices is reduced. In particular, the intensity distribution on the border regions varies in a preferably smooth and continuous manner so that there is no abrupt variation encountered between the adjacent regions. It should be understood that the portion of the regions irradiated by the portions of the beam pulse 164 masked by the center region section CR of the mask 150* can be reduced or even eliminated so as to smooth the transitions between the border regions without taking consideration of any such center region between the border regions. For example, the following irradiations of the regions irradiated by the beam pulse 164 patterned by the corresponding sections of the mask 150* upon the removal of such center region:

| | |
|---|---|
| 4 Irradiations (NW) | 4 Irradiations (NE) |
| 4 Irradiations (SW) | 4 Irradiations (SE) | and

| | |
|---|---|
| 4 Irradiations (NW) | 4 Irradiations (NE) |
| 2 Irradiations (W) | 2 Irradiations (E) |
| 4 Irradiations (SW) | 4 Irradiations (SE) |

Figure 16:
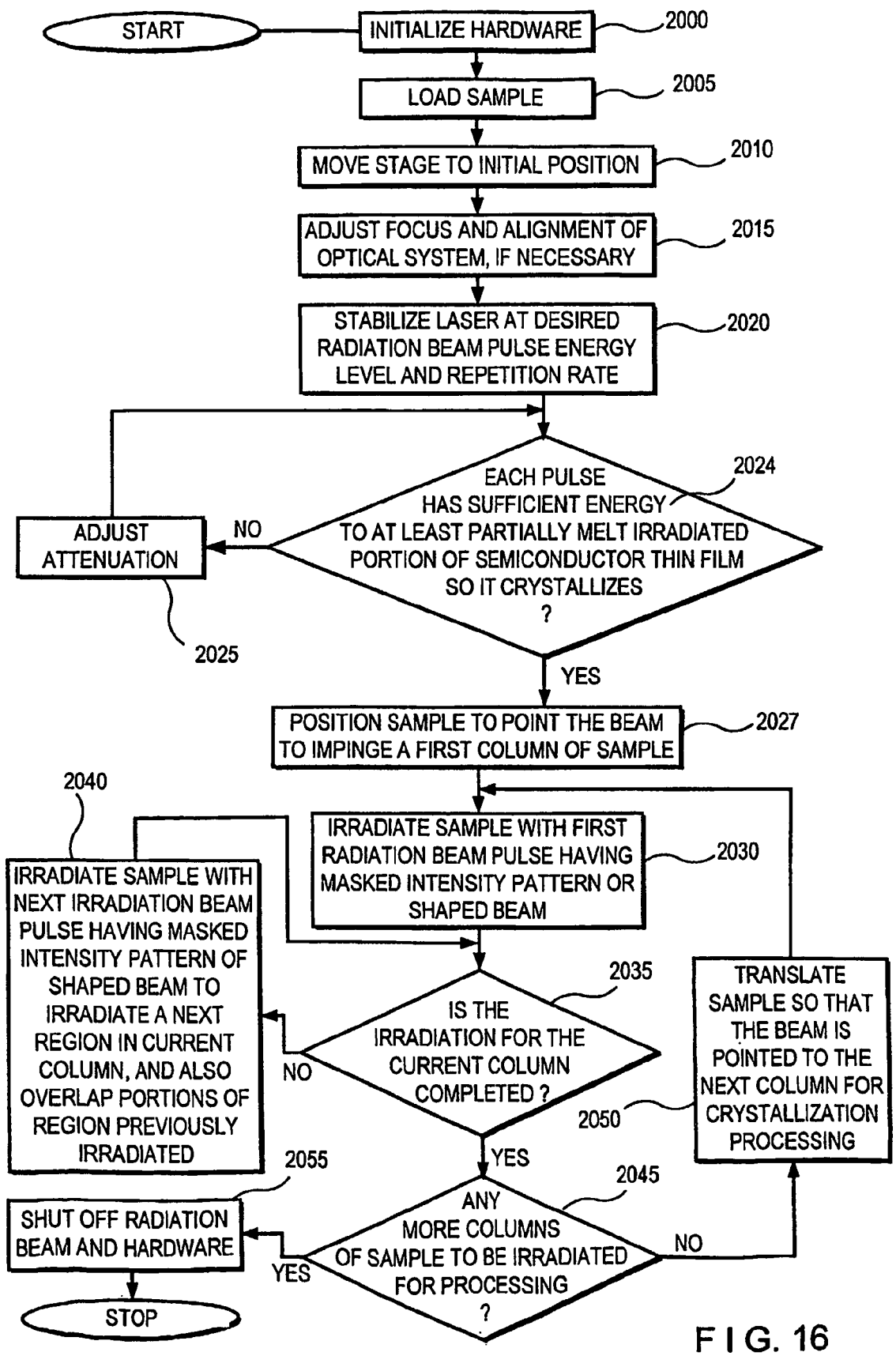
FIG. 16 is a flow diagram representing a first exemplary processing procedure of the present invention under at least partial control of a computing arrangement of FIG. 1A using the exemplary techniques of the present invention of FIGS. 4A-4H, 5A-5H, 8A-8H, 9A-9H, 11A-11H and 12A-12F.

FIG. 16 shows a flow diagram representing a first exemplary processing procedure of the present invention under at least a partial control of a computing arrangement of FIG. 1A which uses the techniques of the present invention of FIGS. 4A-4H, 5A-5H, 8A-8H, 11A-11F and 12A-12F. In step 2000, the hardware components of the system of FIG. 1A, such as the beam source 110, the energy beam modulator 120, and the beam attenuator and shutter 130 are first initialized at least in part by the computing arrangement 100. The sample 170 is loaded onto the sample translation stage 180 in step 2005. It should be noted that such loading may be performed either manually or automatically using known sample loading apparatus under the control of the computing arrangement 100. Next, the sample translation stage 180 is moved, preferably under the control of the computing arrangement 100, to an initial position in step 2010. Various other optical components of the system are adjusted and/or aligned either manually or under the control of the computing arrangement 100 for a proper focus and alignment in step 2015, if necessary. In step 2020, the irradiation/laser beam 111 is stabilized at a predetermined pulse energy level, pulse duration and repetition rate. In step 2024, it is preferably determined whether each beam pulse 164 has sufficient energy to fully melt the irradiated portions of the semiconductor thin film 175 without over-melting them. If that is not the case, the attenuation of the beam 111 is adjusted by the beams source 110 under the control of the computing arrangement 100 in step 2025, and step 2024 is executed again to determine if the there is sufficient energy to melt the portions of the semiconductor thin film.

In step 2027, the sample 170 is positioned to point the beam pulse 164 to impinge the first column of the semiconductor thin film. Then, in step 2030, the portions of the semiconductor thin film 175 are irradiated and at least partially melted using a masked intensity pattern (e.g., using the masks 150, 150', 150"). Thereafter, the irradiated portions of the semiconductor thin film 175 are allowed to solidify and crystallize. In step 2035, it is determined whether the irradiation for the current conceptual column by the beam pulse has been completed. If no, in step 2040, the next region of the same column of the sample 170 is irradiated with the beamlet pattern substantially corresponding to the beam pattern which was used to irradiate the previous region. In addition, the previously irradiated and crystallized region of the semiconductor thin film 175 is irradiated using the current beam pulse 164 which has a pattern such that the beamlets of the current masked beam pulse irradiate the unirradiated portions within the previously processed region (either adjacent or otherwise). The newly irradiated portions in the previously processed region are interposed between the crystallized areas.

Figure 17:
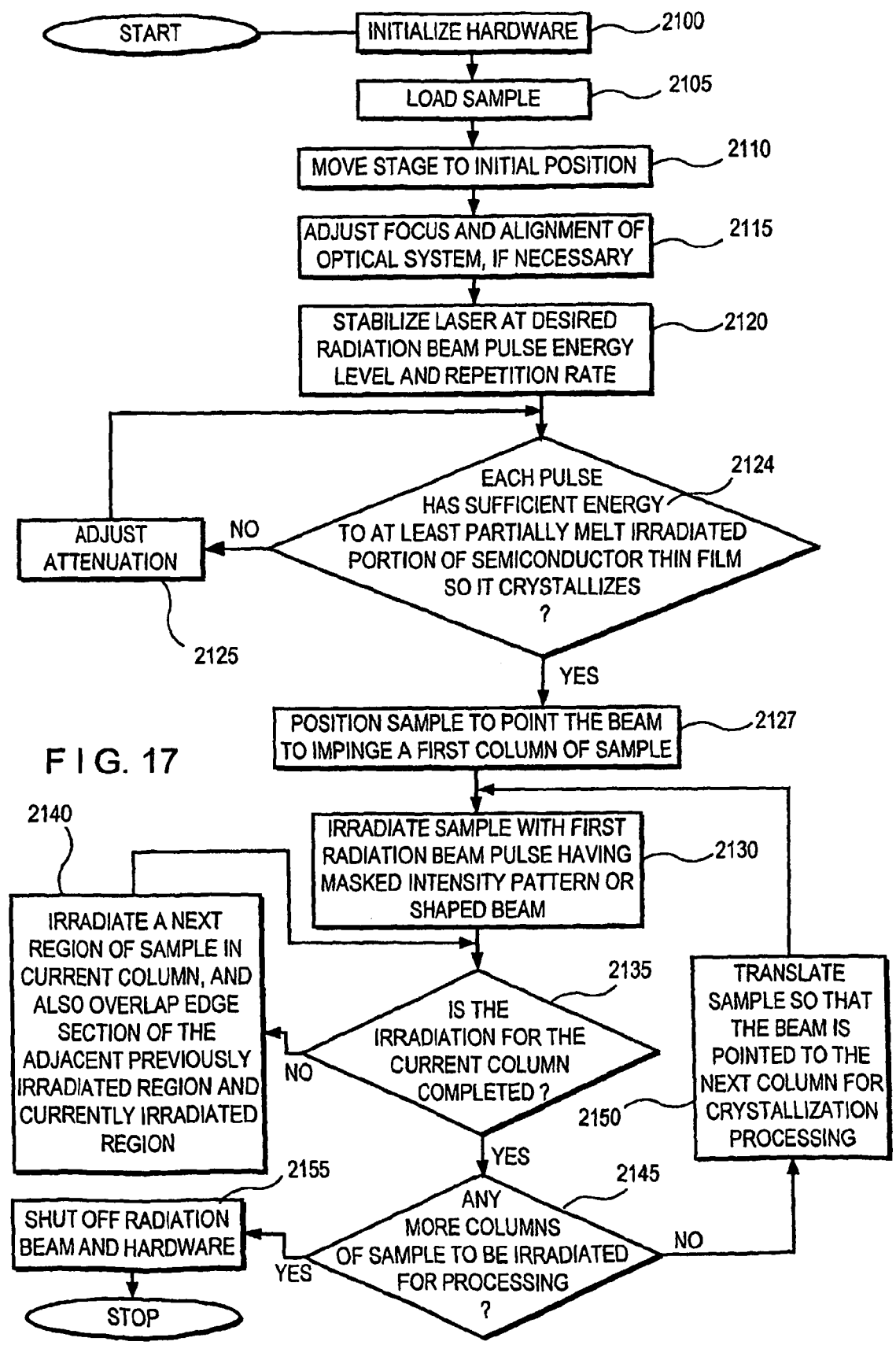
FIG. 17 is a flow diagram representing a second exemplary processing procedure of the present invention under at least partial control of a computing arrangement of FIG. 1A using the exemplary techniques of the present invention of FIGS. 14A-14D.

However, if in step 2035, it is determined that the irradiation and crystallization of the current conceptual column is completed, then it is determined in step 2045 whether there are any further conceptual columns of the sample 170 to be processed. If so, the process continues to step 2050 in which the sample 170 is translated to that the beam pulse 164 is pointed to the next conceptual column to be processed according to the present invention. Otherwise, in step 2055, the exemplary processing has been completed for the sample 170, and the hardware components and the beam 111 of the system shown in FIG. 1A can be shut off, and the process is terminated. In another variation of the embodiment of the process according to the present invention, the FIG. 17 shows a flow diagram representing a second exemplary processing procedure of the present invention under at least a partial control of a computing arrangement of FIG. 1A using the techniques of the present invention of FIGS. 14A-14D in which the sections of the border areas of the adjacent irradiated regions are dispersed throughout such border regions. Steps 2100-2135 of this exemplary procedure are substantially the same as the steps 2000-2035 of the procedure of FIG. 16, and thus shall not be described herein in further detail. In step 2140, the next region of the same column of the sample 170 is irradiated with the beamlet pattern that can substantially correspond to the beam pattern which was used to irradiate the previous region. In addition, the border region of the previously irradiated region is overlapped with the irradiations of the next pattern of beamlets of the subsequent beam pulse 164. This pattern is arranged such that the beamlets of the current masked beam pulse irradiate the unirradiated portions within the border area of the previously processed adjacent region. The newly irradiated portions in the previously processed region are interposed in the border regions of the previous and adjacent regions, between the previously crystallized areas of the previously irradiated region the crystallized areas. According to this exemplary embodiment of the present invention, all borders of the adjacent regions are overlapped by the subsequent or other irradiations of the masked beam pulse 164. The processing of this second exemplary embodiment in steps 2145-2155 continues in substantially the same manner as the processing of steps 2045-2055 described above with reference to FIG. 16.

Furthermore, the irradiation of the regions of the semiconductor thin film 175 can be performed (e.g., initiated by the processor) when the beam pulses 164 reach particular locations on the sample 170. These locations can be pre-assigned by the computing arrangement 100 and stored in the storage device thereof. Thus, the beam source 110 can be fired upon the sample 170 reaching these locations with respect to the beam pulses 164.

The foregoing merely illustrates the principles of the invention. Various modifications and alterations to the described embodiments will be apparent to those skilled in the art in view of the teachings herein. For example, while the above embodiment has been described with respect to at least partial lateral solidification and crystallization of the semiconductor thin film, it may apply to other materials processing techniques, such as micro-machining, photo-ablation, and micro-patterning techniques, including those described in International patent application no. PCT/US01/12799 and U.S. patent application Ser. Nos. 09/390,535, 09/390,537 and 09/526,585, the entire disclosures of which are incorporated herein by reference. The various mask patterns and intensity beam patterns described in the abovereferenced patent application can also be utilized with the process and system of the present invention. It will thus be appreciated that those skilled in the art will be able to devise numerous systems and methods which, although not explicitly shown or described herein, embody the principles of the invention and are thus within the spirit and scope of the present invention.

What is claimed is:

1. A method for processing at least one section of a thin film sample on a substrate, comprising the steps of:
   (a) controlling an irradiation beam generator to emit successive irradiation beam pulses at a predetermined repetition rate;
   (b) masking each of the irradiation beam pulses to define a first plurality of beamlets and a second plurality of beamlets, the first and second plurality of beamlets of each of the irradiation pulses being provided for impinging the film sample and having an intensity which is sufficient to at least partially melt irradiated portions of the at least one section of the film sample;
   (c) irradiating a particular portion of the at least one section of the film sample with the first beamlets of a first pulse of the irradiated beam pulses to melt first areas of the particular portion, the first areas being at least partially melted, leaving first unirradiated regions between respective adjacent ones of the first areas and being allowed to resolidify and crystallize; and
   (d) after step (c), irradiating the particular portion with the second beamlets of a second pulse of the irradiated beam pulses to melt second areas of the particular portion, the second areas being at least partially melted, leaving second unirradiated regions between respective adjacent ones of the second areas and being allowed to resolidify and crystallize,
   wherein the first irradiated and re-solidified areas and the second irradiated and resolidified areas are intermingled with one another within the at least one section of the film sample, and
   wherein the first areas correspond to first pixels, and the second areas correspond to second pixels.

2. The method according to claim 1, wherein respective positions of the first pixels are different than respective positions of the second pixels.

3. The method according to claim 1, wherein a location of at least one of the second areas is substantially the same as a location of at least one of the first unirradiated areas.

4. The method according to claim 1, wherein edges of the second irradiated and re-solidified areas are provided at a distance from the first re-solidified areas.

5. The method according to claim 1, wherein the first beamlets have a first energy density, wherein the second beamlets have a second energy density, and wherein the first energy density is different from the second energy density.

6. The method according to claim 1, wherein the masked irradiation beam pulses further include a third plurality of beamlets which are provided for impinging the film sample and which have an intensity that is sufficient to at least partially melt irradiated portions of the at least one section of the film sample, and further comprising the step of:
   (e) after step (d), irradiating the particular portion with the third beamlets to melt third areas of the particular portion, the third areas being at least partially melted to leave third unirradiated regions between respective adjacent ones of the third areas and being allowed to resolidify and crystallize.

7. The method according to claim 1, where the second beam pulse immediately follows the first beam pulse, wherein the first areas are irradiated with the first beamlets when the film sample is provided at a first position of with respect to the irradiation beam pulses, wherein the second areas are irradiated with the second beamlets when the film sample is provided at a second position with respect to the irradiation beam pulses, the second position being closer to a center of the at least one section of the film sample than the second position.

8. The method according to claim 1, wherein, in step (c), the first areas are fully melted, and wherein in step (d), the second areas are fully melted throughout their entire thickness.

9. The method according to claim 1, further comprising the steps of:
   (g) translating the film sample so that the a further portion of the film sample is provided for irradiation by the first and second beamlets, the further portion being substantially adjacent to the particular portion of the film sample; and
   (h) repeating steps (c) and (d) on for the further portion of the film sample,
   wherein a first edge of the further portion of the film sample overlaps a second edge of the particular portion of the film sample, and
   wherein the re-solidified areas in the first edge of the further portion are intermingled with the re-solidified areas of the particular portion so as to prevent an overlap thereof.

10. The method according to claim 1, wherein at least one of the first and second areas are configured to situate therein at least one thin-film transistor.

11. The method according to claim 3, wherein the first unirradiated areas have substantially the same location as the second areas, and wherein the second unirradiated areas have substantially the same location as the first areas.

12. The method according to claim 3, wherein the locations of the first and second areas are non-uniform.

13. The method according to claim 6, wherein the third areas correspond to the third pixels, and wherein respective positions of the first and second pixels are different than respective positions of the third pixels.

14. The method according to claim 6, wherein a location of at least one of the first and second areas is substantially the same as a location of at least one of the third unirradiated areas.

15. The method according to claim 6, wherein edges of the first and second re-solidified areas are provided at a distance from the third re-solidified areas.

16. The method according to claim 6, wherein the first beamlets have a first energy density, wherein the second beamlets have a second energy density, wherein the third beamlets have a third energy density, and wherein the third energy density is different from at least one of the first energy density and the second energy density.

17. The method according to claim 7, further comprising the step of:
   (f) after step (c) and before step (d), translating the film sample relative to the irradiation beam pulses so that the impingement by the first beamlet of the film sample moves from the first position to the second position.

18. The method according to claim 4, wherein the first and second resolidified areas form an entire cross-section of the at least one section of the film sample.

19. The method according to claim 14, wherein the location of the first and second areas are different that the location of the third areas.

20. The method according to claim 19, wherein at least one of the first and second unirradiated areas have substantially the same locations as the third areas, and wherein the third unirradiated areas have substantially the same locations as at least one of the first and second areas.

21. The method according to claim 20, wherein the first, second and third resolidified areas form an entire cross-section of the at least one section of the film sample.

22. A method for processing at least one section of a thin film sample on a substrate, comprising the steps of:
   (a) controlling an irradiation beam generator to emit successive irradiation beam pulses at a predetermined repetition rate;
   (b) masking each of the irradiation beam pulses to define a plurality of beamlets, the plurality of beamlets of each of the irradiation pulses being provided for impinging the film sample and having an intensity which is sufficient to at least partially melt irradiated portions of the at least one section of the film sample;
   (c) at a first location of the film sample with respect to the irradiation beam pulses, irradiating a first portion of the at least one section of the film sample with the beamlets of a first pulse of the irradiated beam pulses to at least partially melt first areas of the at least one section, the first areas leaving first unirradiated regions between respective adjacent ones of the first areas on at least one first edge thereof, and being allowed to resolidify and crystallize; and
   (d) after step (c), translating the film sample from the first location to a second location with respect to the irradiation beam pulses;
   (e) after step (d) and at the second location, irradiating a second portion of the at least one section of the film sample with the beamlets of a second pulse of the irradiated beam pulses to at least partially melt second areas of the at least one section, the second areas leaving second unirradiated regions between respective adjacent ones of the second areas on at least one second edge thereof, and being allowed to resolidify and crystallize,
   wherein the at least one first edge of the first portion of the at least one section of the film sample is overlapped by the at least one second edge of the second portion of the at least one section of the film sample, and wherein the first re-solidified areas and the second re-solidified areas are intermingled with one another within the at least one first edge and the at least one second edge.

23. The method according to claim 22, wherein the overlapping of the first and second resolidied areas collectively smooth a spatial distribution of a border between the first portion and the second portion of the at least one section of the film sample.

24. The method according to claim 23, wherein due to the border between the first and second portions being smoothed, a visible contrast between the first portion and the second portion of the at least one section of the film sample.

25. The method according to claim 22,
   wherein, in step (e), the second areas further leave further unirradiated regions in the second portion between respective adjacent ones of the second areas on at least one further edge thereof, and being allowed to resolidify and crystallize, and
   wherein the at least one further edge is provided adjacent to the at least one second edge.

26. The method according to claim 22, wherein, in step (c), the first areas include additional unirradiated regions between respective adjacent ones of the first areas which are away from the at least one edge, and further comprising the steps of
   (h) after step (c) and before step (d), irradiating the first portion of the at least one section of the film sample with further beamlets of the first pulse of the irradiated beam pulses to melt further areas of the first portion, the further areas being at least partially melted, leaving further unirradiated regions between respective adjacent ones of the further areas and being allowed to resolidify and crystallize,
   wherein the first re-solidified areas and the further re-solidified areas are intermingled with one another within the first portion of the film sample.

27. The method according to claim 22, wherein the at least one first edge and the at least one second edge are overlapped to form an edge area the entire surface of which is crystallized.

28. The method according to claim 24, the combined densities of the at least one first edge and the at least one second edge provide an adequate pixel density at the border between the first and second portions of the at least one section of the film sample.

29. The method according to claim 25, wherein the at least one section is a first row of the thin film sample, wherein the first row is irradiated by the beamlets of the first and second beam pulses when the film sample is translated in a first direction with respect to the first and second beam pulses, and further comprising the steps of:
   (f) positioning the film sample for irradiating a further section of the film sample, the further section being a second row of the film sample; and
   (g) at a third location of the film sample with respect to the irradiation beam pulses, irradiating a first portion of the further section of the film sample with the beamlets of a third pulse of the irradiated beam pulses to at least partially melt third areas of the further section, the third areas of the further section leaving third unirradiated regions between respective adjacent ones of the third areas on at least one third edge thereof, and being allowed to resolidify and crystallize,
   wherein the at least one further edge of the second portion of the at least one section of the film sample is overlapped by the at least one third edge of the second portion of the further section of the film sample, and wherein the further re-solidified areas and the third re-solidified areas are intermingled with one another within the at least one further edge and the at least one third edge.

30. The method according to claim 26, wherein a location of at least one of the further areas is substantially the same as a location of at least one of the additional unirradiated areas.

31. The method according to claim 30, wherein the additional unirradiated areas have substantially the same location as the further areas, and wherein the further unirradiated areas have substantially the same location as the first areas.

32. The method according to claim 31, wherein the first and further resolidified areas form an entire cross-section of the first portion of the at least one section of the film sample.

33. A system for processing at least one section of a thin film sample on a substrate, comprising:
   a processing arrangement, which when executing a computer program, is configured to perform the following steps:

(a) controlling an irradiation beam generator to emit successive irradiation beam pulses at a predetermined repetition rate;

(b) masking each of the irradiation beam pulses to define a first plurality of beamlets and a second plurality of beamlets, the first and second plurality of beamlets of each of the irradiation pulses being provided for impinging the film sample and having an intensity which is sufficient to at least partially melt irradiated portions of the at least one section of the film sample;

(c) irradiating a particular portion of the at least one section of the film sample with the first beamlets of a first pulse of the irradiated beam pulses to melt first areas of the particular portion, the first areas being at least partially melted, leaving first unirradiated regions between respective adjacent ones of the first areas and being allowed to resolidify and crystallize; and (d) after step (c), irradiating the particular portion with the second beamlets of a second pulse of the irradiated beam pulses to melt second areas of the particular portion, the second areas being at least partially melted, leaving second unirradiated regions between respective adjacent ones of the second areas and being allowed to resolidify and crystallize, wherein the first re-solidified areas and the second re-solidified areas are intermingled with one another within the at least one section of the film sample, and wherein the first areas correspond to first pixels, and the second areas correspond to second pixels.

34. The system according to claim 33, wherein respective positions of the first pixels are different than respective positions of the second pixels.

35. The system according to claim 33, wherein a location of at least one of the second areas is substantially the same as a location of at least one of the first unirradiated areas.

36. The system according to claim 33, wherein edges of the second re-solidified areas are provided at a distance from the first re-solidified areas.

37. The system according to claim 33, wherein the first beamlets have a first energy density, wherein the second beamlets have a second energy density, and wherein the first energy density is different from the second energy density.

38. The system according to claim 33, wherein the masked irradiation beam pulses further include a third plurality of beamlets which are provided for impinging the film sample and which have an intensity that is sufficient to at least partially melt irradiated portions of the at least one section of the film sample, and wherein the processing arrangement, when executing the computer program, is further configured to perform the step of:

(e) after step (d), irradiating the particular portion with the third beamlets to melt third areas of the particular portion, the third areas being at least partially melted leaving third unirradiated regions between respective adjacent ones of the third areas and being allowed to resolidify and crystallize.

39. The system according to claim 38, wherein edges of the first and second re-solidified areas are provided at a distance from the third re-solidified areas.

40. The system according to claim 38, wherein the first beamlets have a first energy density, wherein the second beamlets have a second energy density, wherein the third beamlets have a third energy density, and wherein the third energy density is different from at least one of the first energy density and the second energy density.

41. The system according to claim 33, where the second beam pulse immediately follows the first beam pulse, wherein the first areas are irradiated with the first beamlets when the film sample is provided at a first position of with respect to the irradiation beam pulses, wherein the second areas are irradiated with the second beamlets when the film sample is provided at a second position with respect to the irradiation beam pulses, the second position being closer to a center of the at least one section of the film sample than the second position.

42. The system according to claim 33, wherein, in step (c), the first areas are fully melted throughout their entire thickness, and wherein in step (d), the second areas are fully melted throughout their entire thickness.

43. The system according to claim 33, wherein the processing arrangement, when executing the computer program, is further configured to perform the steps of:

(g) translating the film sample so that the a further portion of the film sample is provided for irradiation by the first and second beamlets, the further portion being substantially adjacent to the particular portion of the film sample; and (h) repeating steps (c) and (d) on for the further portion of the film sample, wherein a first edge of the further portion of the film sample overlaps a second edge of the particular portion of the film sample, and wherein the re-solidified areas in the first edge of the further portion are intermingled with the re-solidified areas of the particular portion so as to prevent an overlap thereof.

44. The system according to claim 35, wherein the first unirradiated areas have substantially the same location as the second areas, and wherein the second unirradiated areas have substantially the same location as the first areas.

45. The system according to claim 35, wherein the first and second resolidified areas form an entire cross-section of the at least one section of the film sample.

46. The system according to claim 35, wherein the locations of the first and second areas are non-uniform.

47. The system according to claim 38, wherein the third areas correspond to the third pixels, and wherein respective positions of the first and second pixels are different than respective positions of the third pixels.

48. The system according to claim 38, wherein a location of at least one of the first and second areas is substantially the same as a location of at least one of the third unirradiated areas.

49. The system according to claim 41, wherein the processing arrangement, when executing the computer program, is further configured to perform the step of:

(f) after step (c) and before step (d), translating the film sample relative to the irradiation beam pulses so that the impingement by the first beamlet of the film sample moves from the first position to the second position.

50. The system according to claim 48, wherein the location of the first and second areas are different that the location of the third areas.

51. The system according to claim 50, wherein at least one of the first and second unirradiated areas have substantially the same locations as the third areas, and wherein the third unirradiated areas have substantially the same locations as at least one of the first and second areas.

52. The system according to claim 51, wherein the first, second and third resolidified areas form an entire cross-section of the at least one section of the film sample.

53. A system for processing at least one section of a thin film sample on a substrate, comprising:
- a processing arrangement, which when executing a computer program, is configured to perform the following steps:
  - (a) controlling an irradiation beam generator to emit successive irradiation beam pulses at a predetermined repetition rate;
  - (b) masking each of the irradiation beam pulses to define a plurality of beamlets, the plurality of beamlets of each of the irradiation pulses being provided for impinging the film sample and having an intensity which is sufficient to at least partially melt irradiated portions of the at least one section of the film sample;
  - (c) at a first location of the film sample with respect to the irradiation beam pulses, irradiating a first portion of the at least one section of the film sample with the beamlets of a first pulse of the irradiated beam pulses to at least partially melt first areas of the at least one section, the first areas leaving first unirradiated regions between respective adjacent ones of the first areas on at least one first edge thereof, and being allowed to resolidify and crystallize;
  - (d) after step (c), translating the film sample from the first location to a second location with respect to the irradiation beam pulses; and
  - (e) after step (d) and at the second location, irradiating a second portion of the at least one section of the film sample with the beamlets of a second pulse of the irradiated beam pulses to at least partially melt second areas of the at least one section, the second areas leaving second unirradiated regions between respective adjacent ones of the second areas on at least one second edge thereof, and being allowed to resolidify and crystallize,
  - wherein the at least one first edge of the first portion of the at least one section of the film sample is overlapped by the at least one second edge of the second portion of the at least one section of the film sample, and wherein the first re-solidified areas and the second re-solidified areas are intermingled with one another within the at least one first edge and the at least one second edge.

54. The system according to claim 53, wherein the overlapping of the first and second resolidied areas collectively smooth a spatial distribution of a border between the first portion and the second portion of the at least one section of the film sample.

55. The system according to claim 54, wherein due to the border between the first and second portions being smoothed, a visible contrast between the first portion and the second portion of the at least one section of the film sample.

56. The system according to claim 55, wherein the combined densities of the at least one first edge and the at least one second edge provide an adequate pixel density at the border between the first and second portions of the at least one section of the film sample.

57. The system according to claim 53, wherein, in step (e), the second areas further leave further unirradiated regions in the second portion between respective adjacent ones of the second areas on at least one further edge thereof, and being allowed to resolidify and crystallize, and
wherein the at least one further edge is provided adjacent to the at least one second edge.

58. The system according to claim 53, wherein, in step (c), the first areas include additional unirradiated regions between respective adjacent ones of the first areas which are away from the at least one edge, wherein the processing arrangement, when executing the computer program, is further configured to perform the step of:
- (h) after step (c) and before step (d), irradiating the first portion of the at least one section of the film sample with further beamlets of the first pulse of the irradiated beam pulses to melt further areas of the first portion, the further areas being at least partially melted, leaving further unirradiated regions between respective adjacent ones of the further areas and being allowed to resolidify and crystallize, and
wherein the first resolidified areas and the further resolidified areas are intermingled with one another within the first portion of the film sample.

59. The system according to claim 53, wherein the at least one first edge and the at least one second edge are overlapped to form an edge area the entire surface of which is crystallized.

60. The system according to claim 57, wherein the at least one section is a first row of the thin film sample, wherein the first row is irradiated by the beamlets of the first and second beam pulses when the film sample is translated in a first direction with respect to the first and second beam pulses, wherein the processing arrangement, when executing the computer program, is further configured to perform the steps of:
- (f) positioning the film sample for irradiating a further section of the film sample, the further section being a second row of the film sample; and
- (g) at a third location of the film sample with respect to the irradiation beam pulses, irradiating a first portion of the further section of the film sample with the beamlets of a third pulse of the irradiated beam pulses to at least partially melt third areas of the further section, the third areas of the further section leaving third unirradiated regions between respective adjacent ones of the third areas on at least one third edge thereof, and being allowed to resolidify and crystallize,
wherein the at least one further edge of the second portion of the at least one section of the film sample is overlapped by the at least one third edge of the second portion of the further section of the film sample, and wherein the further re-solidified areas and the third re-solidified areas are intermingled with one another within the at least one further edge and the at least one third edge.

61. The system according to claim 58, wherein a location of at least one of the further areas is substantially the same as a location of at least one of the additional unirradiated areas.

62. The system according to claim 61, wherein the additional unirradiated areas have substantially the same location as the further areas, and wherein the further unirradiated areas have substantially the same location as the first areas.

63. The system according to claim 62, wherein the first and further resolidified areas form an entire cross-section of the first portion of the at least one section of the film sample.

64. A method for processing at least one section of a thin film sample on a substrate, comprising the steps of:
- (a) controlling an irradiation beam generator to emit successive irradiation beam pulses at a predetermined repetition rate;
- (b) masking each of the irradiation beam pulses to define a first plurality of beamlets and a second plurality of beamlets, the first and second plurality of beamlets of each of the irradiation pulses being provided for impinging the film sample and having an intensity which is sufficient to at least partially melt irradiated portions of the at least one section of the film sample;

(c) irradiating a particular portion of the at least one section of the film sample with the first beamlets of a first pulse of the irradiated beam pulses to melt and crystallize first areas of the particular portion; and (d) after step (c), irradiating the particular portion with the second beamlets of a second pulse of the irradiated beam pulses to melt and crystallize second areas of the particular portion, wherein the first irradiated areas and the second irradiated areas are intermingled with one another within the at least one section of the film sample, wherein a pulse irradiation history of the first irradiated areas is different than a pulse history of the second irradiated areas, and wherein the first areas correspond to first pixels, and the second areas correspond to second pixels.

65. A method for processing at least one section of a thin film sample on a substrate, comprising the steps of:

(a) controlling an irradiation beam generator to emit successive irradiation beam pulses at a predetermined repetition rate;

(b) masking each of the irradiation beam pulses to define a plurality of beamlets, the plurality of beamlets of each of the irradiation pulses being provided for impinging the film sample and having an intensity which is sufficient to at least partially melt irradiated portions of the at least one section of the film sample;

(c) at a first location of the film sample with respect to the irradiation beam pulses, irradiating a first portion of the at least one section of the film sample with the beamlets of a first pulse of the irradiated beam pulses to at least partially melt and crystallize first areas of the at least one section; and (d) after step (c), translating the film sample from the first location to a second location with respect to the irradiation beam pulses;

(e) after step (d) and at the second location, irradiating a second portion of the at least one section of the film sample with the beamlets of a second pulse of the irradiated beam pulses to at least partially melt and crystallize second areas of the at least one section, wherein the at least one first edge of the first portion of the at least one section of the film sample is overlapped by the at least one second edge of the second portion of the at least one section of the film sample, wherein a pulse irradiation history of the first irradiated areas is different than a pulse history of the second irradiated areas, and wherein the first irradiated areas and the second irradiated areas are intermingled with one another within the at least one first edge and the at least one second edge.

* * * * *